(12) United States Patent
Kumar et al.

(10) Patent No.: US 6,541,164 B1
(45) Date of Patent: Apr. 1, 2003

(54) METHOD FOR ETCHING AN ANTI-REFLECTIVE COATING

(75) Inventors: Ajay Kumar, Sunnyvale, CA (US); Jeffrey Chinn, Foster City, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/022,587

(22) Filed: Feb. 12, 1998

Related U.S. Application Data

(63) Continuation-in-part of application No. 08/955,771, filed on Oct. 22, 1997, now Pat. No. 6,103,632.

(51) Int. Cl.$^7$ .......................... H01L 21/302; G03F 9/00
(52) U.S. Cl. .......................... 430/5; 438/636; 438/582; 438/952; 438/717; 438/723; 438/724; 438/736; 438/738
(58) Field of Search ................................ 438/636, 582, 438/952, 717, 723, 724, 736, 738; 430/5

(56) References Cited

U.S. PATENT DOCUMENTS

| | | | |
|---|---|---|---|
| 4,490,209 A | | 12/1984 | Hartman ................. 156/643 |
| 5,094,712 A | * | 3/1992 | Becker et al. ............ 156/643 |
| 5,320,975 A | * | 6/1994 | Cederbaum et al. ......... 437/44 |
| 5,437,765 A | * | 8/1995 | Loewenstein ............. 216/51 |
| 5,441,914 A | * | 8/1995 | Taft et al. ................. 437/189 |

(List continued on next page.)

FOREIGN PATENT DOCUMENTS

| | | | |
|---|---|---|---|
| JP | 05-299390 | * | 11/1993 |

OTHER PUBLICATIONS

"Integrated Deposition, and Etching Approach to High Performance Dielectric Anti–Reflective Coatings For Deep Ultraviolet Applications on WS$_{ix}$ and Polysilicon",;Deshpande et al.; Jun. 1997'; Semiconductor Fabtech.*

Feng et al.: "An Integrated Deposition and Etching Approach to High Performance Dielectric Anti–Reflective Coatings For Deep Ultraviolet Applications on WSi$_x$ and Polysilicon," *Semiconductor Fabtech* pp 263–269 (Jun. 1997).

Gocho, et al.: "Chemical Vapor Deposition of Anti–Reflective Layer Film for Excimer Laser Lithography," *Jpn. J. Appl. Phys.* vol. 33, pp 486–490 (Jan. 1994).

B. El–Kareh, et al.: "The evolution of DRAM cell technology," *Solid State Technology* pp 89–101 (May 1997).

(List continued on next page.)

*Primary Examiner*—George Goudreau
(74) *Attorney, Agent, or Firm*—Townsend Townsend & Crew; Joseph Bach

(57) ABSTRACT

A method for etching and removing an anti-reflective coating from a substrate. The method comprises providing a substrate supporting a conductive layer (a tungsten-silicide layer) having an anti-reflective coating (e.g., a dielectric anti-reflective coating) disposed thereon. The anti-reflective coating is etched with an etchant gas consisting of NF$_3$ and Cl$_2$ to break through and to remove at least a portion of the anti-reflective coating to expose at least part of the conductive layer. The conductive layer is subsequently etched with the etchant gas to produce an anti-reflective coating gate structure which is used in semiconductor integrated circuits containing transistors.

72 Claims, 35 Drawing Sheets

U.S. PATENT DOCUMENTS

| | | | |
|---|---|---|---|
| 5,600,165 A | | 2/1997 | Tsukamoto et al. |
| 5,605,601 A | * | 2/1997 | Kawasaki et al. ........ 156/643.1 |
| 5,706,164 A | * | 1/1998 | Jeng ......................... 361/321.4 |
| 5,830,807 A | * | 11/1998 | Matsunaga et al. .......... 438/714 |
| 5,952,244 A | | 9/1999 | Abraham et al. |
| 6,994,226 | | 11/1999 | Kadomura |
| 6,013,582 A | * | 1/2000 | Ionov et al. ................. 438/738 |
| 6,103,632 A | | 8/2000 | Kumar et al. ................ 438/717 |

OTHER PUBLICATIONS

Ogawa, et al.: "Practical resolution enhancement effect by new complete anti–reflective layer in KrF excimer laser lithography," *SPIE* vol. 1927 *Optical/Laser Microlithography VI* pp. 263–274 (1993).

Ogawa, et al.: "SiOxNy:H, high performance anti–reflective layer for the current and future optical lithography," *SPIE* vol. 2197 pp 722–732 (Jan. 1994).

Stanley Wolf, et al., "Silicon Processing for the VLSI Era," vol. 1 *Lattice Press* pp 438–441 (Jun. 1987).

Sato et al., "Effect of Temperature and Chlorine Mixing on Submicron Silicon Dioxide Contact Hole Etching", Proc.–Electrochem. Soc., 1990. Abstract only.

* cited by examiner

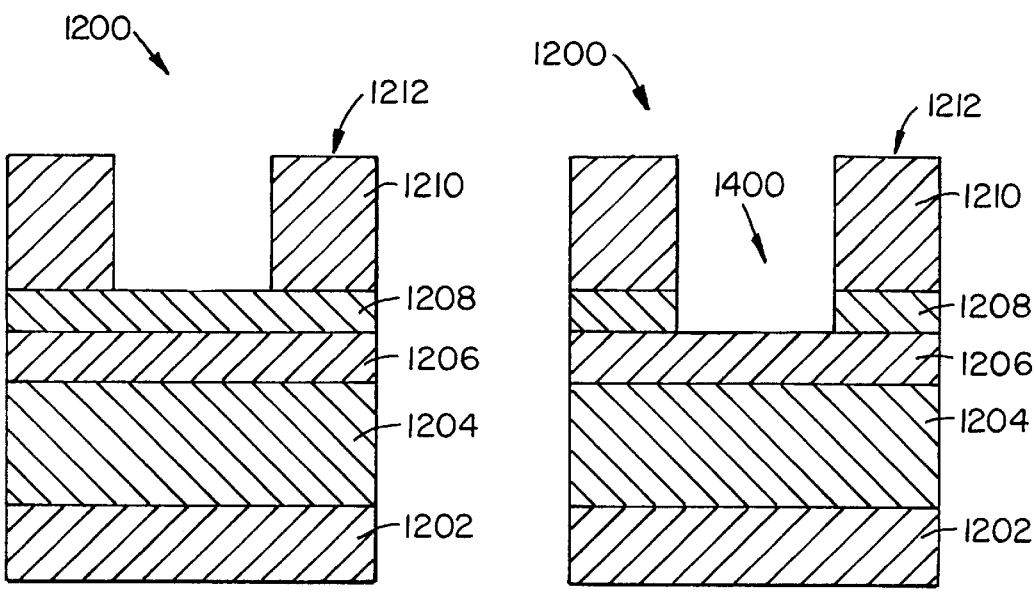
FIG. 37.
FIG. 38.
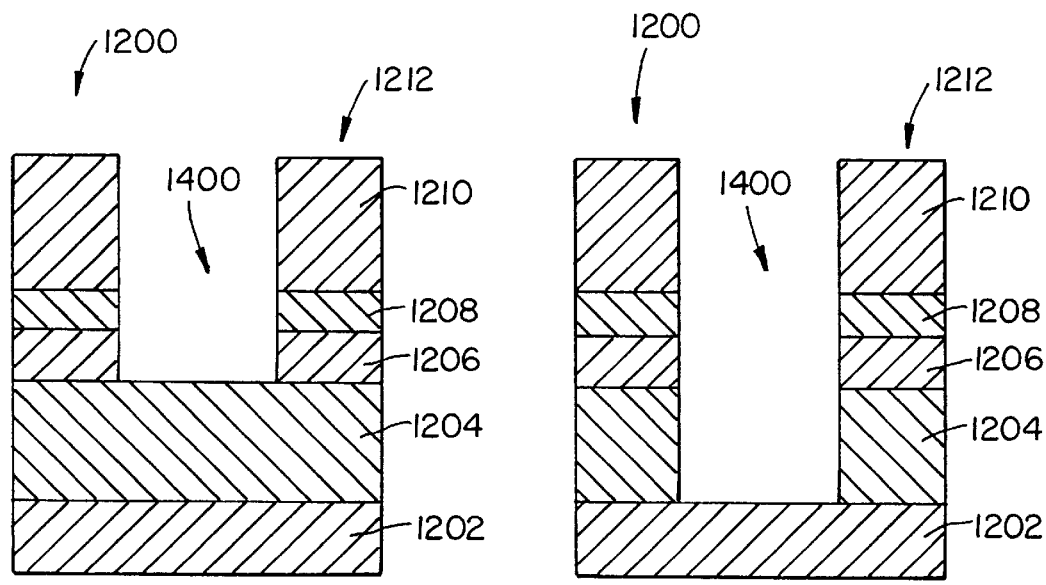
FIG. 39.
FIG. 40.

METHOD FOR ETCHING AN ANTI-REFLECTIVE COATING

This is a continuation-in-part patent application of patent application entitled "In Situ Etching of Inorganic Dielectric Anti-Reflective Coating from a Substrate," Ser. No. 08/955,771, filed Oct. 22, 1997, now U.S. Pat. No. 6,103,632.

BACKGROUND OF THE INVENTION

1. Field of the Invention

This invention relates to an improved anti-reflective coating and a method for etching and removing an anti-reflective coating from a substrate. More specifically, this invention provides a plasma enhanced chemical vapor deposition dielectric anti-reflective coating and a method for etching and removing both a dielectric anti-reflective coating and a tungsten-silicide layer which supports the dielectric anti-reflective coating. The removal of the dielectric anti-reflective coating and the tungsten-silicide layer by etching is conducted for producing semiconductor integrated circuits containing transistors.

2. Description of the Prior Art

Since semiconductor devices were first introduced several decades ago, device geometries have decreased dramatically in size. During that time, integrated circuits have generally followed the two-year/half-size rule (often called "Moore's Law"), meaning that the number of devices which will fit on a chip doubles every two years. Today's semiconductor fabrication plants routinely produce devices with feature sizes of 0.5 microns or even 0.35 microns, and tomorrow's plants will be producing devices with even smaller feature sizes.

A common step in the fabrication of such devices is the formation of a patterned thin film on a substrate. These films are often formed by etching away portions of a deposited blanket layer. Modern substrate processing systems employ photolithographic techniques to pattern layers. Typically, conventional photolithographic techniques first deposit photoresist or other light-sensitive material over the layer being processed. A photomask (also known simply as a mask) having transparent and opaque regions which embody the desired pattern is then positioned over the photoresist. When the mask is exposed to light, the transparent portions allow for the exposure of the photoresist in those regions, but not in the regions where the mask is opaque. The light causes a chemical reaction in exposed portions of the photoresist. A suitable chemical, chemical vapor or ion bombardment process is then used to selectively attack either the reacted or unreacted portions of the photoresist. With the remaining photoresist pattern acting as a mask, the underlying layer may then undergo further processing. For example, the layer may be doped or etched, or other processing may be carried out.

When patterning such thin films, it is desirable that fluctuations in line width and other critical dimensions be minimized. Errors in these dimensions can result in variations in device characteristics or open-/short-circuited devices, thereby adversely affecting device yield. Thus, as feature sizes decrease, structures must be fabricated with greater accuracy. As a result, some manufacturers now require that variations in the dimensional accuracy of patterning operations be held to within 5 percent of the dimensions specified by the designer.

Modern photolithographic techniques often involve the use of equipment known as steppers, which are used to mask and expose photoresist layers. Steppers often use monochromatic (single-wavelength) light, enabling them to produce the detailed patterns required in the fabrication of fine geometry devices. As a substrate is processed, however, the topology of the substrate's upper surface becomes progressively less planar. This uneven topology can cause reflection and refraction of the monochromatic light, resulting in exposure of some of the photoresist beneath the opaque portions of the mask. As a result, this uneven surface topology can alter the mask pattern transferred to the photoresist layer, thereby altering the desired dimensions of the structures subsequently fabricated.

When a photoresist layer is deposited on a reflective underlying layer and exposed to monochromatic radiation (e.g., deep ultraviolet (UV) light), standing waves may be produced within the photoresist layer. In such a situation, the reflected light interferes with the incident light and causes a periodic variation in light intensity within the photoresist layer in the vertical direction. Standing-wave effects are usually more pronounced at the deep UV wavelengths used in modern steppers than at longer wavelengths because the surfaces of certain materials (e.g., oxide, nitride and polysilicon) tend to be more reflective at deep UV wavelengths. The existence of standing waves in the photoresist layer during exposure causes roughness in the vertical walls formed when sections of the photoresist layer are removed during patterning, which translates into variations in linewidths, spacing and other critical dimensions.

One technique helpful in achieving the necessary dimensional accuracy is the use of an antireflective coating (ARC). An ARC's optical characteristics are such that reflections occurring at inter-layer interfaces are minimized. The ARC's absorptive index is such that the amount of monochromatic light transmitted (in either direction) is minimized, thus attenuating both transmitted incident light and reflections thereof. The ARC's refractive and reflective indexes are fixed at values that cause any reflections which might still occur to be canceled.

As integrated circuit critical dimensions (CDs) shrink below 0.35 micron, the use of shorter wavelengths for photolithography imaging is required. For sub-0.35 micron critical dimensions, the wavelength for stepper tools has dropped into the deep ultraviolet (248 nm) range. One trade-off of the shorter wavelength is that the reflectivity from the substrate interface increases due to interference effects. Additionally, the shorter wavelength increases standing wave effects in the resist. The combination of interference and standing waves can greatly reduce CD control over various surface topographies.

The use of conventional ARC layers has successfully enhanced CD control for various polysilicon and silicided gate structures. However, one common phenomenon with conventional ARC films, especially spin-on organic ARC films, and deep-UV applications is a "resist footing" which has been observed at the resist/ARC interface. This phenomenon is attributed to the reactive nature inherent in deep-UV resists such as Apex-E®, a registered trademark of Shiply Corporation. The photoresist sensitivity to the underlying surface may cause the resist to incompletely activate, thereby leaving a "foot" at the bottom corners of the imaged line and resulting in CD variation. Another problem with conventional ARC layers is that one type of etchant gas has to be used to etch and open up the ARC while another type of etchant gas must be used to etch the underlying layer(s) supporting the ARC. Thus, there are a number of process steps needed in the etch recipe.

Therefore, what is needed and what has been invented is an improved ARC film, more specifically an improved dielectric ARC film, for deep-UV lithography on tungsten silicide ($WSi_x$) and polysilicon films without the "resist footing" phenomena. What is further needed and what has been invented is a method for etching a dielectric ARC with an etchant gas that may be subsequently used to etch the underlying layer(s) that supports the dielectric ARC. What is yet further needed and what has been invented is an etchant gas for the removal of a dielectric ARC from a substrate.

SUMMARY OF THE INVENTION

To overcome the limitations in the prior art described above, and to overcome other limitations that will become apparent upon reading and understanding the present specification, the present invention is embodied in a method and apparatus for etching dielectric layers and inorganic ARCs without the need for removing the substrate being processed from the processing chamber and without the need for intervening processing steps such as chamber cleaning operations. This process is thus referred to herein as an in situ process.

The present invention is further embodied in a process for etching a layer and/or a multi-layer film deposited on a substrate, such as silicon, located within a processing chamber. The substrate has a base, an underlying layer above the base, an overlying layer above the underlying layer, and a top dielectric (DARC) layer formed on the overlying layer. In a preferred embodiment, first the DARC layer and the overlying layer, such as silicide ($WSi_x$), is etched by a first process gas. Next, the underlying layer, such as a polysilicon layer, is etched by a second process gas. These steps are performed as an in situ process. In another embodiment, first the DARC layer is etched by a first process gas. Second, the overlying layer, such as a silicide ($WSi_x$), is etched by a second process gas. Next, the underlying layer, such as a polysilicon layer, is etched by a third process gas. These steps are also performed as an in situ process.

Throughout both processes the substrate remains in the processing chamber. Accordingly, the present invention eliminates the need to remove the substrate from the processing chamber between etching of the different layers, for chamber cleanings and the like. This improves throughput, reduces downtime and reduces contamination, among other benefits. In addition, the in situ processes of the present invention allow accurate control over the etch rate of the layers.

A feature of the present invention is the ability to etch a dielectric ARC with high etch selectivity. Another feature of the present invention is the capability of in situ etching of dielectric layers and inorganic ARCs. An advantage of present invention is that accurate etching of the DARC layer is produced. Another advantage of present invention is that the substrate being processed does not need to be removed from the processing chamber. Yet another advantage of present invention is that unwanted etching of layers underlying the layer being patterned is avoided. Another advantage of the present invention is that it can be used for all work related to etching, such as metal and silicon etching.

The present invention therefore accomplishes its desired objects by broadly providing a method for removing an anti-reflective coating from a substrate comprising the steps of:
  a) providing a substrate supporting an anti-reflective coating;
  b) providing an etchant gas comprising a fluorine-containing gas (e.g., $NF_3$) and a halogen-containing gas (e.g., $Cl_2$); and
  c) etching the anti-reflective coating of step (a) with the etchant gas of step (b) to remove the anti-reflective coating from the substrate.

The present invention also accomplishes its desired objects by broadly providing a method for etching a tungsten-silicide layer supporting an anti-reflective coating comprising the steps of:
  a) providing a substrate supporting a tungsten-silicide layer having an anti-reflective coating disposed thereon;
  b) providing an etchant gas comprising $NF_3$ and $Cl_2$;
  c) etching the anti-reflective coating of step (a) with the etchant gas of step (b) to remove at least a portion of the anti-reflective coating to expose at least part of the tungsten-silicide layer; and
  d) etching the exposed part of the tungsten-silicide layer with the etchant gas of step (b).

The anti-reflective coating is a dielectric anti-reflective coating having the formula $SiO_xN_yH_z$ wherein x is from 1 to 2 and y is from 0 to 1. Preferably, the anti-reflective coating is SiON. The etchant gas preferably comprises from about 10% by vol. to about 50% by vol. $NF_3$ and from about 50% by vol. to about 90% by vol. $Cl_2$. Preferably, the etchant gas consists of or consists essentially of $NF_3$ and $Cl_2$. The anti-reflective coating may support a mask layer (e.g., tetraethylorthosilicate) which would be etched and removed prior to etching the anti-reflective coating. The method for removing an anti-reflective coating additionally comprises disposing, prior to etching the anti-reflective coating, the substrate in a high density plasma chamber including a coil inductor and wafer pedestal; and performing the etching of the anti-reflective coating in the high density plasma chamber under the following process conditions:

| Process | Parameters |
| --- | --- |
| Etchant Gas Flow | 100 to 200 sccm |
| Pressure, mTorr | 0.5 to 50 milliTorr |
| RF Power (watts) of Coil Inductor | 100 to 3000 watts |
| RF Power (watts) of Wafer Pedestal | 50 to 400 watts |
| Temperature (° C.) of Substrate | 20 to 100° C. |
| Anti-Reflective Coating Etch Rate (Å/min) | 200 to 2000 Å/min |
| RF Frequency of Coil Inductor | 100 K to 200 MHz |
| RF Frequency of Wafer Pedestal | 100 K to 200 MHz |

The present invention further accomplishes its desired objects by broadly providing a method for producing a dielectric anti-reflective coating gate structure comprising the steps of:
  a) forming a patterned resist layer, a mask layer, a dielectric anti-reflective coating, and at least one conductive layer on a substrate;
  b) etching a portion of the mask layer to remove the portion of the mask layer from the dielectric anti-reflective coating to produce the substrate supporting the patterned resist layer, a residual mask layer, the dielectric anti-reflective coating, and the at least one conductive layer;
  c) etching the dielectric anti-reflective coating of step (b) with an etchant gas comprising $NF_3$ and $Cl_2$ to produce the substrate supporting the patterned resist layer, the residual mask layer, a residual dielectric anti-reflective coating, and the at least one conductive layer; and d) etching the at least one conductive layer with the etchant gas of step (c) to produce a dielectric anti-reflective coating gate structure.

As previously indicated, the dielectric anti-reflective coating preferably has the formula $SiO_xN_yH$ wherein x is an integer having a value ranging from 1 to 2 and y is an integer having a value ranging from 0 to 1. More preferably, the dielectric anti-reflective coating is SiON. The mask layer preferably comprises tetraethylorthosilicate. The at least one conductive layer preferably comprises tungsten silicide ($WSi_x$), more preferably a layer of a polysilicon layer supporting a tungsten silicide layer. As also previously indicated, the etchant gas flows at a rate ranging from about 100 sccm to about 200 sccm and preferably consists of or consists essentially of $NF_3$ and $CL_2$. The method for producing a dielectric anti-reflective coating gate structure additionally comprises disposing, prior to the etching step (c), the substrate of step (b) in a high density plasma chamber including a coil inductor and a wafer pedestal; and performing the etching step (c) and the etching step (d) in the high density plasma chamber under the following process conditions:

| Process | Parameters |
| --- | --- |
| $NF_3$ | 10 to 50% by vol. |
| $Cl_2$ | 50 to 90% by vol. |
| Pressure, mTorr | 0.5 to 50 milliTorr |
| RF Power (watts) of Coil Inductor | 100 to 3000 watts |
| RF Power (watts) of Wafer Pedestal | 50 to 400 watts |
| Temperature (° C.) of Substrate | 20 to 100° C. |
| Anti-Reflective Coating Etch Rate (Å/min) | 200 to 2000 Å/min |
| Tungsten-Silicide Etch Rate (Å/min) | 2000 to 4000 (Å/min) |
| RF Frequency of Coil Inductor | 100 K to 200 MHz |
| RF Frequency of Wafer Pedestal | 100 K to 200 MHz |

It is therefore an object of the present invention to provide a method for removing an anti-reflective coating from a substrate.

It is another object of the present invention to provide a method for etching a tungsten-silicide layer supporting an anti-reflective coating.

It is yet another object of the present invention to provide a method for producing a dielectric anti-reflective coating gate structure, and to provide a dielectric anti-reflective coating gate structure produced in accordance with the method(s) of the present invention.

These, together with the various ancillary objects and features which will become apparent to those skilled in the art as the following description proceeds, are attained by these novel methods, a preferred embodiment thereof shown with reference to the accompanying drawings, by way of example only, wherein:

BRIEF DESCRIPTION OF THE DRAWINGS

FIG. 37 is a vertical cross section of a substrate to be etched in accordance with another embodiment of the present invention;

FIG. 38 is a vertical cross section of the substrate of FIG. 37 being etched by the first step in accordance with another embodiment of the present invention;

FIG. 39 is a vertical cross section of the substrate of FIG. 37 being etched by the second step in accordance with another embodiment of the present invention;

FIG. 40 is a vertical cross section of the substrate of FIG. 37 being etched by the third step in accordance with another embodiment of the present invention;

DESCRIPTION OF THE PREFERRED EMBODIMENT

Figure 1:
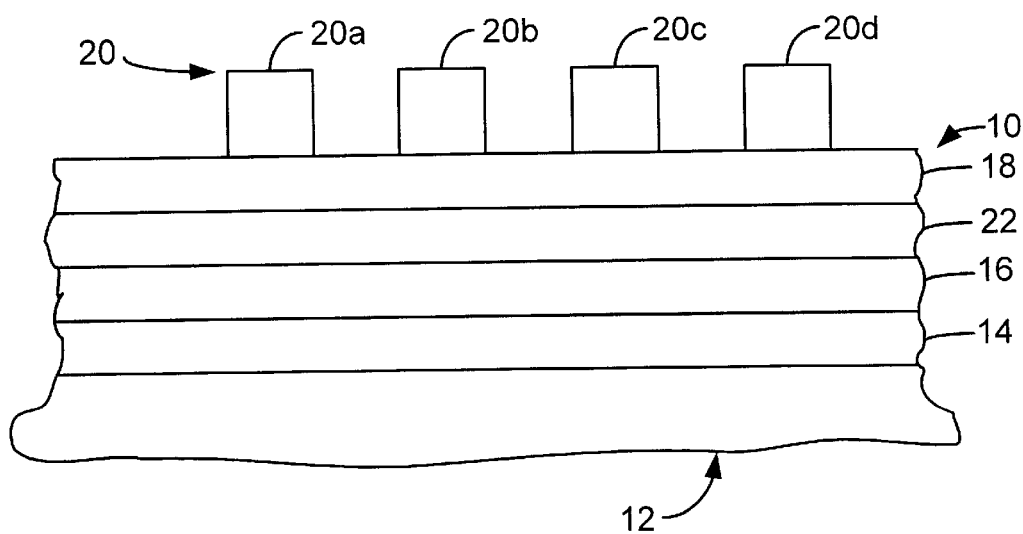
FIG. 1 is a side elevational view of a semiconductor silicon wafer having a semiconductor silicon substrate, a gate oxide layer disposed on the semiconductor silicon substrate, a polysilicon layer disposed on the gate oxide layer, a tungsten silicide layer disposed on the polysilicon layer, an anti-reflective coating disposed on the tungsten silicide layer, and a resist disposed on the anti-reflective coating.
Figure 2:
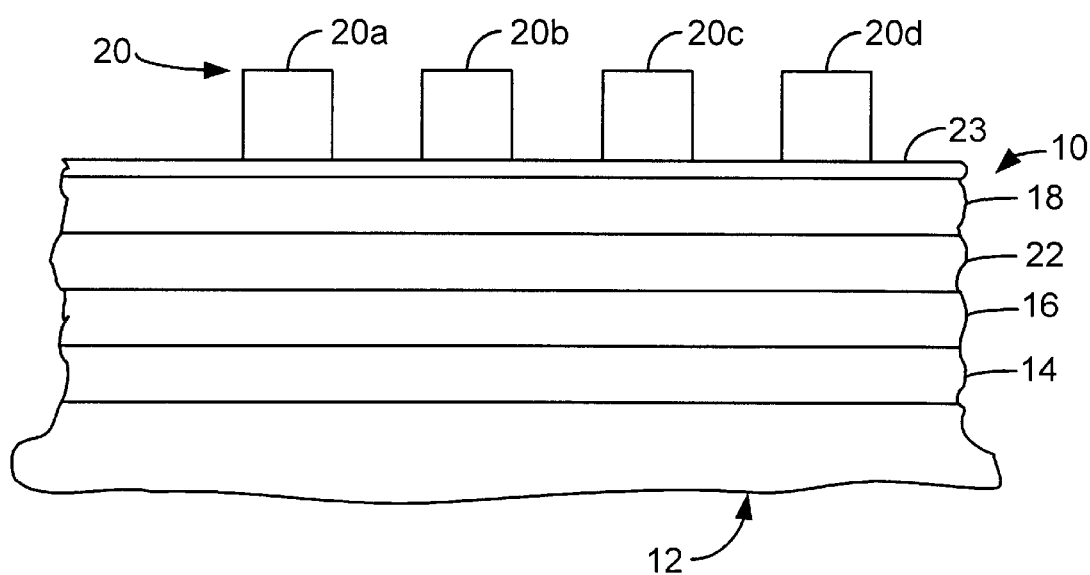
FIG. 2 is a side elevational view of another semiconductor silicon wafer having a semiconductor silicon substrate, a gate oxide layer disposed on the semiconductor silicon substrate, a polysilicon layer disposed on the gate oxide layer, a tungsten silicide layer disposed on the polysilicon layer, an anti-reflective coating disposed on the tungsten silicide layer, a mask layer disposed on the anti-reflective coating, and a resist disposed on the mask layer.

Referring in detail now to the drawings wherein similar parts of the present invention are identified by like reference numerals, there is seen in FIG. 1 a wafer, generally illustrated as 10, having a semiconductor silicon substrate, generally illustrated as 12. A gate oxide layer (e.g., a $SiO_2$ layer) 14 is disposed over the semiconductor silicon substrate 12 and a polysilicon layer 16 is disposed over the gate oxide layer 14. A tungsten silicide ($WSi_x$) layer 22 is supported by the polysilicon layer 16. An anti-reflective coating (ARC) 18 is disposed over the tungsten silicide layer 22 and a resist (i.e., a photoresist or photomask), generally illustrated as 20, is patterned for being selectively positioned on the ARC 18, as best shown in FIG. 1. As further best shown in FIG. 1, the resist 20 includes a plurality of resist members 20a, 20b, 20c, and 20d. In another preferred embodiment of the invention as shown in FIG. 2, a mask layer 23 is disposed over the ARC 18. In the preferred embodiment of the invention shown in FIG. 3, the ARC 18 is supported by the polysilicon layer 16 instead of the tungsten silicide layer 22 which is absent for this embodiment of the invention.

The gate oxide layer 14 may be any suitable oxide layer of any suitable thickness. Preferably, the gate oxide layer 14 comprises $SiO_2$ and/or silicon nitride ($Si_3N_4$), and possesses a thickness ranging from 10 Angstroms to about 600 Angstroms, more preferably from about 40 Angstroms to about 300 Angstroms, most preferably from about 80 Angstroms to about 120 Angstroms. The gate oxide layer 14 is preferably formed on the semiconductor silicon substrate 12 by a RF magnetron sputtering method.

The polysilicon layer 16 is used as a conductive material. The thickness of the polysilicon layer 16 would depend upon the end use of the semiconductor device which is to contain the polysilicon layer 16. Typically, the thickness of the polysilicon layer 16 ranges from about 500 Angstroms to about 4000 Angstroms, more preferably from about 1000 Angstroms to about 3000 Angstroms, most preferably from about 1500 Angstroms to about 2500 Angstroms. The polysilicon layer 16 is preferably disposed on the gate oxide layer 14 by the RF magnetron sputtering method.

The tungsten silicide ($WSi_x$) layer 22 is also used as a conductive material and includes a thickness which would depend upon the end use of the semiconductor device which is to contain the tungsten silicide layer 22. Typically, the thickness of the tungsten silicide ($WSi_x$) layer 22 ranges from about 500 Angstroms to about 4000 Angstroms, more preferably from about 1000 Angstroms to about 3000 Angstroms, most preferably from about 1500 Angstroms to about 2500 Angstroms. The tungsten silicide ($WSi_x$) layer 22 is preferably disposed on the polysilicon layer 16 by a RF magnetron sputtering method.

The ARC 18 may be any suitable coating or layer that is deposited to protect layers underlying the ARC 18 from etchants used to pattern layers overlying the ARC 18, and to promote more accurate patterning of the layer underlying the ARC 18 by reducing the reflection and refraction of incident light within a photoresist layer used in the patterning operation. According to the method of the present invention, the ARC 18 preferably includes silicon, nitrogen and oxygen. More preferably, the ARC 18 includes a composition of matter having the formula:

$$SiO_xN_yH_z$$

wherein x is an integer ranging from 1 to 2, y is from 0 to 1, and z is from 0 to 1. A suitable ARC has been discovered to be SiON. An ARC having this kind of composition is referred to herein as a dielectric ARC (DARC), as distinguished from a more traditional ARC, which is normally organic in composition. According to the present invention, a DARC may be deposited on a substrate such as the tungsten silicide ($WSi_x$) layer 22 or the polysilicon 16 layer, using a plasma-enhanced chemical vapor deposition (PECVD) technique. To deposit the DARC, a chemical reaction is promoted between silane ($SiH_4$) and nitrous oxide ($N_2O$), in the presence of helium (He) and, optionally, a nitrogen-containing compound (e.g., ammonia (NH3), substantially adjacent to the substrate's surface. While these process gases are preferred, they are by no means the only combination which may be used in the method of the present invention. For example, other silicon-containing compounds, such as tetraethylorthosilane (TEOS) and others, and other oxygen sources such as oxygen ($O_2$), ozone ($O_3$) and others, and other sources of nitrogen, may also be employed, although different processing conditions may be required.

The mask layer 23 may be any suitable mask layer that is capable of being etched in accordance with the procedure described hereinafter such that all traces of the mask layer 23 are essentially removed from the ARC 18 except those portions (identified as "23a" "23b" "23c" and "23d" below) of the mask layer 23 remaining under the resist 20. The mask layer 23 may also be of any suitable thickness. Preferably, the mask layer 23 comprises silicon dioxide ($SiO_2$) and/or silicon nitride ($Si_3N_4$) or tetraethylorthosilcate (TEOS) or any other suitable dielectric material. A preferred thickness for the mask layer 23 ranges from about 10 Angstroms to about 1000 Angstroms, more preferably from about 40 Angstroms to about 500 Angstroms, most preferably from about 50 to about 200 Angstroms. The mask layer 23 is preferably disposed on the ARC 18 by chemical vapor deposition.

The patterned resist 20 (i.e., the photoresist 20, including resist members 20a, 20b, 20c and 20d) may be any suitable layer of material(s) that is capable of protecting any underlying material (e.g., the mask layer 23) from being etched during the etching process of the present invention.

Suitable materials for the resist 20 include resist systems consisting of novolac resin and a photoactive dissolution inhibitor (all based on Süss's discovery). Other suitable materials for the resist 20 are listed in an article from the July 1996 edition of *Solid State Technology* entitled "Deep-UV Resists: Evolution and Status" by Hiroshi Ito. The resist 20 may have any suitable thickness; preferably, the thickness of the resist 20 ranges from about 0.3 $\mu$m to about 1.40 $\mu$m, more preferably from about 0.4 $\mu$m to about 0.8 $\mu$m, most preferably about 0.6 $\mu$m. The patterned resist 20 is preferably disposed on the mask layer 23 by the spin coating method.

Figure 3:
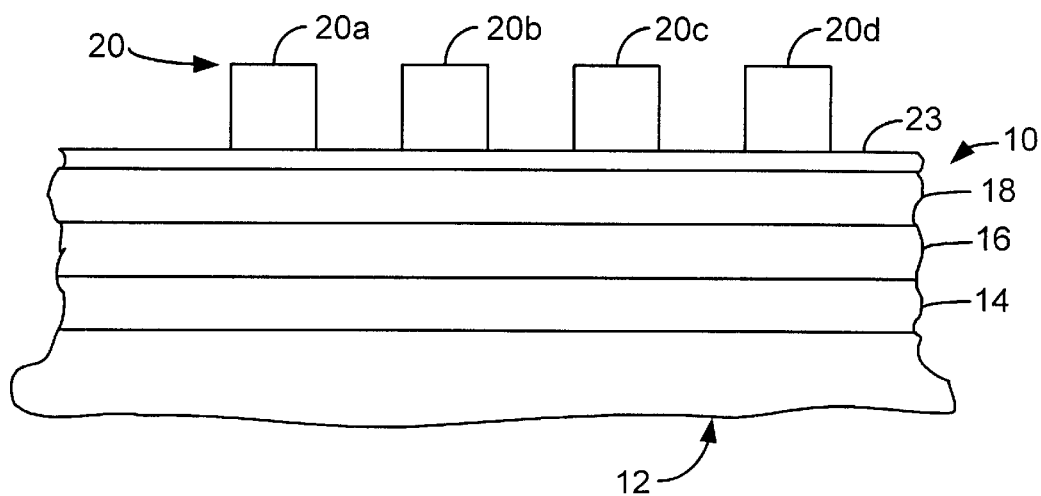
FIG. 3 is a side elevational view of yet another semiconductor silicon wafer having a semiconductor silicon substrate, a gate oxide layer disposed on the semiconductor silicon substrate, a polysilicon layer disposed on the gate oxide layer, an anti-reflective coating disposed on the polysilicon layer, a mask layer disposed on the anti-reflective coating, and a resist disposed on the mask layer.
Figure 4:
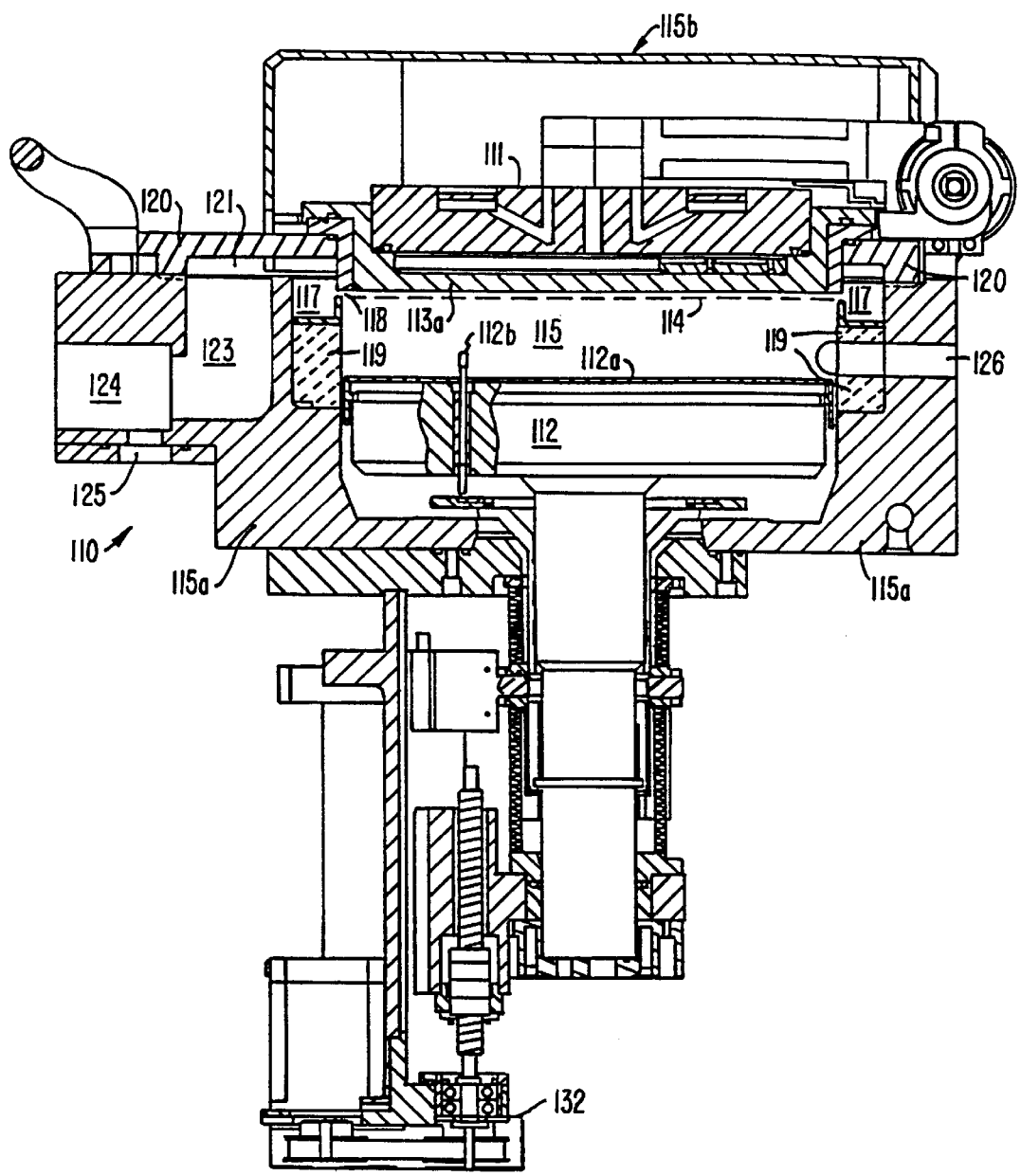
FIG. 4 is a vertical sectional view of a CVD apparatus for depositing an anti-reflective coating (ARC) on a tungsten silicide layer.
Figure 5:
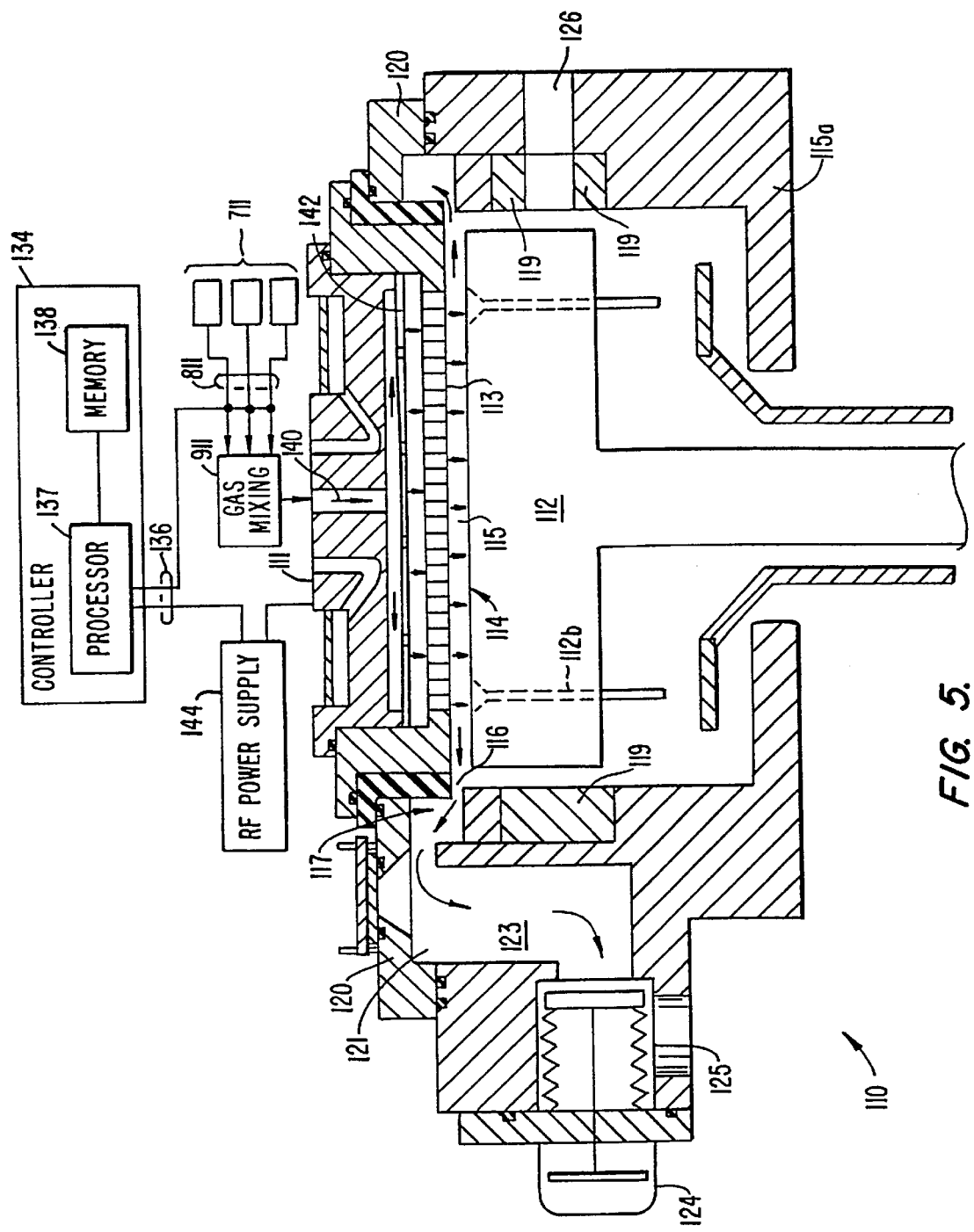
FIG. 5 is another vertical sectional view of the CVD apparatus for depositing the anti-reflective coating on the tungsten silicide layer.
Figure 6:
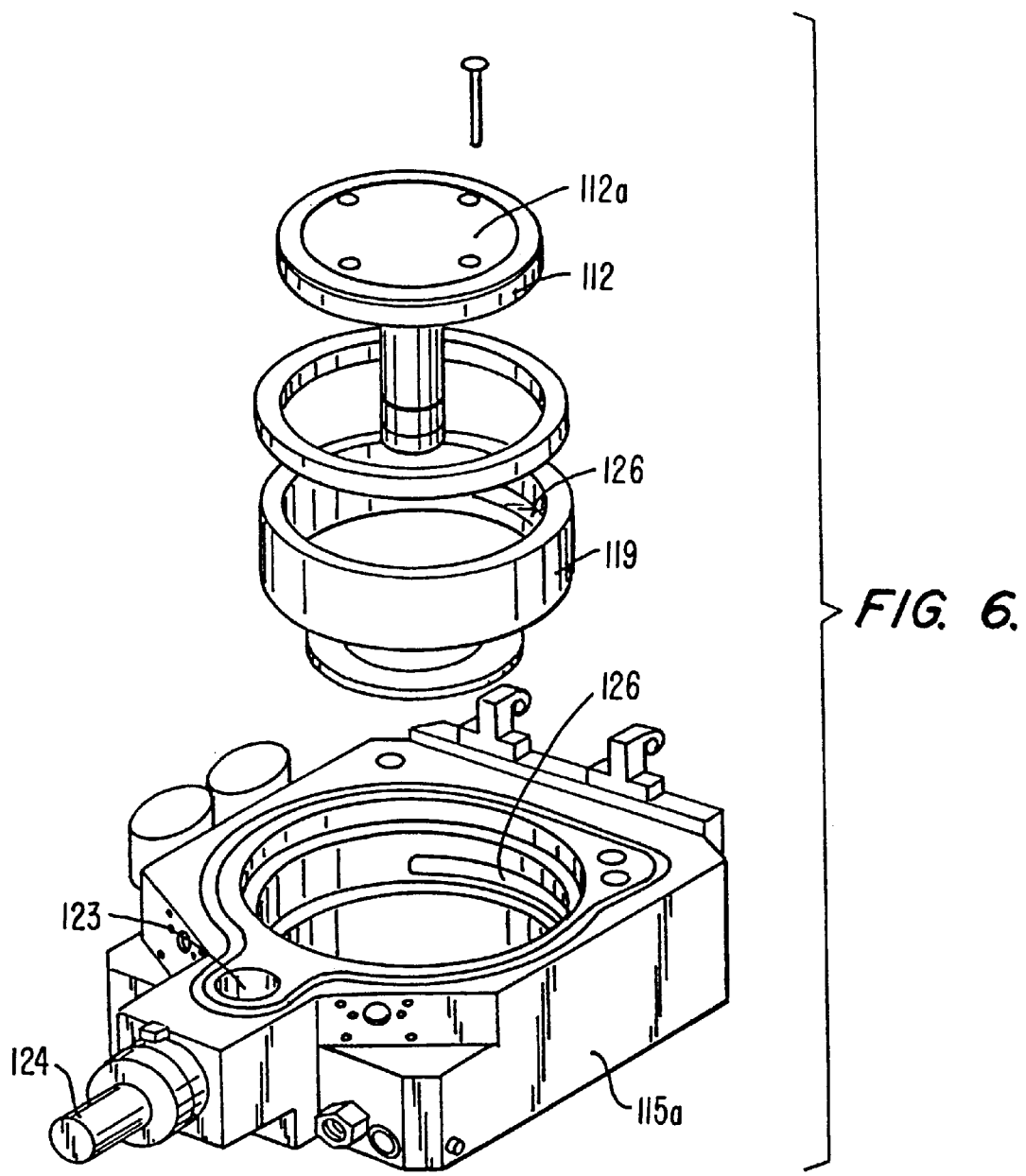
FIG. 6 is a segmented perspective view of the chamber wall assembly for the CVD apparatus of FIGS. 4 and 5.
Figure 7:
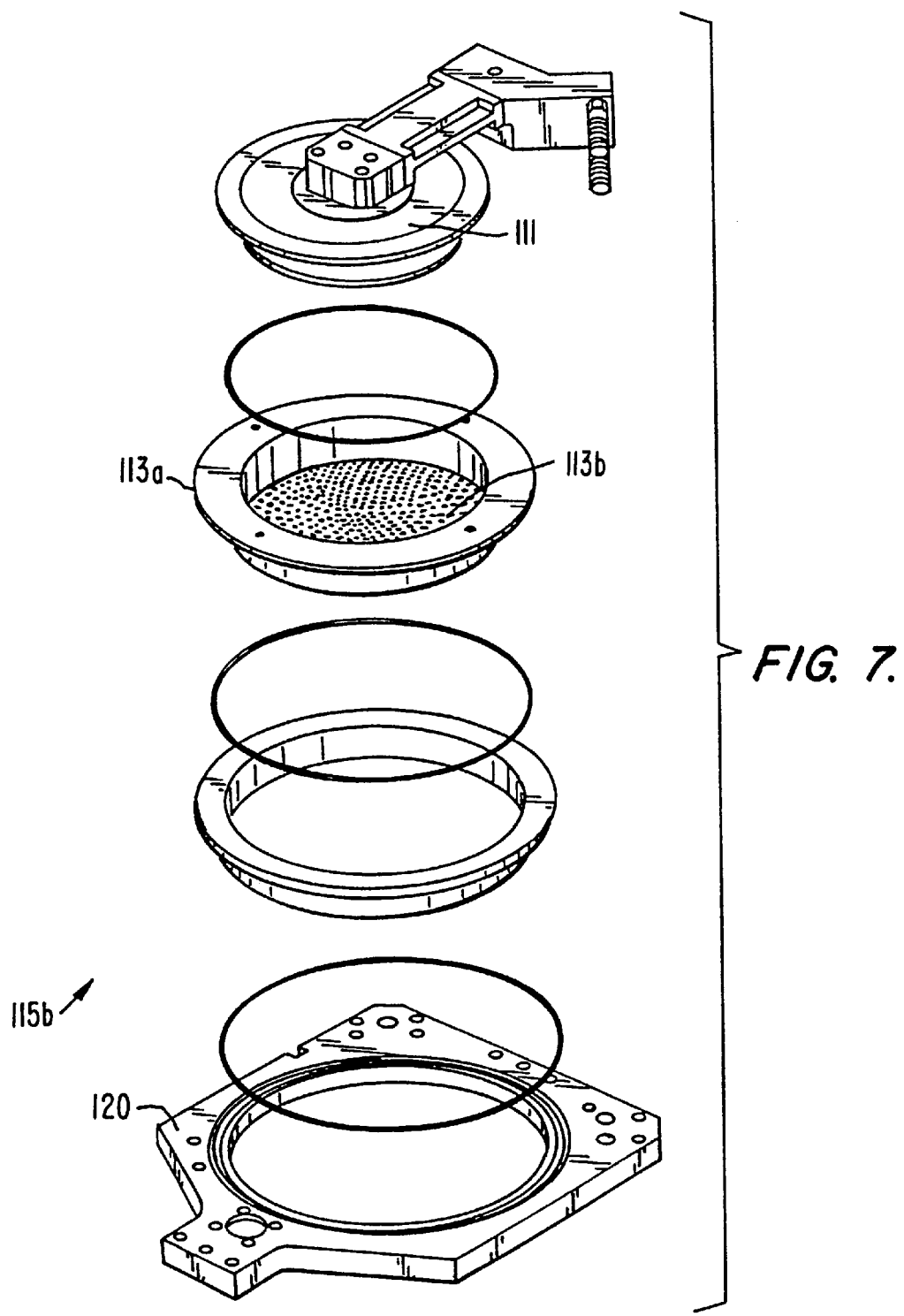
FIG. 7 is a segmented perspective view of the chamber lid assembly for the CVD apparatus FIGS. 4 and 5.

The anti-reflective coating (ARC) 18 may be deposited on the tungsten silicide ($WSi_x$) layer 22 (see FIGS. 1 and 2) or the polysilicon layer 16 (see FIG. 3) in any suitable manner and with any suitable apparatus. One suitable CVD apparatus in which the method of the present invention can be carried out is shown in FIGS. 4 and 5, which are vertical, cross-sectional views of a CVD system 110, having a vacuum or processing chamber 115 that includes a chamber wall 115a and chamber lid assembly 115b. Chamber wall 115a and chamber lid assembly 115b are shown in exploded, perspective views in FIGS. 6 and 7. CVD system 110 has been fully disclosed and described in U.S. Pat. No. 6,127,262, and entitled "Method and Apparatus for Depositing an Etch Stop Layer," fully incorporated herein by reference thereto as if repeated verbatim immediately hereinafter.

CVD system 110 contains a gas distribution manifold 111 for dispersing process gases to a substrate (not shown) that rests on a heated pedestal 112 centered within the process chamber. During processing, the substrate (e.g., a semiconductor wafer) is positioned on a flat (or slightly convex) surface 112a of pedestal 112. The pedestal can be moved controllably between a lower loading/offloading position (depicted in FIG. 4) and an upper processing position (indicated by dashed line 114 in FIG. 4 and shown in FIG. 5), which is closely adjacent to manifold 111. A centerboard (not shown) includes sensors for providing information on the position of the wafers.

Deposition and carrier gases are introduced into chamber 115 through perforates or holes 113b (FIG. 7) of a conventional flat, circular gas distribution face plate 113a. More specifically, deposition process gases flow into the chamber through the inlet of the gas distribution manifold 111 (indicated by arrow 140 in FIG. 5), through a conventional perforated blocker plate 142 and then through holes 113b in gas distribution faceplate 113a.

Before reaching the manifold, deposition and carrier gases are input from gas sources 711 through gas supply lines 811 (FIG. 5) into a mixing system 911 where they are combined and then sent to manifold 111. Generally, the supply line for each process gas includes (i) several safety shut-off valves (not shown) that can be used to automatically or manually shut-off the flow of process gas into the chamber, and (ii) mass flow controllers (also not shown) that measure the flow of gas through the supply line. When toxic gases are used in the process, the several safety shut-off valves are positioned on each gas supply line in conventional configurations.

The deposition process performed in CVD system 110 can be either a thermal process or a plasma enhanced process. In a plasma enhanced process, an RF power supply 144 applies electrical power between the gas distribution faceplate 113a and the pedestal so as to excite the process gas mixture to form a plasma within the cylindrical region between the faceplate 113a and the pedestal 112. (This region will be referred to herein as the "reaction region"). Constituents of the plasma react to deposit a desired film on the surface of the semiconductor wafer supported on pedestal 112. RF power supply 144 is a mixed frequency RF power supply that typically supplies power at a high RF frequency (RF1) of 13.56 MHz and at a low RF frequency (RF2) of 360 KHz to enhance the decomposition of reactive species-introduced into the vacuum chamber 115.

During a deposition process, the plasma heats the entire process chamber 110, including the walls of the chamber body 115a surrounding the exhaust passageway 123 and the shut-off valve 124. When the plasma is not turned on, a hot liquid is circulated through the walls 115a of the process chamber to maintain the chamber at an elevated temperature. Fluids used to heat the chamber walls 115a include the typical fluid types, i.e., water-based ethylene glycol or oil-based thermal transfer fluids. This heating beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction products, is evacuated from the chamber by a vacuum pump (not shown). Specifically, the gases are exhausted through an annular, slot-shaped orifice 116 surrounding the reaction region and into an annular exhaust plenum 117. The annular slot 116 and the plenum 117 are defined by the gap between the top of the chamber's cylindrical side wall 115a (including the upper dielectric lining 119 on the wall) and the bottom of the circular chamber lid 120. The 360 degrees circular symmetry and uniformity of the slot orifice 116 and the plenum 117 are important to achieving a uniform flow of process gases over the wafer so as to deposit a uniform film on the wafer.

From the exhaust plenum 117, the gases flow underneath a lateral extension portion 121 of the exhaust plenum 117, past a viewing port (not shown), through a downward-extending gas passage 123, past a vacuum shut-off valve 124 (whose body is integrated with the lower chamber wall 115a), and into the exhaust outlet 125 that connects to the external vacuum pump (not shown) through a foreline (also not shown).

The wafer support platter of the pedestal 112 (preferably aluminum) is heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of the pedestal 112.

Typically, any or all of the chamber lining, gas inlet manifold faceplate, and various other reactor hardware are made out of material such as aluminum or anodized aluminum. An example of such a CVD apparatus is described in U.S. Pat. No. 5,558,717 entitled "CVD Processing Chamber," issued to Zhao et al. U.S. Pat. No. 5,558,717 patent is assigned to Applied Materials, Inc., the assignee of the present invention, and is hereby incorporated by reference in its entirety.

A lift mechanism and motor 132 (FIG. 4) raises and lowers the heater pedestal assembly 112 and its wafer lift pins 112b as wafers are transferred into and out of the body of the chamber by a robot blade (not shown) through an insertion/removal opening 126 in the side of the chamber 110. The motor 132 raises and lowers pedestal 112 between a processing position 114 and a lower, wafer-loading position. The motor, valves or flow controllers connected to the supply lines 811, gas delivery system, throttle valve, RF power supply 144, and chamber and substrate heating systems are all controlled by a system controller 134 (FIG. 5) over control lines 136, of which only some are shown. Controller 134 relies on feedback from optical sensors to determine the position of movable mechanical assemblies such as the throttle valve and susceptor which are moved by appropriate motors under the control of controller 134.

In a preferred embodiment, the system controller includes a hard disk drive (memory 138), a floppy disk drive, and a processor 137. The processor contains a single-board computer (SBC), analog and digital input/output boards, interface boards and stepper motor controller boards. Various parts of CVD system 110 conform to the Versa Modular European (VME) standard which defines board, card cage, and connector dimensions and types. The VME standard also defines the bus structure as having a 16-bit data bus and a 24-bit address bus.

System controller 134 controls all of the activities of the CVD machine. The system controller executes system control software, which is a computer program stored in a computer-readable medium such as a memory 138. Preferably, memory 138 is a hard disk drive, but memory 138 may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate controller 134.

Figure 11:
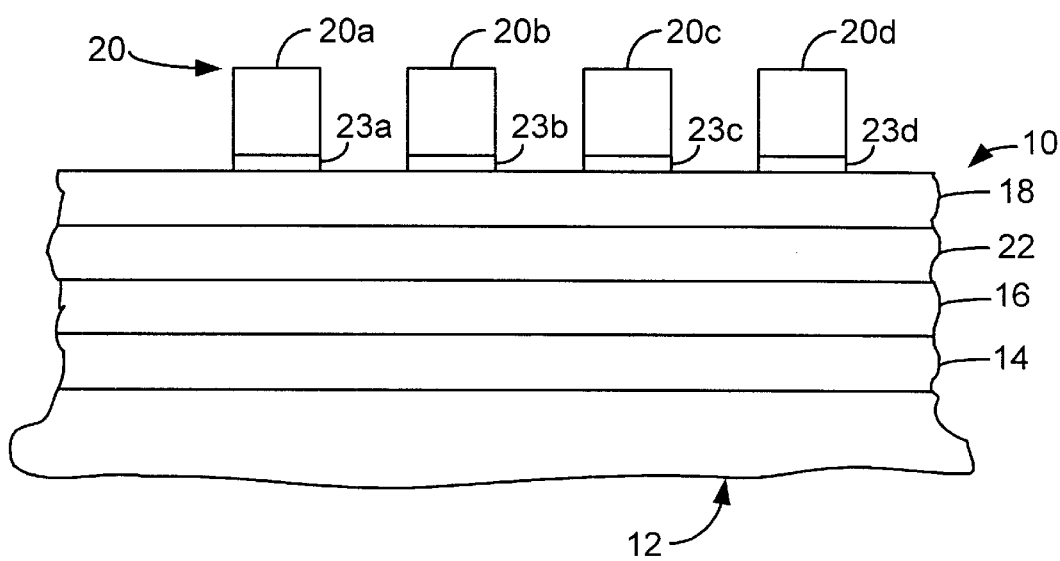
FIG. 11 is a side elevational view of the semiconductor silicon wafer of FIG. 2 after the mask layer has been etched.
Figure 12:
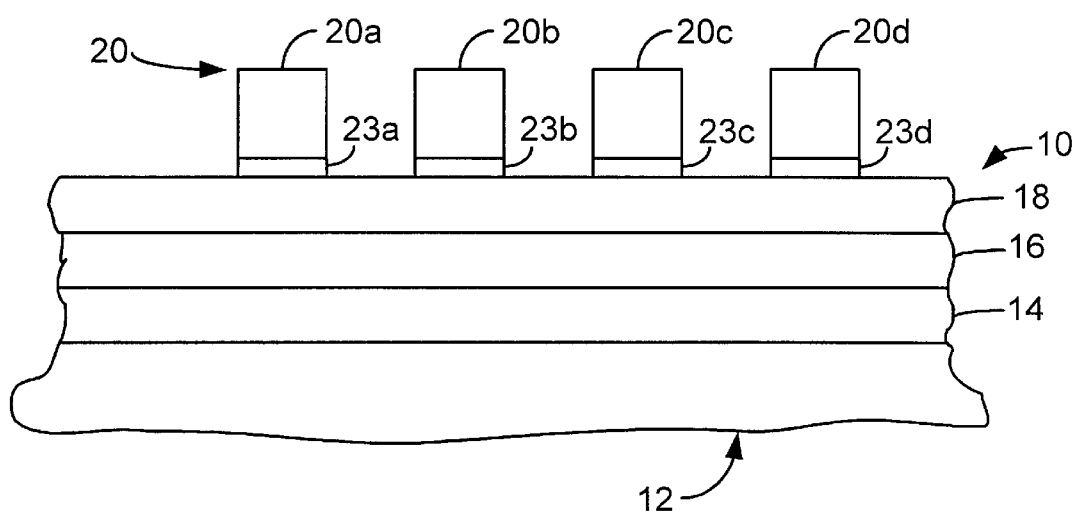
FIG. 12 is a side elevational view of the semiconductor wafer of FIG. 3 after the mask layer has been etched.

In order to form or produce a semiconductor device from the multilayered structure of FIG. 1 or FIG. 2, the multilayered structure is initially placed in a suitable plasma processing apparatus to break through and remove or etch away selective parts of the mask layer 23 from the surface of the ARC 18, except the mask layers 23a, 23b. 23c and 23d that are below the resist 20, more specifically below the resist members 20a, 20b, 20c and 20d as best shown in FIGS. 11 and 12.

Figure 8:
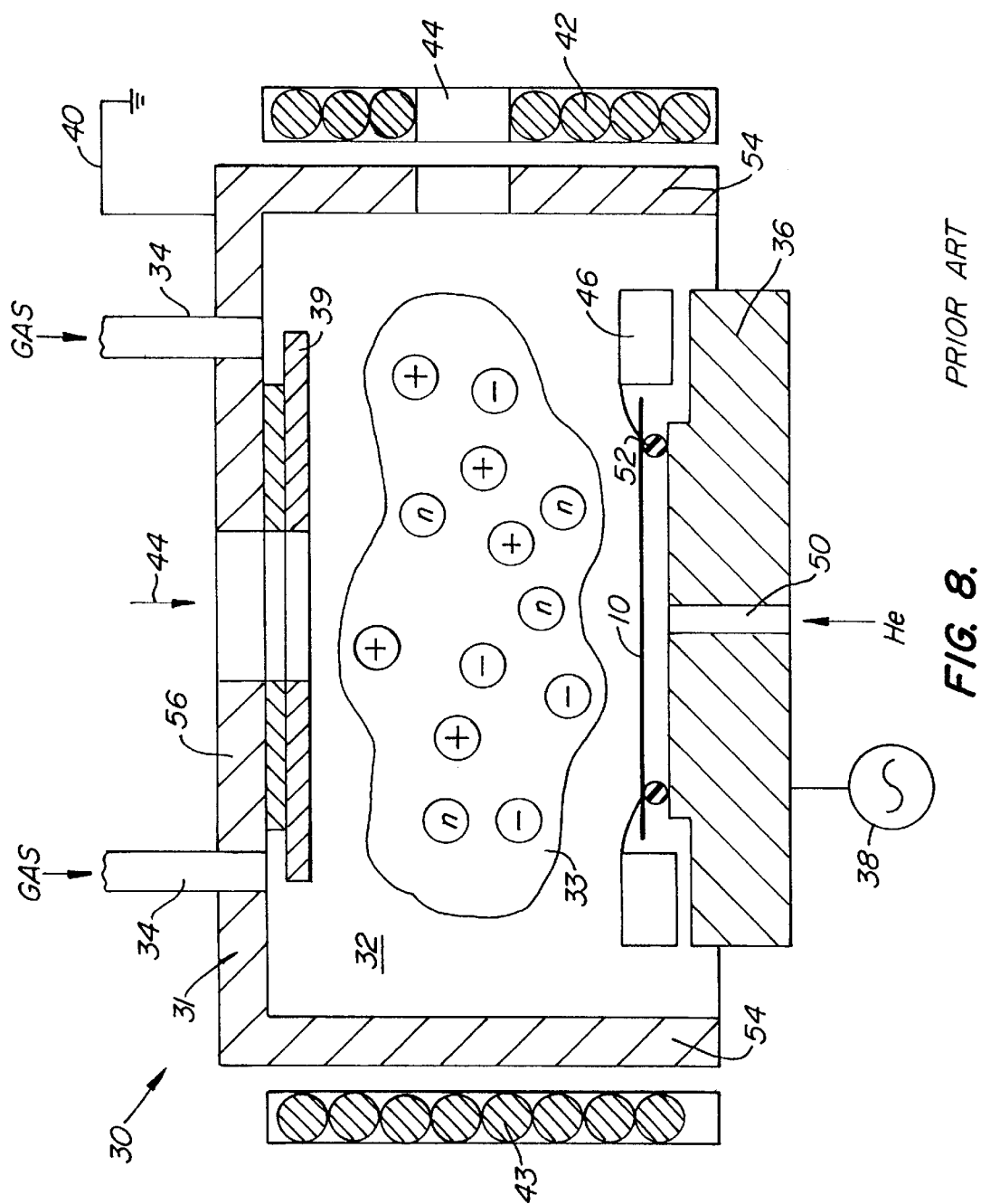
FIG. 8 is a vertical sectional view of a prior art plasma processing apparatus including a plasma etching reactor with an electromagnetic unit for enhancing a plasma.

A suitable prior art plasma processing apparatus is shown in FIG. 8 and described in U.S. Pat. No. 5,188,704 to Babie et al., fully incorporated herein by reference thereto as if repeated verbatim immediately hereinafter. The plasma process apparatus of FIG. 8 comprises a plasma reactor, generally illustrated as 30 and including walls, generally illustrated as 31 for forming and housing a reactor chamber 32 wherein a plasma 33 of neutral (n) particles, positive (+) particles, and negative (−) particles are found. Walls 31 include cylindrical wall 54 and cover 56. Plasma processing gases are introduced via inlets 34 into reactor chamber 32. Plasma etching cases are introduced into chamber 32 through inlets 34—34. A water cooled cathode 36 is connected to an RF power supply 38 at 13.56 MHz. An anode 39 is connected to the walls 31 which are grounded by line 40. Helium gas is supplied through passageway 50 of cathode 36 to the space beneath wafer 10 which is supported peripherally by lip seal 52 so that the helium gas cools the wafer 10. The wafer 10 is supported by a wafer support 46 that includes a plurality of clamps (not shown) which hold down the upper surface of wafer 10 at its periphery, as is well known to those skilled in the art. A pair of Helmholtz-configured electromagnetic coils 42 and 43 provide north and south poles within the chamber 32 and are disposed at opposite ends of the lateral cylindrical wall 54 and the walls 31. The electromagnetic coils 42 and 43 provide a transverse magnetic field with the north and south poles at the left and right providing a horizontal magnetic field axis parallel to the surface of the wafer 10. The transverse magnetic field is applied to slow the vertical velocity of the electrons which are accelerated radially by the magnetic field as they move towards the wafer 10. Accordingly, the quantity of electrons in the plasma 33 is increased by means of the transverse magnetic field and the plasma 33 is enhanced as is well known to those skilled in the art.

The electromagnetic coils 42 and 43 which provide the magnetic field are independently controlled to produce a field intensity orientation which is uniform. The field can be stepped angularly around the wafer 10 by rotating the energization of the electromagnetic coils 42 and 43, sequentially. The transverse magnetic field provided by the electromagnetic coils 42 and 43 is directed parallel to the surface of the wafer 10 being treated by the plasma 33, and the cathode 36 of the plasma reactor 30 efficiently increases ionization of the electrons in the plasma 33. This provides the ability to decrease the potential drop across the sheath of the cathode 36 and to increase the ion current flux present on the surface of the wafer 10, thereby permitting higher rates of etching without requiring higher ion energies to achieve the result otherwise.

Figure 9:
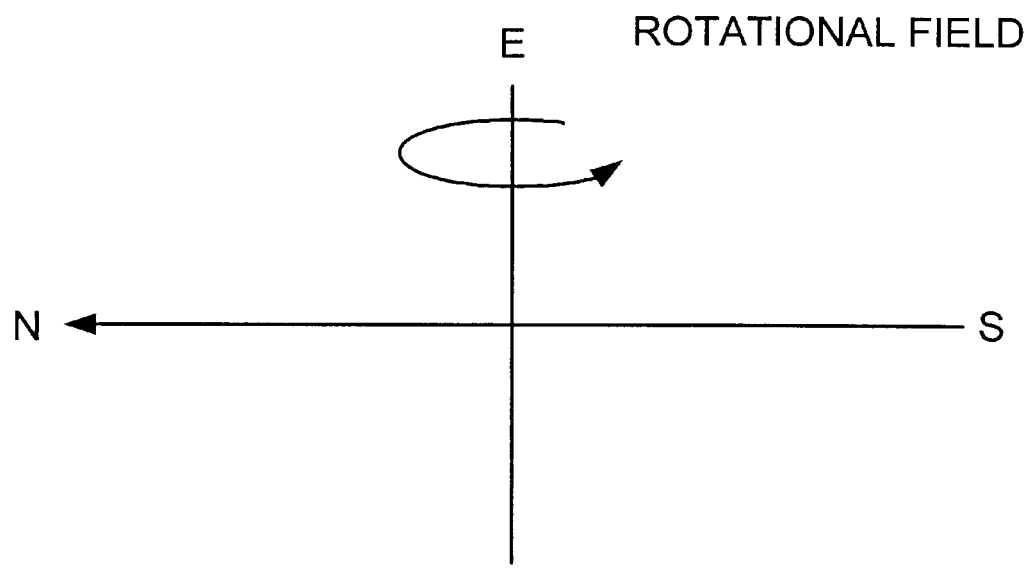
FIG. 9 is a diagram of a flux produced by a magnetic field and illustrated as rotating around a center axis.

The preferred magnetic source employed to achieve the magnetically enhanced reactive ion etcher (RIE) used in practicing the present invention is a variable rotational field provided by the electromagnetic coils 42 and 43 arranged in a Helmholtz configuration. The electromagnetic coils 42 and 43 are driven by 3-phase AC currents. The magnetic field with Flux B is parallel to the wafer 10 and perpendicular to the electrical field as shown in FIG. 9. Referring to FIG. 9, the vector of the magnetic field H which produces flux B is rotating around the center axis of the electrical field by varying the phases of current flowing through the electromagnetic coils 42 and 43 at a typical rotational frequency of 0.01 to 1 Hz, particularly at 0.5 Hz. The strength of the magnetic flux B typically varies from 0 Gauss to about 150 Gauss and is determined by the quantities of the currents supplied to the electromagnetic coils 42 and 43. While FIG. 8 illustrates one plasma processing apparatus that is suitable for removing the mask layer 23 (except mask layers 23a, 23b, 23c and 23d), it is to be understood that other reactive ion etchers may be employed, such as electron cyclotron resonance (ECR), helicon resonance or inductively coupled plasma (ICP), triode etchers, etc.

The plasma 33 may employ any suitable etchant gas to break through (i.e., to clean and etch away) the mask layer 23, except those mask layers 23a, 23b, 23c and 23d, below the resist members 20a, 20b, 20c and 20d, respectively, as best shown in FIG. 11 and FIG. 12. For example, if the mask layer 23 contains silicon oxide or is TEOS, suitable etchant gas(es) may be selected from the group consisting of fluorine-containing gases (e.g., $CHF_3$, $SF_6$, $C_2F_6$, $NF_3$, $CF_4$, etc.), bromine-containing gases (e.g., HBr, etc.), chlorine-containing gases (e.g., $Cl_2$, $CHCl_3$, etc.), rare gases (e.g., argon, etc.), and mixtures thereof. Preferably, the etchant does not include an oxidant, such as oxygen, since the purpose of this step is to remove the mask layer 23 (except mask layers 23a, 23b, 23c and 23d, which are protected by resist members 20a, 20b, 20c and 20d) and not to remove the resist 20. Preferably,the etchant gas comprises from about 20% by volume to about 100% by volume $CF_4$ and from about 0% by volume to about 80% by volume argon. The preferred reactor conditions for a suitable plasma processing apparatus (such as the plasma processing apparatus of FIG. 8) in removing the mask layer 23 (except mask layers 23a, 23b, 23c and 23d) are as follows:

| | |
|---|---|
| Pressure | .5–50 mTorr |
| RF Power | 500–1500 watts |
| Rotational Magnetic Field | 25–70 Gauss |
| Temperature of Wafer | 25–100° C. |
| Mask layer 23 Etch Rate | 2000–10,000 Angstroms/min |

The selectivity of mask layer 23 to resist 20 is better than 3:1, depending on the materials employed for the mask layer 23 and the resist 20.

More generally, the process parameters for removing the mask layer 23 in a suitable plasma process apparatus (such as the plasma processing apparatus of FIG. 8) fall into ranges as listed in the following Table I and based on flow rates of the gases $CF_4$ and Ar also listed in the following Table I:

TABLE I

| Process | Broad | Preferred |
|---|---|---|
| Gas Flow, sccm | | |
| $CF_4$ | 2 to 150 | 20 to 40 |
| | (20 to 100% by vol.) | |
| Ar | 0 to 120 | 60 to 80 |
| | (00 to 80% by vol.) | |
| Pressure, mT | .5 to 50 | 5 to 15 |
| 13.56 MHz | | |
| RF Power (Watts) | 50 to 2500 | 50 to 1500 |
| Temperature (° C.) of Wafer | 10 to 120 | 25 to 100 |
| Magnetic Field Gauss | 10 to 120 | 25 to 70 |

After selective parts of the mask layer 23 have been etched away (see FIGS. 11 and 12) from the surface of the ARC 18 to expose the latter and such that the only remnants of the mask layer 23 are the mask layers 23a, 23b, 23c and 23d situated immediately below the resist members 20a, 20b, 20c, and 20d, respectively, the mask layer 23 has now been patterned in accordance with the pattern of the patterned resist 20. Therefore, the patterned resist 20 is no longer needed and the patterned resist members 20a, 20b, 20c and 20d are to be removed. For the embodiment of the invention depicted in FIG. 1, the resist 20 would not be removed since the patterns of the resist members 20a, 20b, 20c and 20d are needed for etching the ARC 18 and the tungsten silicide layer 22 and the polysilicon layer 16. For the embodiment of the invention illustrated in FIGS. 11 and 12, the resist members 20a, 20b, 20c and 20d may be removed at any suitable time, preferably before the etching of the ARC 18.

The resist members 20a, 20b, 20c and 20d in FIGS. 11 and 12 may be removed in any suitable manner such as by using oxygen plasma ashing which is well known to those skilled in the art. The resist members 20a, 20b, 20c and 20d may be respectively stripped from the mask layers 23a, 23b, 23c and 23d with any suitable plasma processing apparatus, such as the plasma processing apparatus shown in FIG. 3 and employing a plasma containing an etchant gas comprising oxygen. The resist members 20a, 20b, 20c and 20d have been respectively removed from the mask layers 23a, 23b, 23c and 23d in an advanced strip passivation (ASP) chamber of a plasma processing apparatus sold under the trademark metal etch MxP Centura to Applied Materials, Inc. 3050 Bowers Avenue, Santa Clara, Calif. 95054-3299. In stripping the resist members 20a, 20b, 20c and 20d from the mask layers 23a, 23b, 23c and 23d, respectively, the ASP chamber may employ microwave downstream $O_2/N_2$ plasma with the following recipe: 120 seconds, 250° C., 1400 W, 3000 cc $O_2$, 300 cc $N_2$ and 2 Torr.

Figure 10:
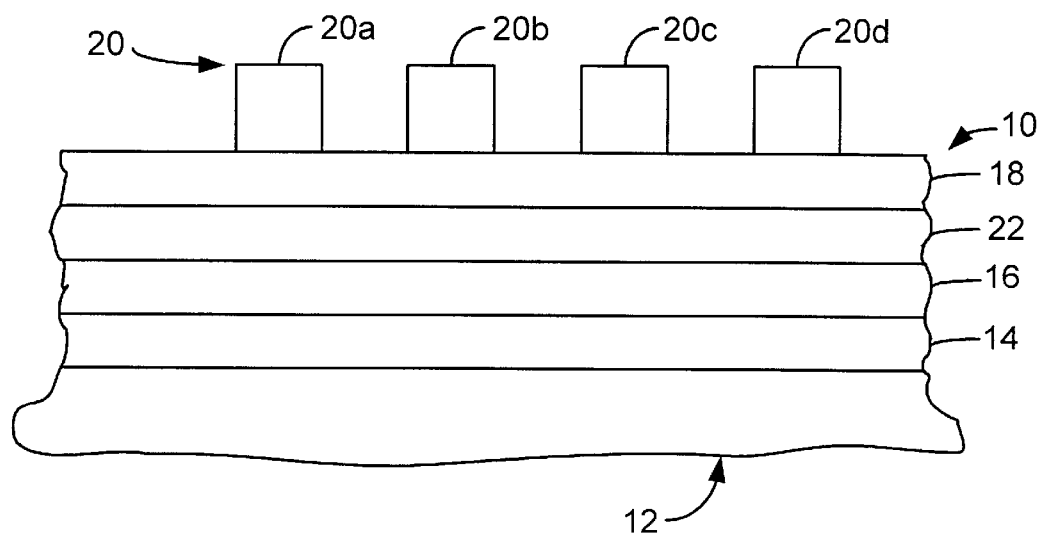
FIG. 10 is another side elevational view of the semiconductor silicon wafer of FIG. 1.
Figure 21:
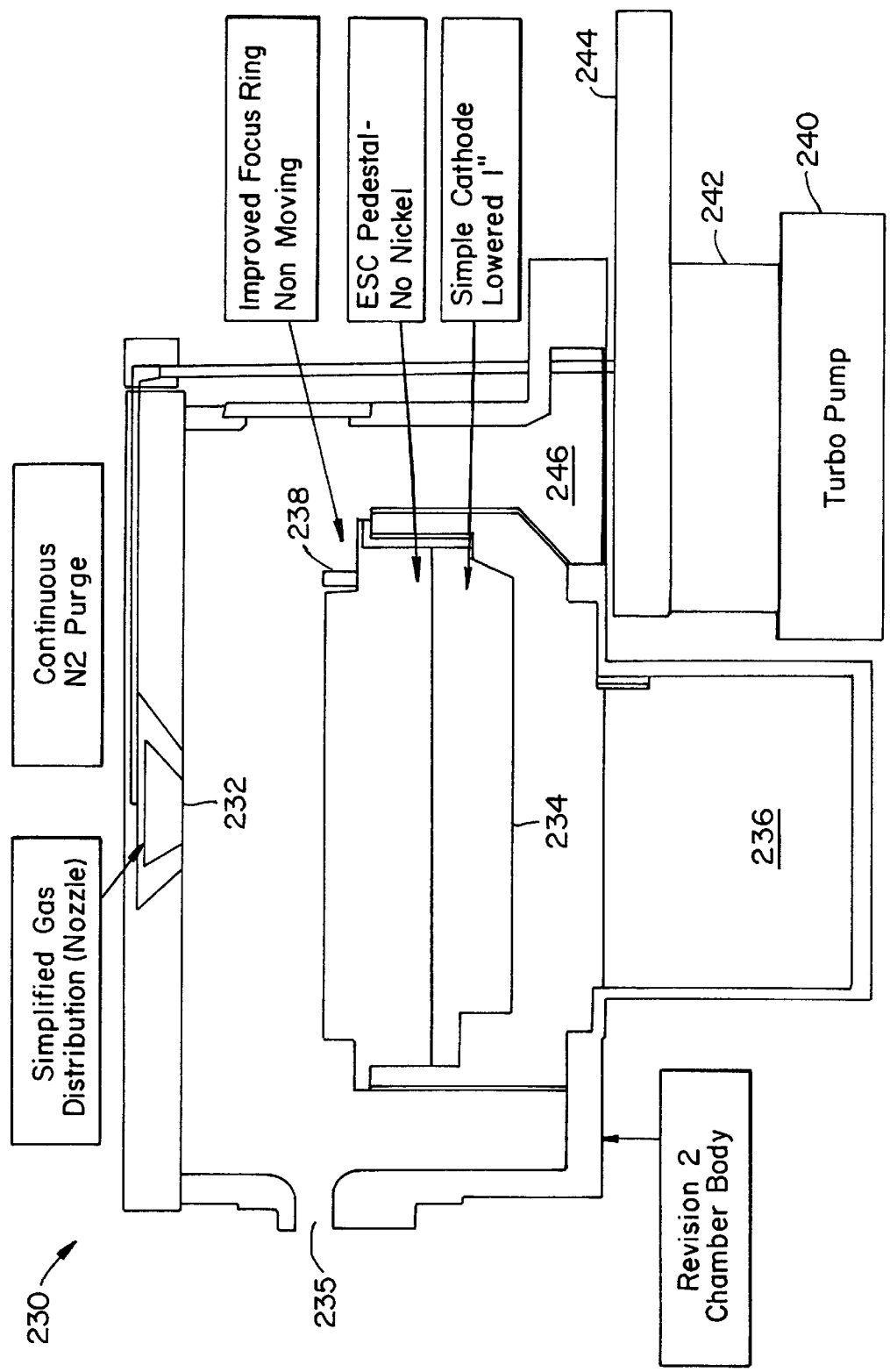
FIG. 21 is a schematic diagram of a plasma processing apparatus for etching the ARC and the underlying layers; and which is commercially available from Applied Materials, Inc. under the trade name MxP Plus Chamber.

When the ARC 18 is exposed as represented in FIGS. 10, 11 and 12, it, along with the underlying layer(s) (e.g., $WSi_x$ layer 22 and polysilicon layer 16 of FIGS. 10 and 11 and the polysilicon layer 16 of FIG. 12) are etched to develop a submicron pattern with a profile. The ARC 18 and the underlying layer(s) (i.e., the tungsten silicide layer 22 and the polysilicon layer 16) may be etched in any suitable plasma processing apparatus, such as in the reactive ion etch (RIE) plasma processing apparatus sold under the trademark AME8100 Etch™, or under the trademark Precision Etch 5000™, or under the trademark Precision Etch 8300™, all trademarks owned by Applied Materials Inc., 3050 Bowers Avenue, Santa Clara, Calif. 95054-3299. The ARC 18 and the underlying layer(s) may also be etched in a plasma processing apparatus sold under the trademark Metal Etch DPS Centura™ also owned by Applied Materials, Inc. Another suitable plasma processing apparatus for etching the ARC 18 and the underlying layer(s) includes an etch chamber 230 as shown in FIG. 21. The chamber 230 includes a nozzle 232 for input of etch gases and a cathode support 234 on which the wafer 10 to be treated is mounted. The wafer 10 is passed into the chamber by means of a slit valve 235. The cathode support 234 is connected to a source of power (not shown) and is connected to an elevator mechanism 236 for lowering the support 234 while the wafer 10 is moved into and out of the chamber. A focus ring 238 concentrates the plasma about the wafer 10. A suitable pressure is maintained in the chamber by an exhaust system including a turbo pump 240 and throttle valve 242. A gate valve 244 controls the evacuation of the chamber 230 via passage 246. Suitable chambers are available commercially from Applied Materials, Inc., such as the MxP or MxP Plus chamber. The power to the chamber 230 is generally set at 100–500 watts and 20–80 Gauss. If the power is too low, an inverse taper for the etched openings may be obtained, which is not desirable, particularly when the etched openings are to be filled in with a dielectric. The pressure during etching is generally maintained at about 20 to 25 millitorr to maintain straight sidewalls of the etched profiles. The substrate temperature may range from 60° C. to 100° C. The etchant gas flow into the chamber 230 typically varies from about 2 sccm to about 140 sccm. It is also to be understood that other reactive ion etchers may be employed, such as ECR, ICP, helicon resonance, etc.

A suitable plasma processing apparatus for etching the ARC 18 employs a plasma of an etchant gas, which is also capable of producing the previously mentioned good profiles (e.g., profiles equal to or greater than about 85 degrees, preferably equal to or greater than about 87 degrees, more preferably equal to or greater than about 88.5 degrees). The etchant gas broadly comprises a halogen-containing gas such as a halogen (e.g., fluorine, chlorine, bromine, iodine, and astatine), a fluorine-containing gas (e.g., $NF_3$, $CHF_3$, $SF_6$, $CF_4$, $C_2F_6$, etc.) and a bromine-containing gas (e.g., HBr, etc.). Preferably, the etchant gas comprises or consists of or consists essentially of a halogen gas and a fluorine-containing gas. The halogen gas is preferably $Cl_2$ and the fluorine-containing gas is preferably $NF_3$. The etchant gas more specifically preferably comprises from about 50% by volume to about 90% by volume of the halogen gas (i.e., chlorine) and from about 10% by volume to about 50% by volume of the fluorine-containing gas (i.e., $NF_3$); more preferably from about 60% by volume to about 80% by volume of the halogen gas (i.e., chlorine) and from about 20% by volume to about 40% by volume of the fluorine-containing gas (i.e., $NF_3$); most preferably from about 65% by volume to about 75% by volume of the halogen gas (i.e., chlorine) and from about 25% by volume to about 35% by volume of the fluorine-containing gas (i.e., $NF_3$).

A suitable plasma processing apparatus for etching the tungsten silicide layer 22 employs a plasma of an etchant gas, which is also capable of producing the previously mentioned profiles. The etchant gas broadly comprises a halogen (e.g., fluorine, chlorine, bromine, iodine, and astatine), a fluorine-containing gas (e.g., $NF_3$, $CHF_3$, $SF_6$, $C_2F_6$, etc.) and a bromine-containing gas (e.g., HBr, etc.). In a preferred embodiment of the invention, the etchant gas for the plasma for etching the tungsten silicide layer 22 is the same etchant gas (with the same percent by volume values for the gas constituents) that is used for etching the ARC 18. This allows for in situ etching of the ARC 18 and the tungsten silicide layer 22 without removing the wafer 10 from the plasma processing chamber. Thus, both of the etching steps are performed in situ which eliminates the need for removing the wafer 10 from the plasma processing chamber between etching of the ARC 18 and the etching of the tungsten silicide layer 22. The benefits (e.g., no processing chamber down time) for in situ etching ARC 18 and tungsten silicide layer 22 with the same etchant gas are readily discernible to those possessing ordinary skill in the art.

A suitable plasma processing apparatus for etching the polysilicon layer 16 employs a plasma of any suitable etchant gas which is capable of maintaining the good profiles that were initiated by the etching of the ARC 18 and the layer 22. The etchant gas for etching the polysilicon layer 16 broadly comprises a halogen gas and a bromine-containing gas. Preferably, the etchant gas comprises or consists of or consists essentially of a halogen gas and a bromine-containing gas. The halogen gas is preferably chlorine. The bromine-containing gas is preferably HBr.

The etchant gas more specifically preferably comprises from about 20% by volume to about 95% by volume of the halogen gas (i.e., chlorine) and from about 5% by volume to about 80% by volume of the bromine-containing gas (i.e., HBr); more preferably from about 40% by volume to about 80% by volume of the halogen gas (i.e., chlorine) and from about 20% by volume to about 60% by volume of the bromine-containing gas (i.e., HBr); most preferably from about 50% by volume to about 60% by volume of the halogen gas (i.e., chlorine) and from about 30% by volume to about 50% by volume of the bromine-containing gas (HBr). The polysilicon layer 16 may be etched in situ in the same processing chamber where the ARC 18 and the tungsten silicide layer 22 were etched. For the embodiment of the invention depicted in FIG. 3, the polysilicon layer 16 may be etched in situ in the same processing chamber where the mask layer 23 was etched.

The reactor conditions for a suitable plasma processing apparatus in etching in situ the ARC 18 and the tungsten silicide layer 22 and the polysilicon layer 16 are as follows:

| | |
|---|---|
| Pressure | 0.1~300 mTorr |
| RF Power | 100~5000 watts |
| Rotational Magnetic Field | 20~100 Gauss |
| Temperature of Wafer | 20~140° C |
| Polysilicon layer 16 Etch Rate | 200–4000 Angstroms/min |
| Tungsten Silicide Layer 22 Etch Rate | 200–4000 Angstroms/min |
| ARC 18 Etch Rate | 200~4000 Angstroms/min |

The selectivity of ARC 18 to tungsten silicide layer 22 is better than 2:1, depending on the materials employed for the ARC 18. The selectivity of tungsten silicide:polysilicon ranges from about 0.5:1 to about 2.0:1. The selectivity of polysilicon:gate oxide ranges from about 2:1 to about 200:1, more preferably about 10:1 to about 200:1.

More generally, the process parameters for etching in situ the ARC 18 and the tungsten silicide layer 22 in a suitable plasma processing apparatus fall into ranges as listed in the following Table II and based on the flow rate of etchant gas as also listed in Table II below:

TABLE II

| Process | Broad | Preferred | Optimum |
| --- | --- | --- | --- |
| Gas Flow, sccm | | | |
| Etchant Gas | 2 to 300 | 100 to 200 | 110 to 190 |
| Pressure, mT | .1 to 300 | 5 to 40 | 7 to 20 |
| 13.56 MHz | | | |
| RF Power (Watts) | 50 to 3000 | 500 to 1200 | 700 to 900 |
| Temperature (° C.) of Wafer | 20 to 150 | 30 to 90 | 40 to 80 |
| Magnetic Field Gauss | 1 to 140 | 20 to 100 | 60 to 80 |

Figure 13:
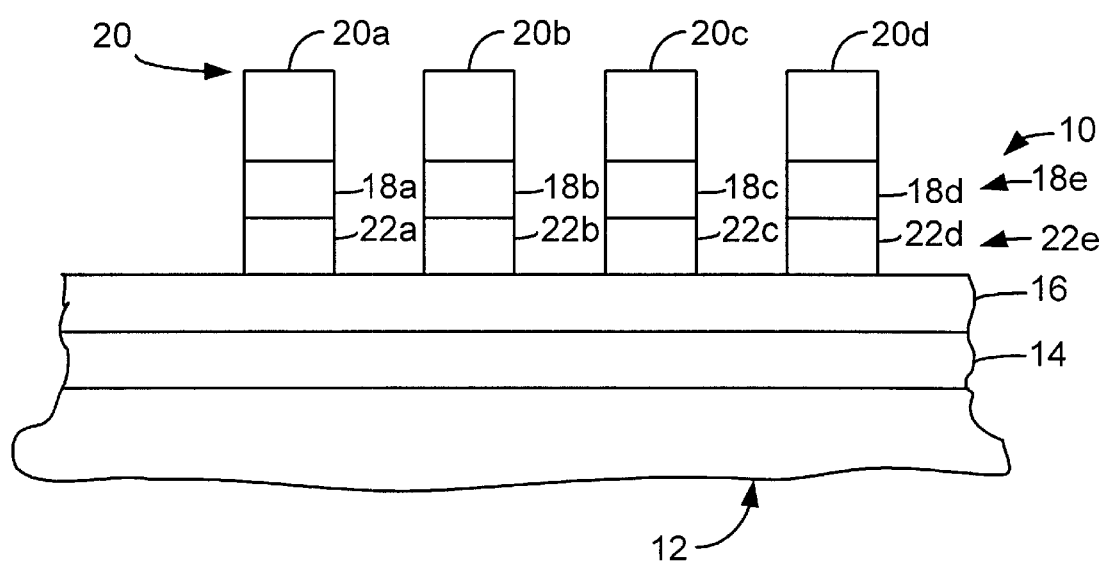
FIG. 13 is a side elevational view of the semiconductor silicon wafer of FIG. 10 after the ARC and the tungsten silicide layer have been etched down to the polysilicon layer.
Figure 14:
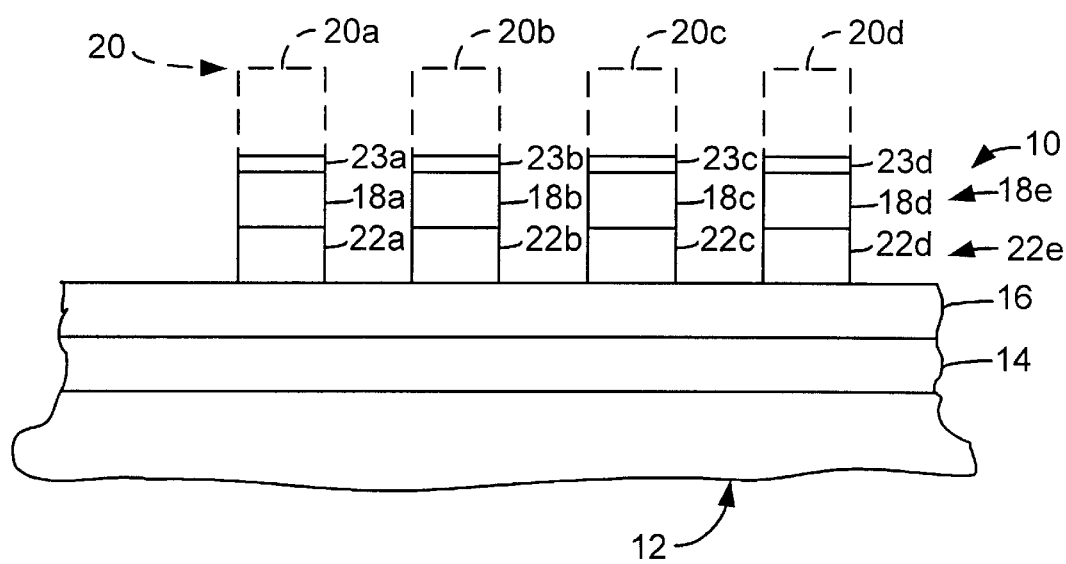
FIG. 14 is a side elevational view of the semiconductor silicon wafer of FIG. 11 after the ARC and the tungsten silicide layer have been etched down to the polysilicon layer.
Figure 15:
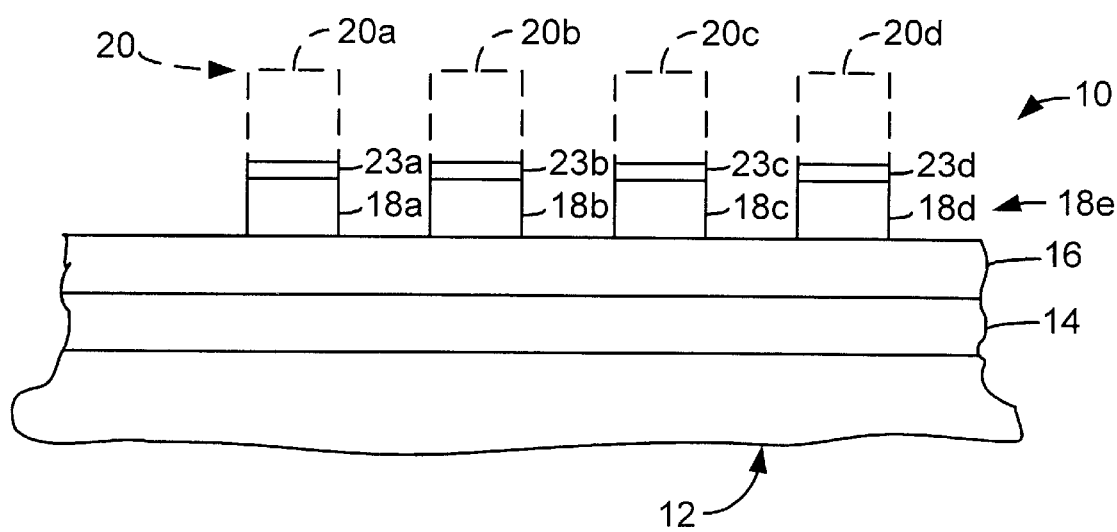
FIG. 15 is a side elevational view of the semiconductor silicon wafer of FIG. 12 after the ARC has been etched down to the polysilicon layer.

As previously indicated, a more preferred etchant gas for etching the ARC 18 and the tungsten silicide layer 22 in situ and in the same processing chamber is a mixture of chlorine and $NF_3$. If the etchant gas is a mixture of chlorine and NF (i.e., from about 50% by volume to about 90% by volume chlorine and from about 10% by volume to about 50% by volume $NF_3$), the plasma processing apparatus for etching etches the ARC 18 and the tungsten silicide layer 22 in a high density plasma of the etchant gas at a high etch rate (i.e., an etch rate higher than 1000 Å/min) and produces an etched ARC layer, generally illustrated as 18e, and an etched tungsten silicide layer, generally illustrated as 22e (as best shown in FIGS. 13 and 14). The etched tungsten silicide layer 22e comprises etched tungsten silicide members 22a, 22b, 22c and 22d. The etched ARC layer 18e includes etched ARC members 18a, 18b, 18c and 18d. The etched tungsten silicide layer 22e and the etched ARC layer 18e have an excellent profile; that is, a profile where the angle of the sidewalls with respect to a horizontal plane is equal to or greater than about 85 degrees, preferably equal to or greater than about 87°, and more preferably equal to or greater than about 88.5°. The respective imposed or stacked members (i.e., members 18a/22a and 18b/22b, etc.) are separated by a distance or space having a dimension equal to or less than about 0.3 μm. Each of the stacked members includes a dimension having a value equal to or less than about 0.6 μm, preferably equal to or less than about 0.3 μm. More preferably, each of the stacked members has a width equal to or less than about 0.6 μm, and a height equal to or less than about 0.6 μm. In the event that the wafer 10 of FIG. 3 is being processed where there is no tungsten silicide layer 22 and only the ARC 18 on top of the polysilicon layer 16, the conditions for removing the exposed ARC 18 would be the same as for removing both the ARC 18 and the tungsten silicide layer 22 (see FIGS. 13 and 14), and the resulting etched structure is seen in FIG. 15.

The high density plasma of the present invention may be defined as a plasma of the etchant gas of the present invention having an ion density greater than about $10^9/cm^3$, preferably greater than about $10^{11}/cm^3$. The source of the high density plasma may be any suitable high density source, such as electron cyclotron resonance (ECR), helicon resonance or inductively coupled plasma (ICP)-type sources. All three are in use on production equipment today. The main difference is that ECR and helicon sources employ an external magnetic field to shape and contain the plasma, while ICP sources do not.

The high density plasma for the present invention is more preferably produced or provided by inductively coupling a plasma in a decoupled plasma source etch chamber, such as that sold under the trademark DPS™ owned by Applied Materials, Inc. which decouples or separates the ion flux to the wafer 10 and the ion acceleration energy. The design of the etch chamber provides fully independent control of ion density of an enlarged process window. This is accomplished by producing plasma via an inductive source. While a cathode within the etch chamber is still biased with rf electric fields to determine the ion acceleration energy, a second rf source (i.e., an inductive source) determines the ion flux. This second rf source is not capacitive (i.e., it does not use electric fields like the cathode) since a large sheath voltage would be produced, interfering with the cathode bias and effectively coupling the ion energy and ion flux.

The inductive plasma source couples rf power through a dielectric window rather than an electrode. The power is coupled via rf magnetic fields (not electric fields) from rf current in a coil. These rf magnetic fields penetrate into the plasma and induce rf electric fields (therefore the term "inductive source") which ionize and sustain the plasma. The induced electric fields do not produce large sheath voltages like a capacitive electrode and therefore the inductive source predominantly influences ion flux. The cathode bias power plays little part in determining ion flux since most of the rf power (typically an order of magnitude less than the source power) is used in accelerating ions. The combination of an inductive plasma source and a capacitive wafer bias allows independent control of the ion flux and ion energy reaching the wafer 10 in the etch chamber, such as the DPS™ brand etch chamber.

Figure 19:
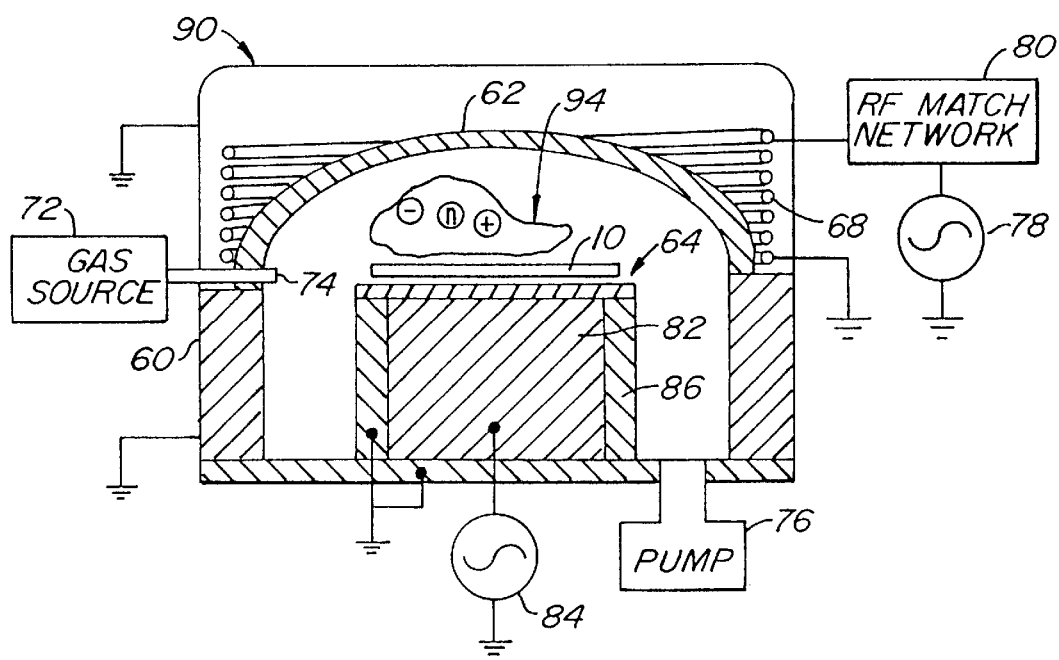
FIG. 19 is a simplified cut-away view of an inductively coupled RF plasma reactor which may be employed in etching the ARC and the tungsten silicide layer.
Figure 20:
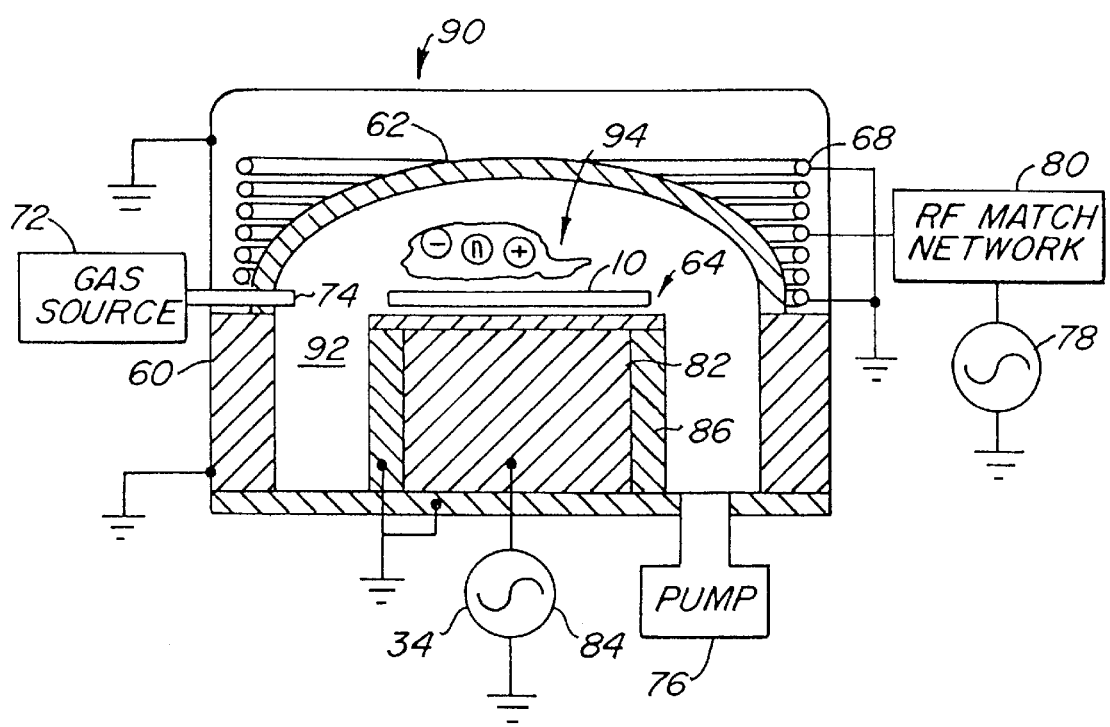
FIG. 20 is a simplified cut-away view of another inductively coupled RF plasma reactor which may be employed in etching the ARC and the tungsten silicide layer.

DPS™ brand etch chambers for producing the high density plasma of the present invention for etching the ARC 18 and the tungsten silicide layer 22 to produce, respectively, the etched ARC members 18a, 18b, 18c and 18d and the etched tungsten silicide members 22a, 22b, 22c and 22d, may be any of the DPS™ brand etch chambers of the inductively coupled plasma reactor disclosed in co-pending U.S. patent application Ser. No. 08/389,889 filed Feb. 15, 1995, entitled "RF PLASMA REACTOR WITH HYBRID CONDUCTOR AND MULTI-RADIUS DOME CEILING" and assigned to the present assignee and fully incorporated herein by reference thereto as if repeated verbatim immediately hereinafter. Referring now to FIGS. 19 and 20 for two (2) embodiments of an inductively coupled plasma reactor from U.S. Pat. No. 5,753,044 there is seen an inductively coupled RF plasma reactor generally illustrated as 90, having a reactor chamber, generally illustrated as 92, wherein a high density plasma 94 of neutral (n) particles, positive (+) particles, and negative (−) particles are found. The reactor chamber 92 has a grounded conductive cylindrical sidewall 60 and a dielectric ceiling 62. The inductively coupled RF plasma reactor 90 further comprises a wafer pedestal 64 for supporting the (semiconductor) wafer 10 in the center of the chamber 92, a cylindrical inductor coil 68 surrounding an upper portion of the chamber 92 beginning near the plane of the top of the wafer 10 or wafer pedestal 64 and extending upwardly therefrom toward the top of the chamber 92, an etching gas source 72 and gas inlet 74 for furnishing an etching gas into the interior of the chamber 92, and a pump 76 for controlling the pressure in the chamber 92. The coil inductor 68 is energized by a plasma source power supply or RF generator 78 through a conventional active RF match network 80, the top winding of the coil inductor 68 being "hot" and the bottom winding being grounded. The wafer pedestal 64 includes an interior conductive portion 82 connected to the bias RF power supply or generator 84 and an exterior grounded conductor 86 (insulated from the interior conductive portion 82). Thus, the plasma source power applied to the coil inductor 68 by the RF generator 78 and the DC bias RF power applied to the wafer pedestal 64 by generator 84 are separately controlled RF supplies. Separating the bias and source power supplies facilitates independent control of ion density and ion energy, in accordance with well-known techniques. To produce high density plasma 94 as an inductively coupled plasma, the coil inductor 68 is adjacent to the chamber 92 and is connected to the RF source power supply or the RF generator 78. The coil inductor 68 provides the RF power which ignites and sustains the high ion density of the high density plasma 94. The geometry of the coil inductor 68 can in large part determine spatial distribution of the plasma ion density of the high density plasma 94 within the reactor chamber 92.

Uniformity of the plasma density spatial distribution of the high density plasma 94 across the wafer 10 is improved (relative to conical or hemispherical ceilings) by shaping the ceiling 62 in a multi-radius dome and individually determining or adjusting each one of the multiple radii of the ceiling 62. The multiple-radius dome shape in the particular embodiment of FIG. 19 somewhat flattens the curvature of the ceiling 62 around the center portion of the ceiling 62, the peripheral portion of the ceiling 62 having a steeper curvature.

As illustrated in FIG. 20 the coil inductor 68 may be coupled to the RF power source 78, 80 in a mirror coil configuration that is known to those skilled in the art. In the mirror coil configuration of FIG. 20, the RF source 78, 80 is connected to the center winding of the coil inductor 68 while the top and bottom ends of the coil inductor 68 are both grounded. The mirror coil configuration has the advantage of reducing the maximum potential on the coil inductor 68.

The broadly preferred reactor conditions for a suitable inductively coupled RF plasma reactor, such as the inductively coupled RF plasma reactor 90 in FIGS. 19 and 20, in etching the ARC 18 and the tungsten silicide layer 22 are as follows:

| | |
|---|---|
| Pressure | 0.5 to .50 mTorr |
| RF Power to Coil Inductor | 100 to 3000 watts |
| RF Power to Wafer Pedestal | .50 to 1500 watts |
| RF Frequency in Coil Inductor | 100 K to 200 MHz |
| RF Frequency in Wafer Pedestal | 100 K to 200 MHz |
| Temperature of Wafer | 20 to 150° C. |
| Tungsten Silicide Etch Rate | 200 to 4000 Angstrom/min |
| ARC Etch Rate | 200 to 2000 Angstrom/min |
| Selectivity of ARC/WSi$_x$ | .5:1 to 5:1 |
| Selectivity of WSi$_x$/Poly | .5:1 to 2:1 |

More generally, the process parameters for etching the ARC 18 and the tungsten silicide layer 22 in a suitable inductively coupled plasma reactor, such as the inductively coupled plasma reactor 90 in FIGS. 19 and 20, fall into ranges a s listed on the basis of flow rates of the gases, including the halogen gas(es) (i.e., Cl$_2$) and the fluorine-containing gas (i.e., NF$_3$), as listed in Table III below.

TABLE III

| Process | Broad | Preferred | Optimum |
|---|---|---|---|
| Gas Flow, sccm | | | |
| Cl$_2$ | 5 to 200 | 40 to 160 | 50 to 150 |
| NF$_3$ | 2 to 100 | 20 to 60 | 25 to 55 |
| Pressure, mT | 0.5 to 50 | 5 to 15 | 7 to 10 |
| RF Power of Coil Inductor (Watts) | 100 to 3000 | 200 to 1200 | 300 to 1000 |
| RF Power of Wafer Pedestal (Watts) | 20 to 1500 | 50 to 400 | 50 to 200 |
| Temperature of Wafer (° C.) | 20 to 100 | 30 to 90 | 40 to 80 |
| Tungsten Silicide Etch Rate (Å/min) | 200 to 4000 | 200 to 1000 | 300 to 700 |
| ARC Etch Rate (Å/min) | 200 to 2000 | 200 to 1000 | 300 to 700 |
| RF Frequency of Coil Inductor | 100 K to 200 MHz | 400 K to 20 MHz | 2 to 13.5 MHz |
| RF Frequency of Wafer Pedestal | 100 K to 200 MHz | 400 K to 20 MHz | 400 K to 13.5 MHz |
| Selectivity of ARC/WSi$_x$ | .5:1 to 5:1 | .5:1 to 4:1 | 1:1 to 3:1 |
| Selectivity of WSi$_x$/Poly | .5.1 to 4:1 | .5:1 to 3:1 | 1:1 to 3:1 |

The foregoing process conditions are preferably based on flow rates of etchant gas(es) having a flow rate value ranging from about 2 to about 300 sccm, more preferably from about 100 to 200 sccm. As was previously mentioned, the etchant gas comprises, or consists of or consists essentially, of a halogen (preferably chlorine) and a fluorine-containing gas (preferably NF$_3$). The etchant gas more specifically comprises from about 50% by volume to about 90% by volume of the halogen gas (i.e., chlorine) and from about 10% by volume to about 50% by volume of the fluorine-containing gas; preferably from about 60% by volume to about 80% by volume of the halogen gas (i.e., chlorine) and from about 20% by volume to about 40% by volume of the fluorine-containing gas; more preferably from about 65% by volume to about 75% by volume of the halogen gas (i.e., chlorine) and from about 25% by volume to about 35% by volume of the fluorine-containing gas. Thus, the foregoing process conditions stated in Table III may be based on such etchant gas constituency and on such percent (%) by volume value (s).

Figure 16:
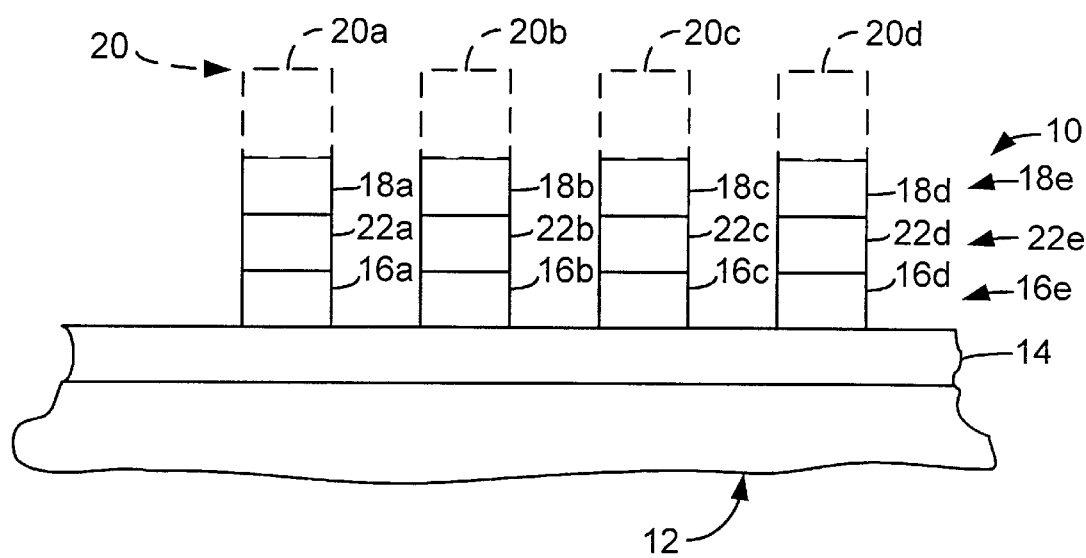
FIG. 16 is a side elevational view of the semiconductor wafer of FIG. 13 after the polysilicon layer has been etched down to the gate oxide layer.
Figure 17:
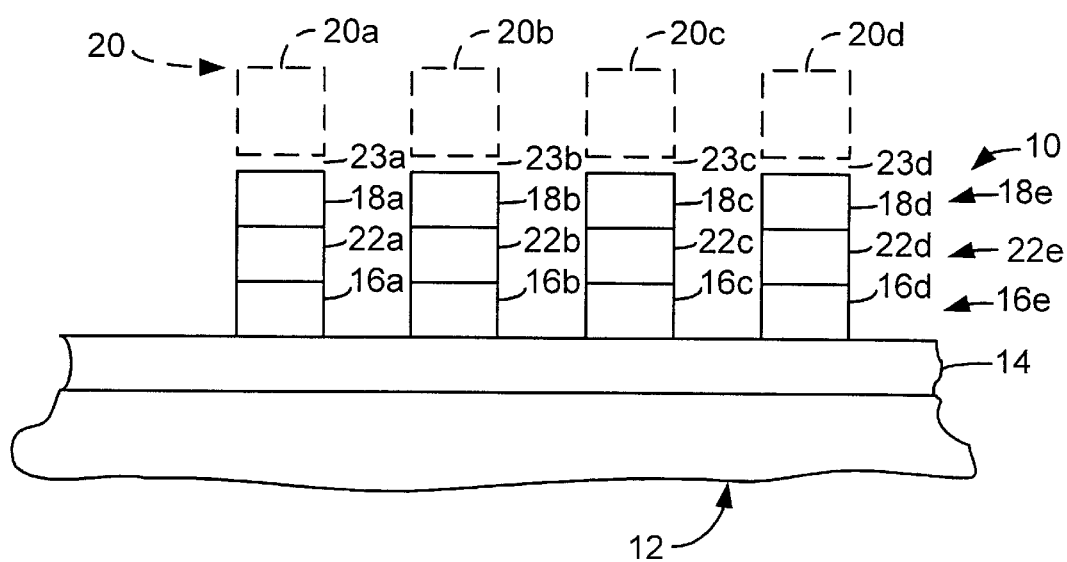
FIG. 17 is a side elevational view of the semiconductor silicon wafer of FIG. 14 after the polysilicon layer has been etched down to the gate oxide layer.
Figure 18:
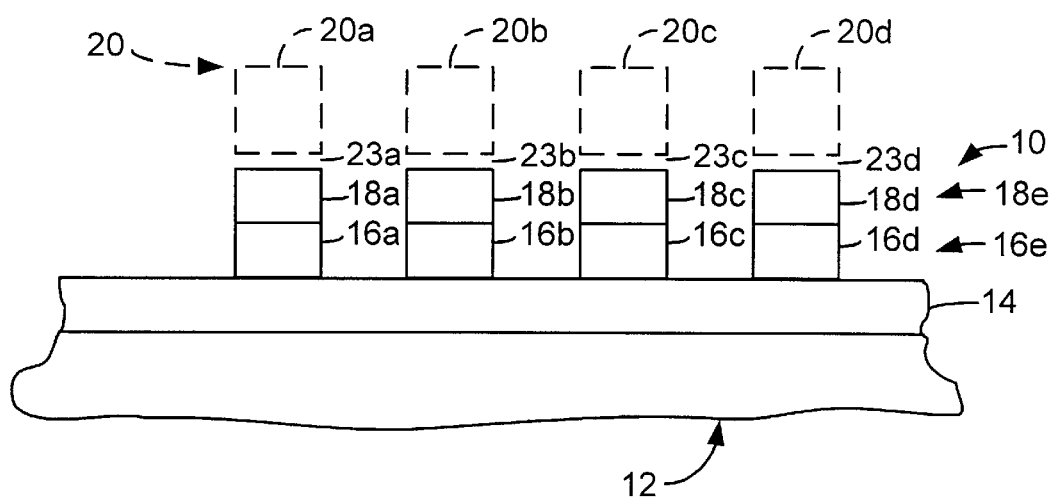
FIG. 18 is a side elevational view of the semiconductor silicon wafer of FIG. 15 after the polysilicon layer has been etched down to the gate oxide layer.

After the ARC 18 and the tungsten silicide layer 22 have been etched to produce, respectively, the etched ARC members 18a, 18b, 18c and 18d and the etched tungsten silicide members 22a, 22b, 22c and 22d, or after the ARC 18 has been etched to produce ARC members 18a, 18b, 18c and 18d for the embodiment of the invention in FIGS. 3 and 15, the polysilicon layer 16 is to be etched to produce etched polysilicon members 16a, 16b, 16c and 16d (see FIGS. 16, 17 and 18). Suitable plasma processing apparatus(es), along with preferred etchant gas(es) for etching the polysilicon layer 16 have been previously mentioned. In the event the inductively coupled RF plasma reactor 90 of FIGS. 19 and 20 is employed to etch the polysilicon layer 16, the preferred reactor conditions are as follows:

| | |
|---|---|
| Pressure | .5 to 50 mTorr |
| RF Power to Coil Inductor | 100 to 3000 watts |
| RF Power to Wafer Pedestal | 50 to 1500 watts |
| RF Frequency in Coil Inductor | 100 K to 200 MHz |
| RF Frequency in Wafer Pedestal | 100 K to 200 MHz |
| Temperature of Wafer | 20 to 100° C. |
| Polysilicon Etch Rate | 200 to 4000 Angstrom/min |
| Selectivity of Poly/Gate Oxide | 2:1 to 200:1 |

More generally, the process parameters for etching the polysilicon layer 16 in a suitable inductively coupled plasma reactor, such as the inductively coupled plasma reactor 90 in FIGS. 19 and 20, fall into ranges as listed on the basis of flow rates of the gases including the halogen gas(es) (i.e., $Cl_2$) and the bromine-containing gas (i.e., HBr), as listed in Table IV below.

TABLE IV

| Process | Broad | Preferred | Optimum |
|---|---|---|---|
| Gas Flow, sccm | | | |
| $Cl_2$ | 5 to 200 | 10 to 180 | 20 to 170 |
| HBr | 2 to 300 | 30 to 290 | 40 to 280 |
| Pressure, mT | 0.5 to 50 | 5 to 15 | 7 to 10 |
| RF Power of Coil Inductor (Watts) | 100 to 3000 | 200 to 1200 | 300 to 1000 |
| RF Power of Wafer Pedestal (Watts) | 20 to 500 | 30 to 300 | 30 to 100 |
| Temperature of Wafer (° C.) | 29 to 100 | 30 to 90 | 40 to 80 |
| Polysilicon Etch Rate (Å/min) | 200 to 4000 | 500 to 3000 | 1000 to 2000 |
| RF Frequency of Coil Inductor | 100 K to 200 MHz | 400 K to 20 MHz | 2 to 13.5 MHz |
| RF Frequency of Wafer Pedestal | 100 K to 200 MHz | 400 K to 20 MHz | 400 K to 13.5 MHz |
| Selectivity of Poly/Gate Oxide | 2:1 to 200:1 | 10:1 to 200:1 | 10:1 to 50:1 |

The foregoing process conditions are preferably based on flow rates of etchant gas(es) having a flow rate value ranging from about 2 to about 500 sccm. As was previously mentioned, the etchant gas comprises, or consists of or consists essentially, of a halogen (preferably chlorine) and a bromine-containing gas (preferably HBr). The etchant gas more specifically comprises from about 20% by volume to about 95% by volume of the halogen gas (i.e., chlorine) and from about 5% by volume to about 80% by volume of the bromine-containing gas; preferably from about 25% by volume to about 90% by volume of the halogen gas (i.e., chlorine) and from about 10% by volume to about 75% by volume of the bromine-containing gas; more preferably from about 30% by volume to about 85% by volume of the halogen gas (i.e., chlorine) and from about 15% by volume to about 70% by volume of the bromine-containing gas. Thus, the foregoing process conditions stated in Table IV may be based on such etchant gas constituency and on such percent (%) by volume value(s).

After the ARC 18 and tungsten silicide layer 22 and the polysilicon layer 16 have been etched to produce, respectively, the etched ARC members 18a, 18b, 18c and 18d and the etched tungsten silicide members 22a, 22b, 22c and 22d and the etched polysilicon members 16a, 16b, 16c and 16d, the mask layers 23a, 23b, 23c and 23d (if not completely removed during the etching process) typically remain on top of the etched tungsten ARC members 18a, 18b, 18c and 18d, all as best shown in FIGS. 14 and 15. For the embodiment of the invention illustrated in FIG. 1, the resist members 20a, 20b, 20c and 20d remain on top of the etched ARC members 18a, 18b, 18c and 18d as best shown in FIG. 13. The mask layers 23a, 23b, 23c and 23d are to be removed by any suitable means and/or in any suitable manner, such as by $CHF_3$/Ar plasma, in any of the suitable previously mentioned plasma processing apparatuses. Likewise for the embodiment of the invention depicted in FIG. 13, the resist members 20a, 20b, 20c and 20d may be removed from the etched ARC members 18a, 18b, 18c and 18d by any suitable means and/or in any suitable manner such as in an ASP chamber of a plasma processing apparatus sold under the trademark Etch MxP Centura™ to Applied Materials, Inc., employing an $O_2/N_2$ plasma.

After removal of residual mask layers 23a, 23b, 23c and 23d, or the resist members 20a, 20b, 20c and 20d for the embodiment of the invention illustrated in FIG. 13, the etched ARC/tungsten silicide/polysilicon layered structure of FIG. 16, 17 or 18 remain, with the dotted line representation of the resist 20 in FIG. 16 and the mask layer 23 in FIGS. 17 and 18 representing layers or members which have been removed.

Therefore, the present invention is embodied in a system and method for etching in situ (without having to remove the substrate from the processing chamber in which it is situated) a substrate, such as silicon, in a plasma reactor chamber. The substrate has a dielectric anti-reflective coating (DARC) containing, for example, silicon, oxygen and nitrogen. As previously indicated, the DARC layer can be deposited on the substrate by commercially available techniques and methods, such as using a plasma-enhanced chemical vapor deposition (PECVD) method as described in U.S. Pat. No. 6,156,140, filed on May 7, 1997, by Cheung et al., entitled IN SITU DEPOSITION OF A DIELECTRIC OXIDE LAYER AND ANTI-REFLECTIVE COATING, assigned to the present assignee, Applied Materials, Inc., herein incorporated by reference.

Figure 32:
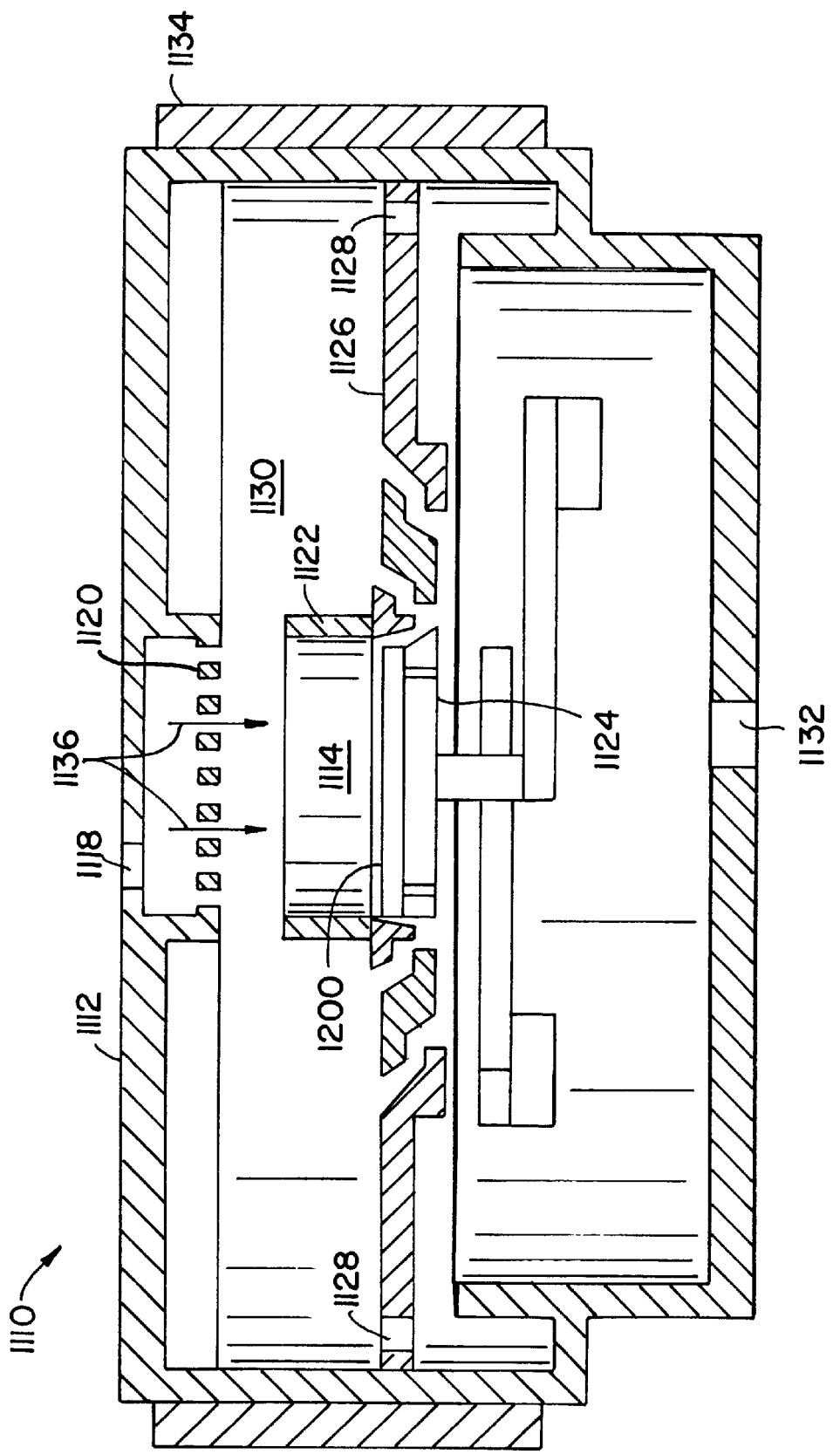
FIG. 32 is a vertical cross section of an apparatus suitable for practicing the processes of the present invention.

Referring now to FIGS. 32–44 for additional embodiments and for supplemental and/or alternative features of the present invention, there is seen in FIG. 32 a vertical cross section of an apparatus suitable for practicing the processes of the present invention. A reaction device 1110 suitable for additionally practicing the present invention comprises an etching chamber 1112 having an etch zone 1114. For typical etching (the specific etching process of the present invention will be discussed below), process gas is introduced into the etching chamber 1112 through the gas inlet 1118.

The process gas then passes through a "showerhead" diffuser plate 1120 which distributes the process gas in the etching zone 1114. A surrounding focus ring 1122 substantially maintains the generated plasma in the etching zone 1114. In operation, a substrate 1200, is placed on the cathode 1124 and a process gas (depending on the layer/layers to be etched) is introduced through the gas inlet 1118 into the etching chamber 1112. A plasma is generated from the process gas to selectively etch the layers of the substrate 1200.

A barrier or pumping plate 1126 has a plurality of exhaust holes 1128 therethrough. The plate 1126 separates the etching chamber 1112 into two zones, namely, the etching zone 1114 and a non-etching zone 1130. The exhaust holes 1128 are in fluid communication with a vacuum pump (not shown) via an exhaust port 1132 for exhausting spent process gas and volatile etch byproducts from the etching chamber 1112.

The reaction device 1110 can be magnetically enhanced. A magnetic coil 1134 can be provided around the etching chamber 1112 to magnetically enhance the plasma formed from the process gas in the etching zone 1114. A plasma of the process gas is generated in the etch zone 1114. The flow of the plasma is represented by the arrows 1136.

Figure 33:
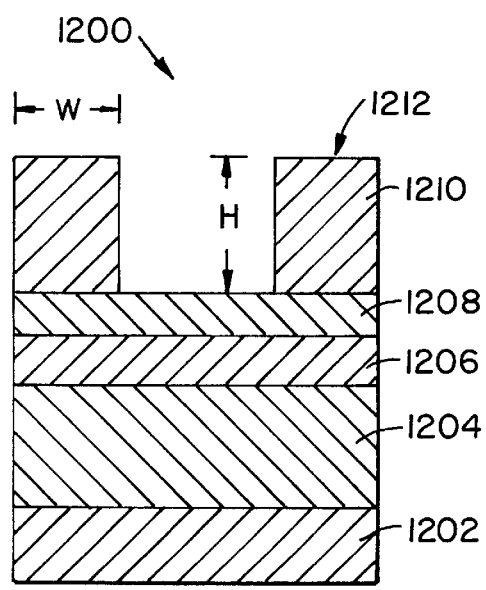
FIG. 33 is a vertical cross section of a substrate of the present invention with a dielectric anti-reflective coating.

FIG. 33 is a vertical cross section of a substrate of the present invention with a dielectric anti-reflecting coating. The substrate 1200 has a base 1202, an underlying layer 1204 above the base, an overlying layer 1206 above the underlying layer 1204, and a top DARC layer 1208 formed on the overlying layer 1206. Typically, the underlying layer 1204 is to be patterned.

The base 1202 is typically comprised of silicon, the underlying layer 1204 can be comprised of doped or undoped polysilicon, the overlying layer 1206 can be a silicide, such as a tungsten-silicide ($WSi_x$) or a dielectric material such as $SiO_2$, $Si_3N_4$, $Si_xN_y$, SiON, $Si_xO_yN_z$, or the like, and the DARC layer 1208 can be comprised of $SiO_xN_y$:H, or the like.

The DARC layer 1208 is applied to reduce reflective notching, standing waves, back-scattered light, and over etching by phase shift cancellation. Also, the DARC maximizes photoresist exposure latitude and optimizes photoresist sidewall profiles during the photolithographic process. The DARC layer 1208 typically has a thickness of about 300 Å.

A photoresist pattern 1210 is formed on the DARC layer 1208 during the photolithographic process. The photoresist pattern 1210 is substantially resistant to etching so that the portions of the substrate 1200 covered by the photoresist pattern 1210 are substantially not etched during the etching of the substrate 1200.

The photoresist pattern 1210 can comprise upstanding features 1212 typically having a width, W, of less than about 0.5 μm and a height, H, of less than about 1.0 μm. The features 1212 form a profile angle, α, which is typically from about 85° to about 87° relative to the upper surface plane of the DARC layer 1208.

Figure 34:
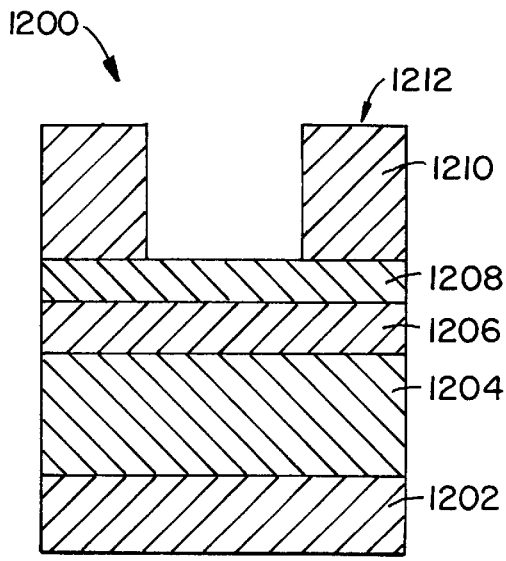
FIG. 34 is a vertical cross section of a substrate to be etched in accordance with the preferred embodiment of the present invention.
Figure 35:
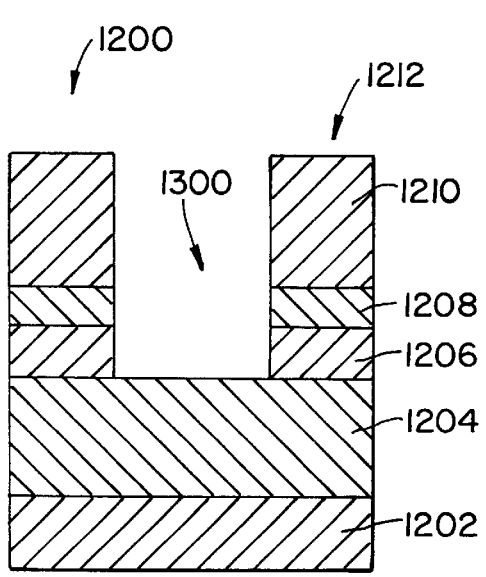
FIG. 35 is a vertical cross section of a substrate of FIG. 34 being etched by the first step in accordance with the preferred embodiment of the present invention.
Figure 36:
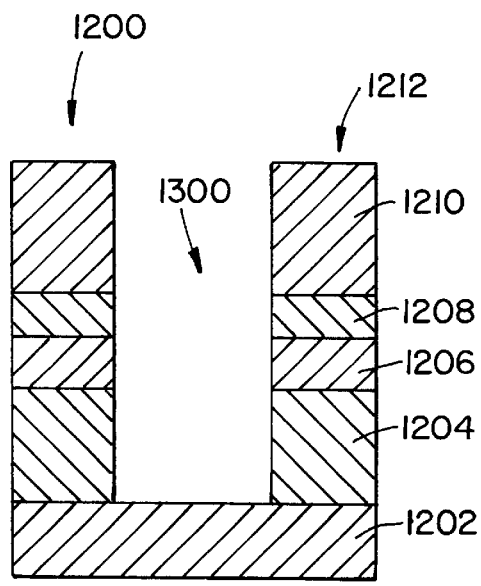
FIG. 36 is a vertical cross section of a substrate of FIG. 34 being etched by the second step in accordance with the preferred embodiment of the present invention.

Referring to FIG. 32, along with FIGS. 34, 35, and 36, for the in situ processes of the present invention, FIG. 34 is a vertical cross section of a substrate to be etched in accordance with the preferred embodiment of the present invention. The substrate 1200 of FIG. 34 to be etched can be similar to the composition of the substrate 1200 of FIG. 33. It should be noted that many different substrate compositions with a DARC layer can be etched with the system and methods of the present invention and the substrate shown in the Figures is for illustrative purposes only.

FIG. 35 is a vertical cross section of the substrate of FIG. 34 being etched by the first step in accordance with the preferred embodiment of the present invention. First, the substrate 1200 is located in the reaction device 1110. A first process gas then passes through the diffuser plate 1120 which distributes the first process gas in the etching zone 1114 by surrounding focus ring 1122. The generated plasma of the first process gas selectively etches the DARC layer 1208 and the overlying layer 1206 within a designated area 1300 defined by the photoresist 1217.

The first process gas and at least one passivating compound can be selected from the group consisting of compounds containing N, F, such as $NF_3$, and compounds containing Cl, such as $Cl_2$, and mixtures thereof. The preferred complete composition of the first process gas is $NF_3$ and $Cl_2$.

FIG. 36 is a vertical cross section of the substrate of FIG. 34 being etched by the second step in accordance with the preferred embodiment of the present invention. In the second etch step, a second process gas passes through the diffuser plate 1120 which distributes the second process gas in the etching zone 1114 and a plasma is generated. The generated plasma is maintained in the etching zone 1114 by the surrounding focus ring 1122. The generated plasma of the second process gas selectively etches the underlying layer 1204 within a designated area 1300 defined by the photoresist 1212.

The second process gas and at least one passivating compound can be selected from the group consisting of compounds containing H and Br, compounds containing H and Cl, such as $Cl_2$, and mixtures thereof. The preferred complete composition of the second process gas is HBr and $Cl_2$.

Referring to FIG. 32, along with the FIGS. 37, 38, 39, and 40, FIG. 37 is a vertical cross section of a substrate to be etched in accordance with another embodiment of the present invention. The substrate 1200 of FIG. 37 to be etched can be similar to the composition of the substrate 1200 of FIG. 35. It should be noted that many different substrate compositions with a DARC layer can be etched with the system and methods of the present invention and the substrate shown in the Figures is for illustrative purposes only.

FIG. 38 is a vertical cross section of the substrate of FIG. 37 being etched by the first step in accordance with a preferred embodiment of the present invention. First, the substrate 1200 is located in the reaction device 1110. A first process gas then passes through the diffuser plate 1120 which distributes the first process gas in the etching zone 1114 and a plasma is generated. The generated plasma is maintained in the etching zone 1114 by the surrounding focus ring 1122. The generated plasma of the first process gas selectively etches the DARC layer 1208 within a designated area 1400 defined by the photoresist 1212.

The first process gas and at least one passivating compound can be selected from the group consisting of compounds containing C, F, such as $CF_4$, and compounds containing He and O, such as $O_2$, and mixtures thereof. The preferred complete composition of the first process gas is $CF_4$ and $He:O_2$.

FIG. 39 is a vertical cross section of the substrate of FIG. 37 being etched by the second step in accordance with another embodiment of the present invention. In the second etch step, a second process gas passes through the diffuser plate 1120 which distributes the second process gas in the etching zone 1114 and a plasma is generated. The generated plasma is maintained in the etching zone 1114 by surrounding focus ring 1122. The generated plasma of the second process gas selectively etches the overlying layer 1206 within a designated area 1400 defined by the photoresist 1212.

The second process gas and at least one passivating compound can be selected from the group consisting of compounds containing S, F, such as $SF_6$, and compounds containing H and Br, and mixtures thereof. The preferred complete composition of the second process gas is $SF_6+HBr$.

FIG. 40 is a vertical cross section of the substrate of FIG. 37 being etched by the third step in accordance with the preferred embodiment of the present invention. In the third etch step, a third process gas passes through the diffuser plate 1120 which distributes the second process gas in the etching zone 1114 and a plasma is generated. The generated plasma is maintained in the etching zone 1114 by the surrounding focus ring 1122. The generated plasma of the third process gas selectively etches the underlying layer 1204 within a designated area 1400 defined by the photoresist 1212.

The third process gas and at least one passivating compound can be selected from the group consisting of compounds containing H and Br and compounds containing H and Cl, such as $Cl_2$, and mixtures thereof. The preferred complete composition of the second process gas is HBr and $Cl_2$.

Various diluent gases, such as He, other inert gases and CO, can also be added to each of the process gases.

The composition of the process gases can be varied by adjusting the molar ratios of the compounds. For example, a typical molar ratio of HBr to the $Cl_2$ in the Cl-containing gas is about 2:1. The molar ratio of HBr to $Cl_2$ in the Cl-containing gas can be from about 2:1 to about 5:1. Other molar retios may be used for different process gas compositions. A typical flow rate of the process gases is about 200 sccm/min.

The process gas preferably comprises an effective amount of the passivating compound to produce sidewall passivation on the newly exposed etched coating sidewall surface, so as to achieve substantially anisotropic etching of the organic anti-reflective coating.

Throughout the foregoing in situ processes, the substrate 1200 remains in the processing chamber 1112. Accordingly, the need to remove the substrate 1200 from the processing chamber 1112 between etching of different layers, for chamber 1112 cleanings and the like, is eliminated. Hence, throughput is improved while downtime and contamination, are reduced, among other benefits. In addition, the in situ processes of the present invention allow accurate control over the etch rate of the layers.

The plasma of each respective process gas or mixture of gases is generated for etching respective selected layers. The power used to generate the plasma of each respective process gas is generally from about 100 watts to about 1000 watts, and is typically about 200 watts for a silicon wafer size of 200 mm. The plasma of each respective process gas can optionally be enhanced by a method such as electron cyclotron resonance, magnetically enhanced reactors and inductively coupled plasma. Preferably, a magnetically enhanced ion reactor is used. The magnetic field in the reaction device 1110 induced by the magnetic coil 1134 must be sufficiently strong to increase the density of the ions formed in the plasma, but below a level that causes charge-up damage. The magnetic field on the surface of the substrate 1200 is preferably from about 10 gauss to about 80 gauss, and is more preferably about 40 gauss). The pressure in the etching chamber 1112 is preferably maintained at about 15 mTorr to about 200 mTorr, and more preferably at about 15 mTorr to about 20 mTorr. Lower pressures provide more uniform etching, but lower etch rates. The cathode 1124 is maintained at a suitable temperature to prevent volatilization of the passivating deposit that forms during etching. The cathode 1124 temperature is preferably from about −15° C. to about 60° C., and more preferably from about 0° to about 50° C.

Figure 41:
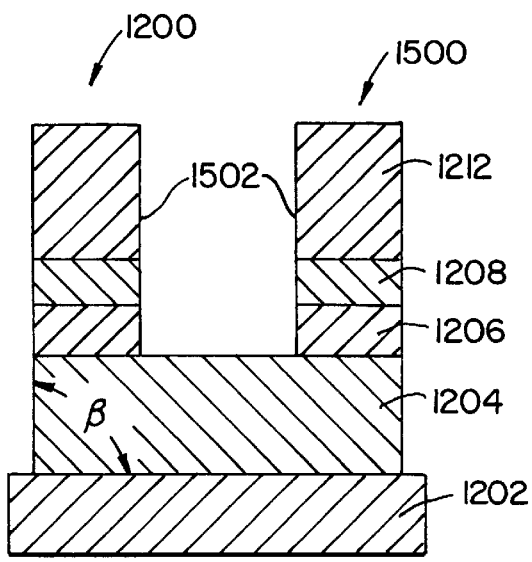
FIG. 41 is a vertical cross section of a substrate in situ etched in accordance with the present invention.

Referring now to FIG. 41 for the etch results, there is seen in FIG. 41 a vertical cross section of a substrate in situ etched in accordance with the present invention. Protected portions of the processed substrate 1200 and DARC layer 1208 form features 1500. The features 1500 comprise side walls 1502 having a trench profile angle β relative to the substrate 1200. This profile angle is preferably at least about 85°, and more preferably from about 85° to about 90°.

The processes according to the present invention eliminate microloading and minimize the loss of critical dimensions of the features to enhance subsequent etching performance of the substrate 1200. The most important critical dimension is the width of the features, W, which ideally should be identical to the width of the photoresist.

The process according to the invention achieves an etch rate of the DARC layer 1208 preferably greater than about 700 Å/min, and more preferably greater than about 800 Å/min. Also, the process gases of the present invention preferably produce a selectivity of the DARC layer 1200 to the photoresist pattern of at least about 3 (3:1). Typical resist loss with the etch processes of the present invention is significantly lower than resist loss for conventional organic ARC etch processes. For examples etch resist loss with the etch processes of the present invention is approximately 120 Å, as opposed to 1400 Å for conventional organic ARC etch processes.

The invention will be illustrated by the following examples, set forth by way of illustration only and not by way of any limitation. All parameters such as concentrations, mixing proportions, temperatures, pressure, rates, compounds, etc., submitted in this example are not to be construed to unduly limit the scope of the invention.

EXAMPLES

The following Examples (i.e., Working Examples I, II and III) demonstrate the efficacy of the present invention. The examples were conducted using a polysilicon decoupled plasma source (Poly DPS) chamber mounted on a Centura platform, available from Applied Materials, Inc., Santa Clara, Calif. It should be noted that an MxP magnetically enhanced reactive ion reactor and, in particular, a "Precision 5000" system also available from Applied Materials Inc., Santa Clara, Calif., having an 8 in. MxP poly chamber could also be used.

Figure 42:
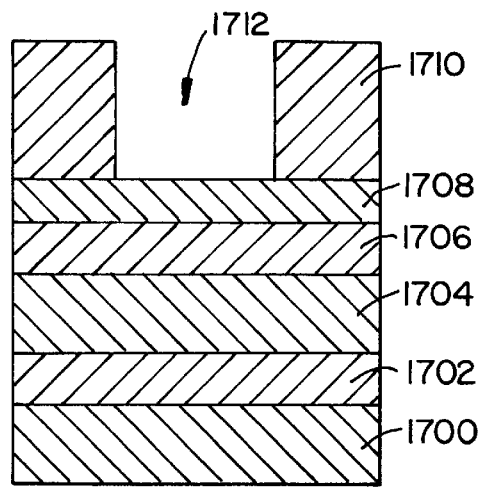
FIG. 42 is a schematic view in vertical cross section of a working example of an in situ poly undoped gate etch of a substrate having a dielectric anti-reflective coating in accordance with the present invention.

FIG. 42 is a schematic view in vertical cross section of Working Example I of an in situ poly undoped gate etch of a substrate having a dielectric anti-reflective coating in accordance with the present invention. The wafer in Working Example I was a silicon wafer 1700 having a diameter of 200 mm (8 in.), with a 300 Å $G_{OX}$ underlying layer 1702, a 200 Å undoped polysilicon layer 1704, a 300 Å SiON dielectric layer 1706, and a 100 Å TEOS cap oxide layer 1708. A photoresist pattern 1710 was formed on the TEOS cap oxide layer 1708. The photoresist pattern was preferably a DUV resist with a thickness (or feature height) of about 1.0 $\mu$m. The feature width was nominally about 0.5 $\mu$m and the width area 1712 defined by the photoresist pattern 1710 was about 0.5 $\mu$m.

Figure 43:
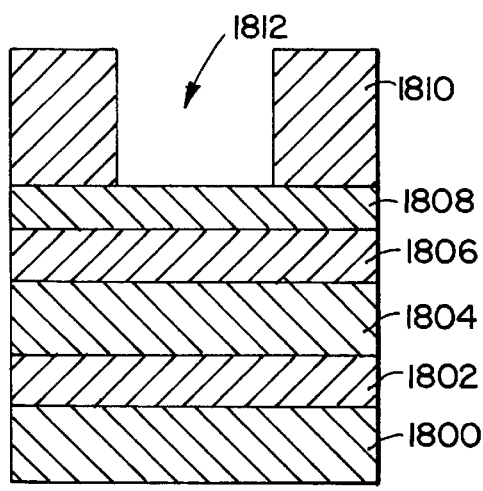
FIG. 43 is a schematic view in vertical cross section of a working example of an in situ poly gate etch of a substrate having a dielectric anti-reflective coating in accordance with the present invention.

FIG. 43 is a schematic view in vertical cross section of Working Example II of an in situ poly etch of a substrate having a dielectric anti-reflective coating in accordance with the present invention. The wafer in Working Example II was a silicon wafer 1800 having a diameter of 200 mm (8 in.), with an 80 Å $G_{OX}$ with underlying layer 1802, a 2500 Å doped polysilicon layer 1804, a 300 Å SiON dielectric layer 1806, and a 100 Å TEOS cap oxide layer 1808. A photoresist pattern 1810 was formed on the TEOS cap oxide layer 1808. The photoresist pattern 1810 was preferably a DUV resist with a thickness (or feature height) of about 1.0 $\mu$m. The feature width was nominally about 0.5 $\mu$m and the width area 1812 defined by the photoresist pattern 1810 was about 1.2 $\mu$m.

Figure 44:
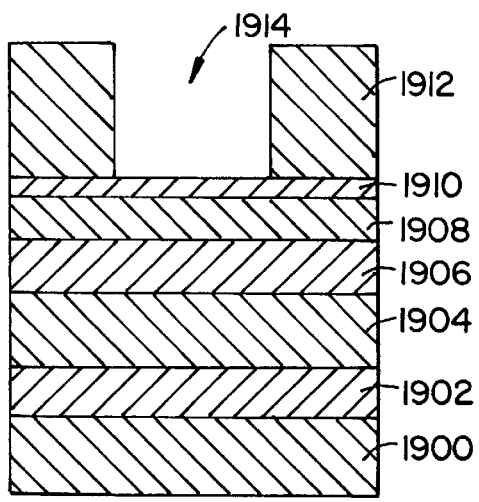
FIG. 44 is a schematic view in vertical cross section of a working example of an in situ polycide gate etch of a substrate having a dielectric anti-reflective coating in accordance with the present invention.

FIG. 44 is a schematic view in vertical cross section of Working Example III of an in situ polycide gate etch of a substrate having a dielectric anti-reflective coating in accordance with the present invention. The wafer in Working Example III was a silicon wafer 1900 having a diameter of 200 mm (8 in.), with a 90 Å $G_{OX}$ underlying layer 1902, a 1500 Å doped polysilicon layer 1904, a 1000 Å tungsten silicide layer (WSI$_x$) 1906, a 300 Å SiON dielectric layer 1908, and a 100 Å TEOS cap oxide layer 1910. A photoresist pattern 1912 was formed on the TEOS cap oxide layer 1910. The photoresist pattern was preferably a DUV resist with a thickness (or feature height) of about 1.0 $\mu$m. The feature width was nominally about 0.35 $\mu$m and the width area 1914 defined by the photoresist pattern 1912 was about 0.4 $\mu$m.

WORKING EXAMPLES I. II AND III

Working Example I (Poly Gate Etch—Undoped):

DARC Open: 75CF$_4$/5He—O$_2$/4 mT/250 Ws/25 Wb/Endpoint+20%/50° C.

Poly ME: 30Cl$_2$/120HBr/13He—O$_2$/5 mT/475 Ws/75 Wb/EP

Poly OE: 16OHBr/10He—O$_2$/50 mT/750 Ws/100 Wb/30 s

RESULTS: Vertical Poly profile, no microloading $G_{OX}$ loss=<20 Å (post-dip)

Working Example II (Poly Gate Etch—Doped):

DARC Open: 75CF$_4$/5He—O$_2$/4 mT/250 Ws/25 Wb/Endpoint+20%/50° C.

Poly ME: 160Cl$_2$/120HBr/10He—O$_2$/6 mT/600 Ws/100 Wb/EP

Poly OE: 160HBr/10He—O$_2$/50 mT/750 Ws/100 Wb/30 s

RESULTS: Vertical Poly profile, no microloading

Remaining $G_{OX}$=80 Å (Pre), 66 Å (post-dip)

Working Example III (Poly Gate Etch—Silicide on top of Poly):

DARC Open: 75CF$_4$/5He—O$_2$/4 mT/250 Ws/25 Wb/Endpoint+20%/50° C.

WSi$_x$: 130Cl$_2$/5He—O$_2$/8 mT/600 Ws/130 Wb/EP+30%

Poly ME: 30Cl$_2$/120HBr/10He—O$_2$/8 mT/600 Ws/100 Wb/Endpoint

Poly OE: 160HBr/10He—O$_2$/50 mT/750 Ws/100 Wb/30 s

RESULTS: Good profiles, very little microloading

Remaining $G_{OX}$=92 Å (Pre), 76 Å (post-dip)

The process conditions used for all three Working Examples I, II, and III are set forth TABLE V below. The etch selectivities are set forth in TABLE VI below, and some results are set forth in TABLE VII below. It should be noted that the Working Examples I, II and III are given for illustrative purpose only.

TABLE V

PROCESS CONDITIONS

| | DARC Etch | | | Main Etch | | | Over Etch | | |
|---|---|---|---|---|---|---|---|---|---|
| | | | | | | Ex. III | | | |
| | Ex. I | Ex. II | Ex. III | Ex. I | Ex. II | (Wsi/Poly) | Ex. I | Ex. II | Ex. III |
| Time (sec) | 32 | 33 | 33 | 60 | 57 | 32/52 | 30 | 30 | 30 |
| Power (Watts) | 250 | 250 | 250 | 475 | 600 | 600/600 | 750 | 750 | 750 |
| Bias (W) | 25 | 25 | 25 | 75 | 100 | 130/100 | 100 | 100 | 100 |
| CF$_4$ Etch Gas (sccm) | 75 | 75 | 75 | — | — | — | — | — | — |
| HBr Gases (sccm) | — | — | — | 120 | 120 | 0/120 | 160 | 160 | 160 |
| Cl$_2$ Gases (sccm) | — | — | — | 30 | 60 | 130/30 | — | — | — |
| Cathode Temperature (° C.) | 50 | 50 | 50 | 50 | 50 | 50 | 50 | 50 | 50 |

TABLE V-continued

PROCESS CONDITIONS

|  | DARC Etch | | | Main Etch | | | Over Etch | | |
|---|---|---|---|---|---|---|---|---|---|
|  | | | | Ex. I | Ex. II | Ex. III (Wsi/Poly) | | | |
|  | Ex. I | Ex. II | Ex. III | Ex. I | Ex. II | (Wsi/Poly) | Ex. I | Ex. II | Ex. III |
| $HeO_2$ (sccm) | 5 | 5 | 5 | 13 | 10 | 5/10 | 10 | 10 | 10 |
| Pressure (mT) | 4 | 4 | 4 | 4 | 4 | 8/4 | 50 | 50 | 50 |

*Photoresist Profile Angle = 87–88°

TABLE VI

ETCH SELECTIVITIES

|  | Etch Rate of DARC | Etch Selectivity of DARC to polysilicon/$WSI_x$ | Resist:DARC |
|---|---|---|---|
| Working Example I | 780 Å/min | 1:3 | 1:3 |
| Working Example II | 780 Å/min | 1:3 | 1:3 |
| Working Example III | 780 Å/min | 1:3.5/1:3 | 1:3 |

TABLE VII

RESULTS

|  | Dense | | | Iso | | |
|---|---|---|---|---|---|---|
|  | Working Ex. I | Working Ex. II | Working Ex. III | Working Ex. I | Working Ex. II | Working Ex. III |
| Critical Dimension | bias = .012 μm | bias = .009 μm | bias = .003 μm | bias − .011 μm | bias − .002 μm | bias − .007 μm |
| Profile Angle | 87–88° | 87–88° | 87–88° | 87–88° | 87–88° | 87–88° |
| Shoulder Loss | NONE | NONE | NONE | NONE | NONE | NONE |
| Photoresist Type | DUV | DUV | DUV | DUV | DUV | DUV |
| Gate Oxide | Good Integrity | Good | Good | Good | Good | Good |

*Endpoint detection was used for termination of the main etch at a wavelength of 312.5 nm.

The results of the above Working Examples I, II and III demonstrate that a process according to the invention provides a high degree of anisotropic etching, substantially no undercutting or notching, a high selectivity of the DARC layer to polysilicon, and very low critical dimension loss.

EXAMPLE IV

Dielectric Anti-Reflective Coating Deposition

Figure 22:
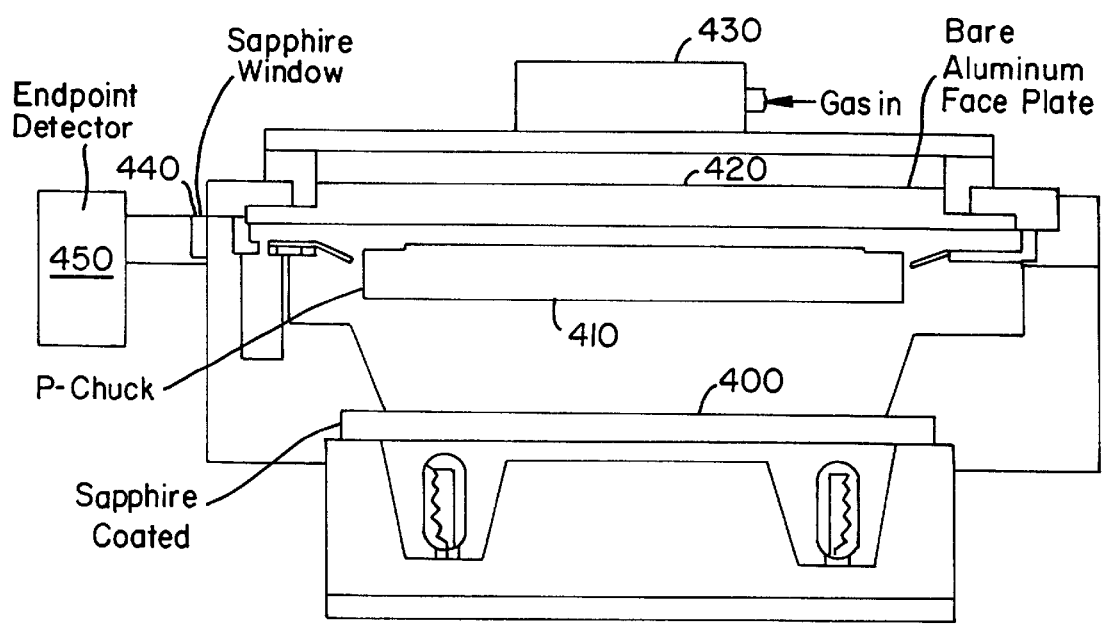
FIG. 22 is a schematic view of a single-wafer reactor which is available from Applied Materials for depositing a dielectric ARC on a desired layer.

The dielectric ARC for the experimental studies was deposited in an Applied Materials™ brand single-wafer PECVD reactor, mounted on a Centura™ brand platform. A schematic of the single-wafer reactor is presented in FIG. 22 where there is seen a sapphire coated platform 400, a pedestal chuck 410 for supporting a wafer, a face plate 420 for distributing gas, a gas box 430 for receiving gas, a sapphire window 440, and an endpoint detector 450. Optical properties and thickness were measured with an N&K Technologies Analyzer. All optical measurements were made at the deep-UV 248 nm wavelength. Film thickness uniformity was measured with a Tencor Prometrix SM300.

Deep-UV resist APEX-E 2408 was applied, softbaked at 105° C. for 60 seconds, and post-exposure baked at 92° C. for 90 seconds on wafers containing blanket $WSi_x$ polysilicon films. All of the films were patterned by an ASM 5500 deep-UV stepper. The wafers with the patterned films contained resist thicknesses ranging from 8750 to 9400 Å, and were exposed at 18 mj, 20 mj, and 22 mj. The wafers with the polysilicon films contained resist thicknesses ranging from 8400–9400 Å, and were exposed at 12 mj, 14 mj, and 18 mj. The critical dimensions were determined using an Opal in-line CD scanning electron microscope.

Capping Layer Deposition

A "PROLITH" computer stimulation and experimentation were employed for the experimental studies to determine optimum properties of a capping layer on the DARC to reduce the amount of "resist footing". The experiments were conducted in two stages. The first condition was a 100 Å oxide cap in situ deposited over DARC film to test the effectiveness against "resist footing". The second condition used a thicker oxide film, on an order of 900 Å.

Dry Etching

The in situ etching of DARC and underlayers for the experimental studies were performed in an Applied Materials™ brand MxP poly etcher. Two approaches were used to achieve an integrated etch. In the first approach, a $CF_4$-based chemistry was used to etch the DARC layer. The endpoint of the DARC layer was monitored using the 3865 Å line for a C-N emission. The silicide gate structure was then etched with a $SF_6$/HBr plasma for the tungsten silicide layer, followed by a subsequent etch step of $Cl_2$/HBr for the polysilicon film, stopping on the gate oxide. In an alternative approach, $NF_3$/$Cl_2$ chemistry was used to etch the DARC and $WSi_x$ simultaneously, and $Cl_2$/HBR chemistry was used for the polysilicon etch.

RESULTS AND DISCUSSION

Dielectric Anti-Reflective Coating Layer

The DARC film properties of n and k values were optimized for deep-UV $WSi_x$ and polysilicon applications. The optimal film properties were: n=2.14, k=0.54, for a thickness of 300 Å. Twenty-four 150 mm bare silicon wafers were deposited with the DARC film. Additionally, twenty-five 150 mm wafers with tungsten-silicide film were deposited with 300 Å of DARC film with three different k values. These splits were used to investigate the lithographic performance as a function of the extinction coefficient and are presented in the following Table VIII:

TABLE VIII

FILM SPLITS FOR PHOTOLIOGRAPHY EVALUATION

| Slot # | | Thickness (Å) | Reflectance (% on bare - Si) | n (@ 248 nm) | k (@ 248 nm) |
|---|---|---|---|---|---|
| 1–9 | Centre process | 305 | 8% | 2.15 | 0.54 |
| 10–17 | −k | 300 | 9% | 2.15 | 0.41 |
| 18–25 | +k | 300 | 10% | 2.17 | 0.63 |

Superior results were observed when the DARC film was deposited with $WSi_x$. As shown in the following Table IX, the CD variation for varying resist thickness is 0.01 μm with DARC and 0.10 μm without DARC at a CD=0.35 μm:

TABLE IX

CD and CD Variations on $WSi_K$ Substrates as a Function of DARC Optical Parameters and Exposure Dose (Resist Thickness Range from 8750 to 9400 Å)

| n, k values (@ 248 nm) | 18 mj exposure CD variation | 20 mj exposure CD variation | 22 mj exposure CD variation |
|---|---|---|---|
| No DARC | 0.41 μm | 0.37 μm | 0.31 μm |
| | 0.10 μm | 0.09 μm | 0.10 μm |
| k = 0.52 | 0.38 μm | 0.36 μm | 0.34 μm |
| n = 2.15 | 0.01 μm | 0.01 μm | 0.01 μm |
| k = 0.41 | 0.38 μm | 0.36 μm | 0.34 μm |
| n = 2.15 | 0.01 μm | 0.01 μm | 0.01 μm |
| k = 0.63 | 0.38 μm | 0.36 μm | 0.34 μm |
| n = 2.17 | 0.01 μm | 0.01 μm | 0.01 μm |

Figure 23:
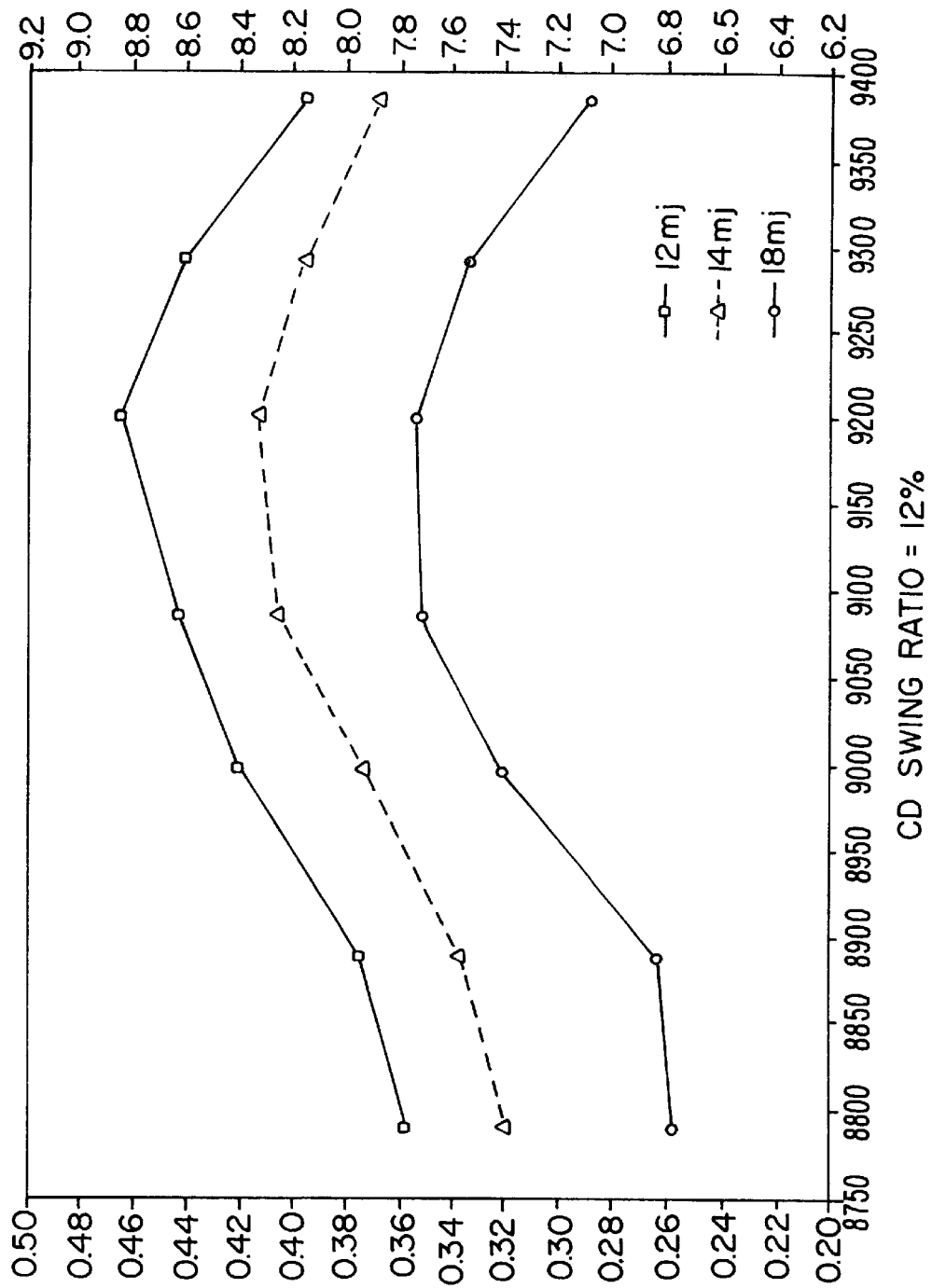
FIG. 23 discloses an experimental swing curve for deep-UV applications on tungsten silicide without employing an ARC layer.
Figure 24:
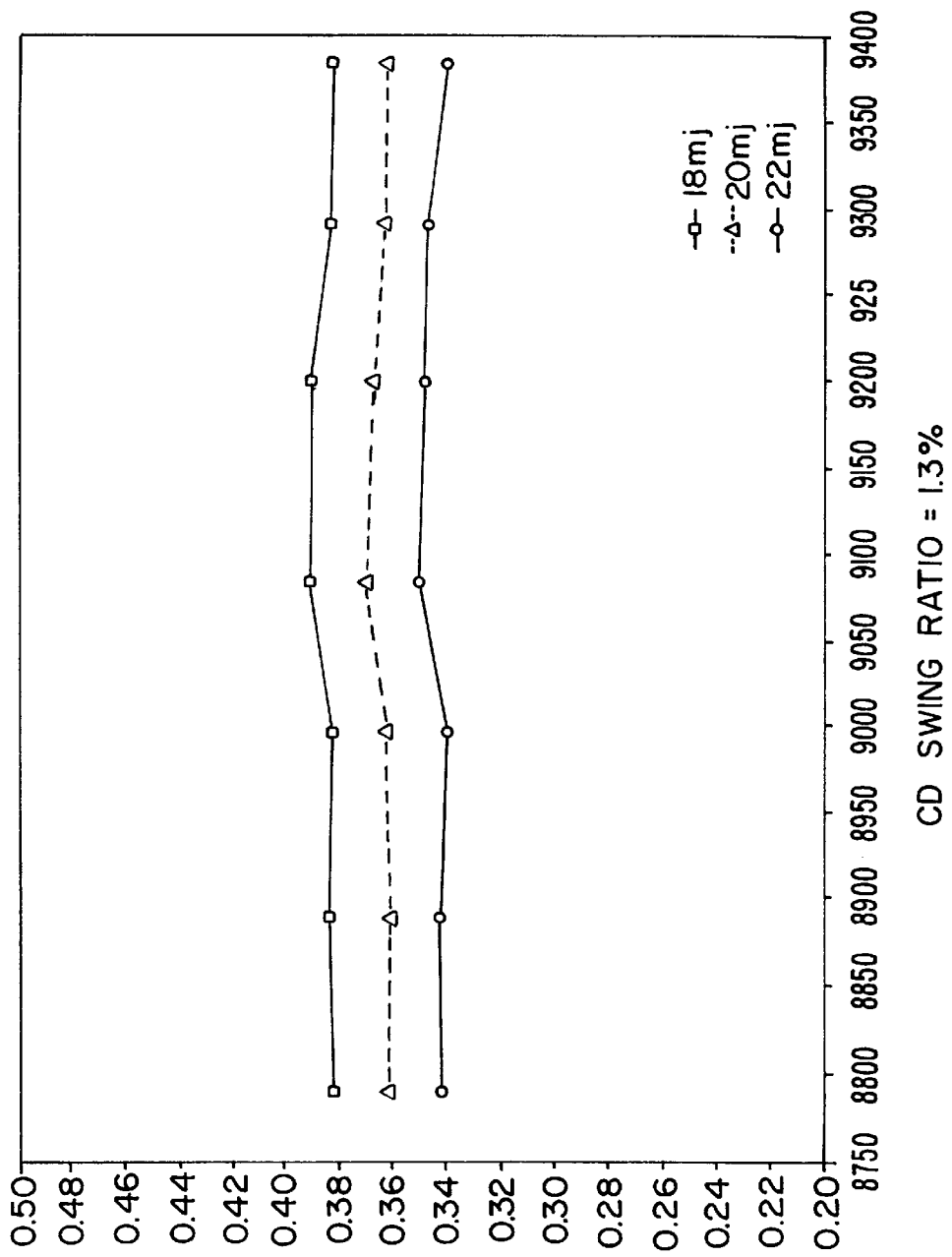
FIG. 24 is an experimental swing curve with a layer of dielectric anti-reflective coating employed.
Figure 25:
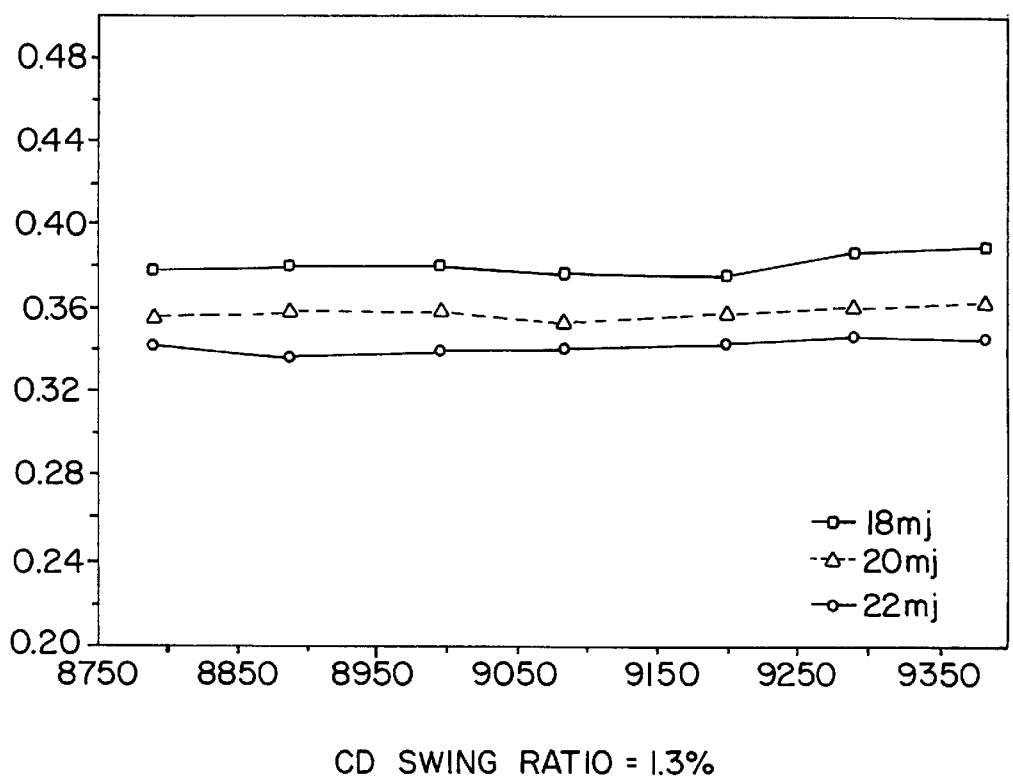
FIG. 25 is an experimental swing curve with a DARC layer having k equalling 0.41.
Figure 26:
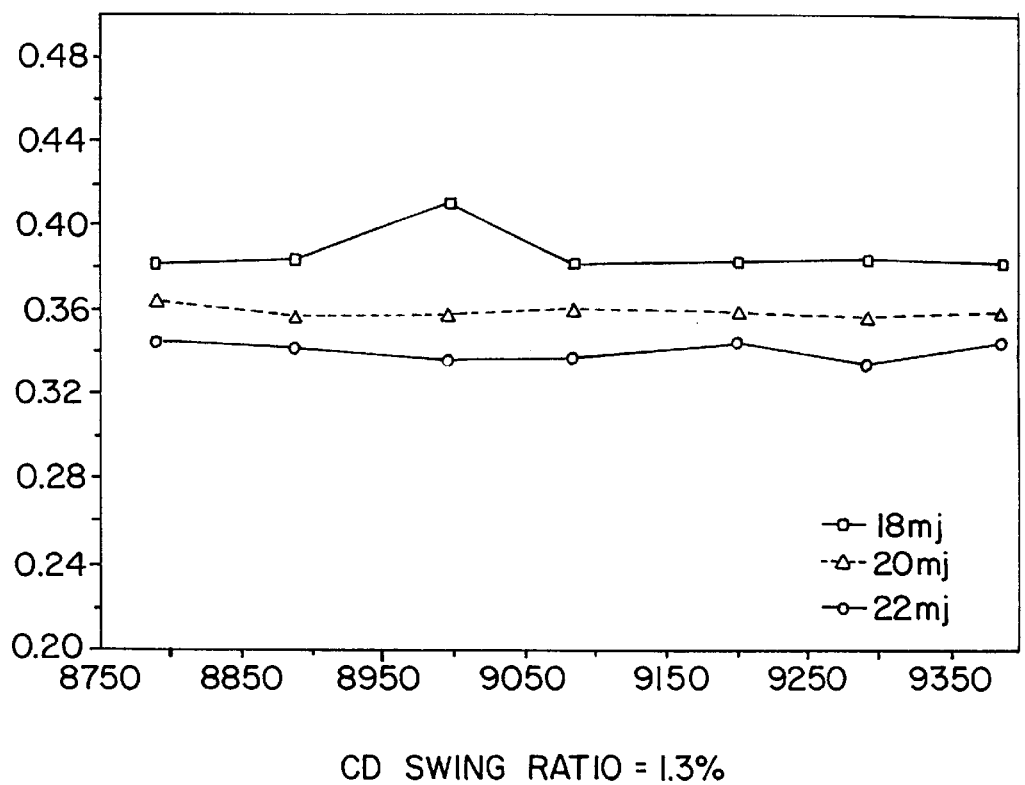
FIG. 26 is an experimental swing curve with a DARC layer with k equalling 0.63.

FIG. 23 shows the actual photoresist swing curve without a DARC layer. FIG. 24 includes the swing ratio when an optimized DARC film is employed (n=2.15, k=0.54, t=300 Å). The swing ratio is decreased from 15% to 1.5% swing. This tenfold improvement was not observed when the extinction coefficient was varied ±0.1 (roughly ±20%) while holding the refractive index constant. FIGS. 25 and 26 show the swing ratios for k=0.41 and k=0.63, respectively. The swing ratio shows that as the k-value increases from 0.41 to 0.63 with the n-value and thickness fixed, the CD and CD swing do change.

The experiment with DARC deposited on $WSi_x$ shows that the SiON successfully reduces CD variation down to 0.01 μ compared to 0.10 μm on blanket $WSi_x$ wafers at resist thickness ranging from 8750–9400 Å. The smaller variation in dose-to-clear energies further reinforces that the DARC SiON film is successfully reducing interference effects as the resist thickness varies. Equally important is that as the k-value shifts from the center process, the CD and CD swing remains constant. This suggests that the process window for photolithography is sufficiently large to accommodate ±0.1 in k-value variation. This result strongly supports the fact that the DARC SiON film can successfully reduce interference effects to control CD uniformity. Although the experimental data was generated with $WSi_x$ substrates, the results on polysilicon were observed to be identical. The photolithography data illustrate that the DARC SiON film substantially improves CD control, reduces CD variation and can be attributed to decreases in standing wave and interference effects during exposure.

Oxide Capping Layer

Figure 27:
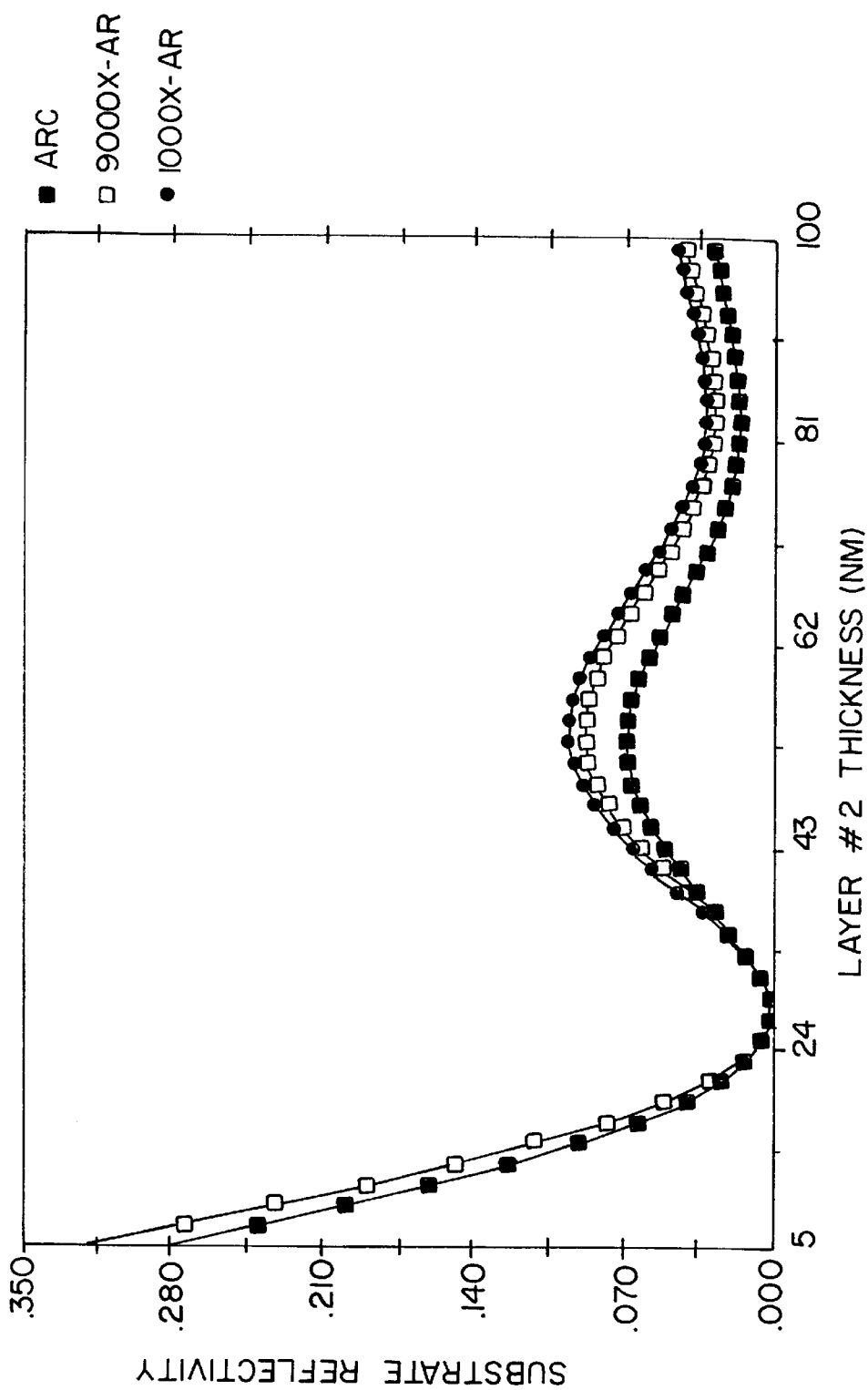
FIG. 27 is a graph illustrating the simulated reflectivity versus thickness for an optimized DARC layer deposited on a tungsten silicide layer.

FIG. 27 shows the simulated reflectivity versus thickness for an optimized DARC layer deposited on $WSi_x$. The minimum reflectivity from the resist/DARC interface occurs at DARC thickness of approximately 300 Å. An optimized DARC layer with reflectivities <3% will achieve swing ratios of <5%. This is in good agreement with all general lithography experimental results and theories.

An oxide cap layer was added to the film stack. The results indicate that photolithography performance is not affected when the appropriate cap layer thickness is used. FIG. 27 also shows the reflectivity versus oxide cap thickness for the oxide/DARC/$WSi_x$ stack. The oxide thickness was varied from 50 Å to 1000 Å while holding the DARC thickness constant at 300 Å. It was apparent that there is a minimum reflectivity at an oxide thickness of 100 Å and at 900 Å. The reflectivity with no oxide, 100 Å, and 900 Å of oxide are indistinguishable for the suggested DARC thickness at 300 Å. The 100 Å cap can be effectively utilized as a capping layer to prevent the formation of "resist footing." The 900 Å cap layer serves a dual purpose: 1) ensure against "footing" and 2) use as a hard mask. Therefore, the DARC layer can be optimized for the respective substrates (i.e., poly, $WSi_x$, etc.) and the oxide layer can be deposited on top of the DARC as a hard mask. The integrated DARC and oxide stack effectively yields a 1200 Å hard mask layer without affecting the DARC photolithographic performance. This is clearly advantageous to optimizing a thick DARC film with different n- and k- values to be used as a mask. For either application of the capping layer, the oxide cap and DARC films can be deposited in situ in the Applied Materials PECVD Chamber.

Figure 28:
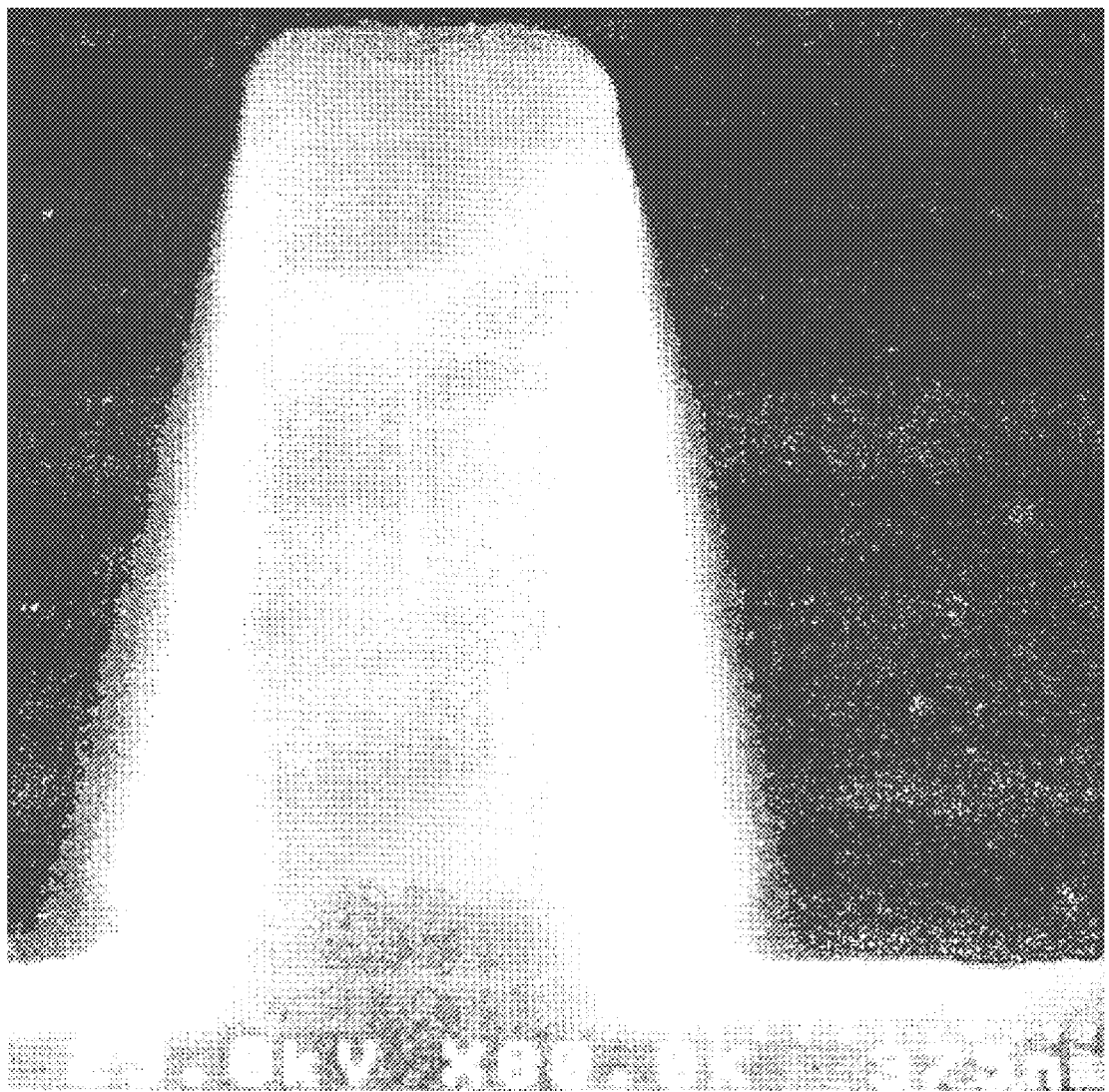
FIG. 28 is a SEM photograph of $0.35\mu$ resist line with oxide cap over DARC layer.

Experimental results of the 100 Å oxide cap layer revealed very little "resist footing" as shown in the SEM micrograph in FIG. 28. In comparison, the control wafers deposited without the oxide cap displayed large "footing." The oxide cap layer decreases the resist's sensitivity to the substrate surface and prevents footing. The critical dimension and linewidth control were identical for both cases.

Integrated Film Stack Etching

Figure 29:
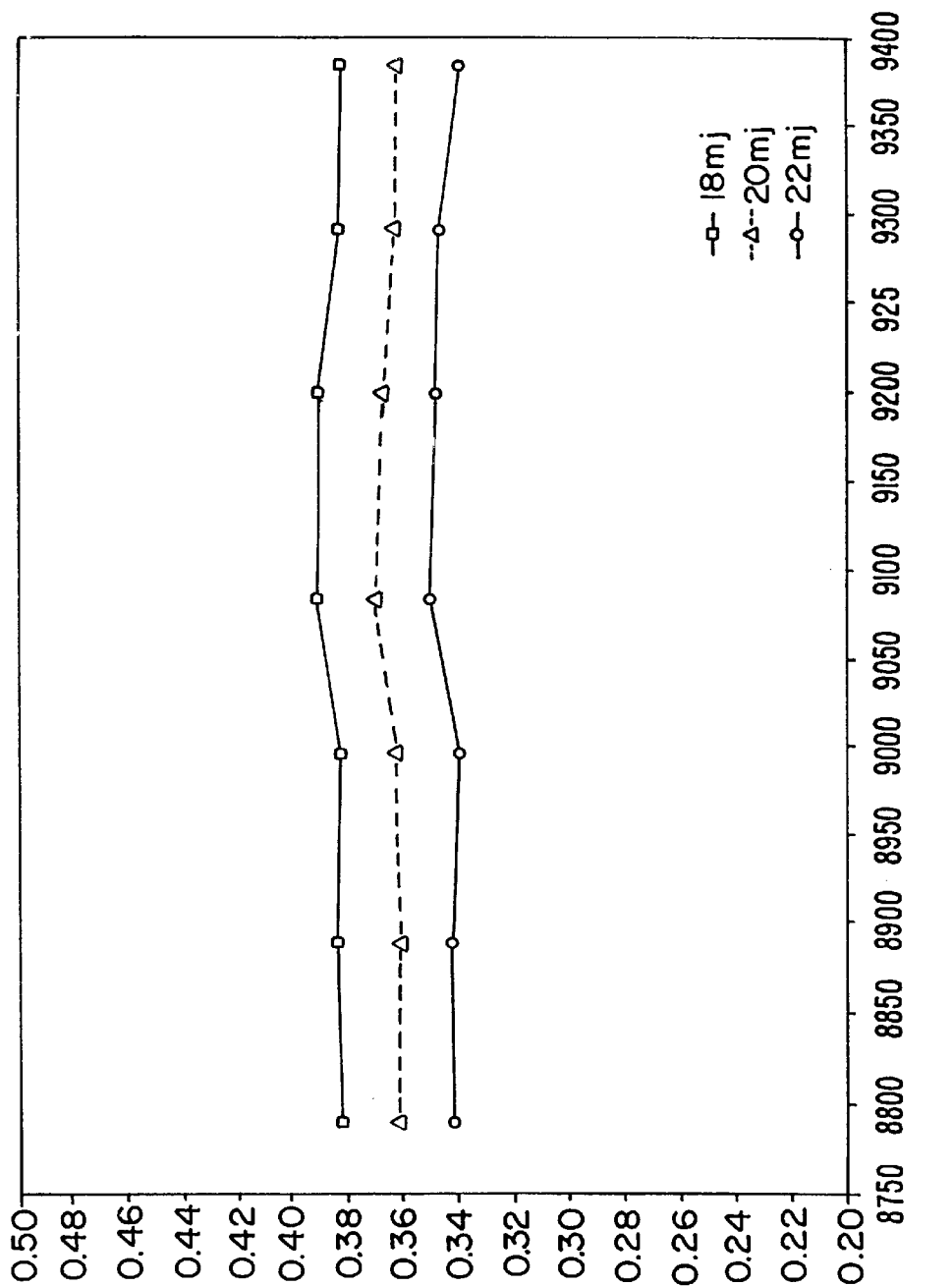
FIG. 29 is a graph illustrating the emission spectra for a $CF_4$ plasma used to determine end point.
Figure 30:
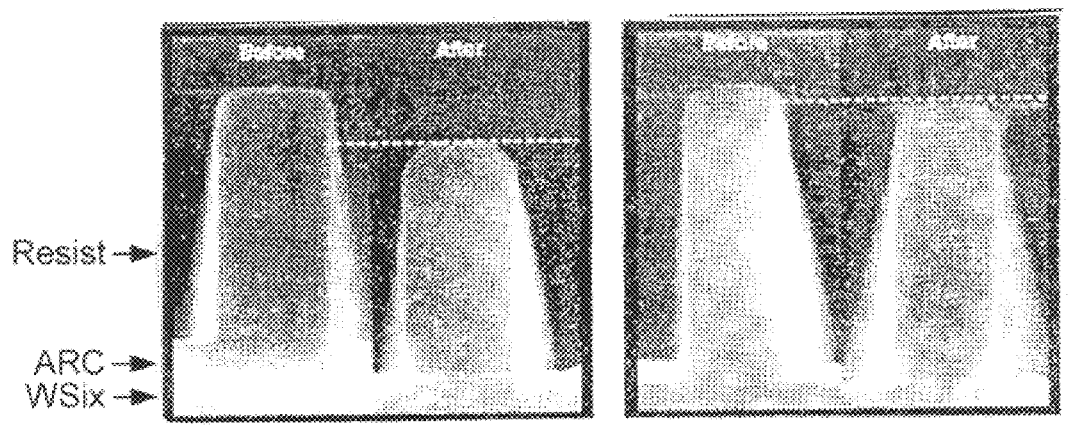
FIG. 30 is a schematic comparing the etch profiles and selectivity to the resist between conventional organic ARC and SiON film.

An in situ etch of the SiON DARC film is also an important part of an overall process integration sequence. In situ etch helps increase throughput and lower costs of ownership. As previously mentioned, these films were etched in situ using $CF_4$ based chemistry using Applied Materials' MxP chamber, which is commonly used to remove native oxide from Si. Since DARC films are very thin and the etch selectivity of $CF_4$ based chemistry to the layer underneath is not very high, it is very important to obtain a reliable endpoint. Etch uniformity must also be good to avoid microtrenching in the polysilicon or silicide layer. This, in turn, can transfer during the gate etch process and can pit or punch through thin (<100 Å) gate oxides. FIG. 29 shows the emission spectra from a $CF_4$ plasma used to determine endpoint. It is clear from the FIG. 29 that the C-N emission line (3865 Å) can also be readily used for the endpoint of other interfaces like DARC/silicide and DARC/oxide. FIG. 30 compares the etch profiles and selectivity to the resist between conventional organic ARC and SiON film. It can be clearly seen that SiON film can be etched almost vertically without any significant resist loss, while there is a significant amount of resist loss in the case of organic ARC. Minimizing resist loss is important for maintaining CD control. The process performed with the organic ARC embodiment had the following parameters or characteristics: $O_2$/HBr (etchant); 1.4:1 (selectively ARC:resist); 2,000 Å (typical thickness); and 1,400 Å (typical resist loss). The process performed with the DARC embodiment has the following parameters or characteristics: $CF_4$/He:$O_2$ (etchant); 1.4:1 (selectively DARC:resist); 2,000 Å (typical thickness); and 120 Å (typical resist loss).

Figure 31:
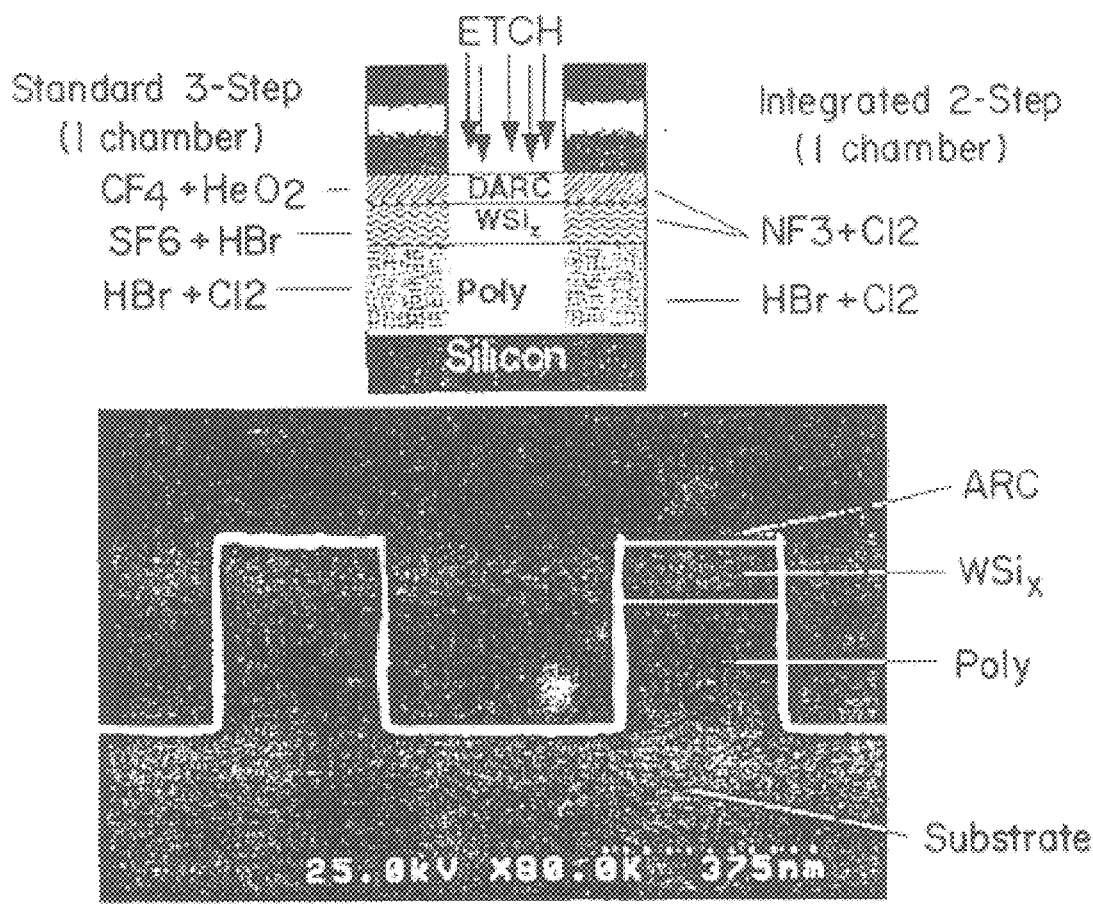
FIG. 31 is an etch profile on a test wafer having a film structure of 1.0 $\mu$m DUV resist/100 Å cap oxide/300 Å DARC/1000 Å $WSi_x$/1500 Å poly/90 Å gate oxide for two different etch chemistries.

For gate silicide applications, the etch profiles on a test wafer having a film structure (1.0 μm DUV resist/100 Å cap oxide/300 Å DARC/1000 Å WSi$_x$/1500 Å poly/90 Å gate oxide) are shown in FIG. 31 for the two different etch chemistries. By using the CF$_4$ etching chemistry, an endpoint was achieved after the DARC etch and subsequent etch steps were carried out as described earlier. This approach resulted in additional process time. A second approach was tried using NF$_3$ etching chemistry (also used for WSi$_x$ etching). In this way, DARC and WSi$_x$ were etched in a single step and the subsequent etch step for polysilicon was carried out. It is evident from FIG. 31 that comparable etch profiles can be obtained using either of the approaches. The gate oxide integrity in both the cases was found to be good. This indicates that by using either etching chemistry, DARC films can be etched with good uniformity and without microtrenching. A small profile microloading (1–2 degrees) was obtained with both CF$_4$ and NF$_3$ etching chemistries. With the NF$_3$ etching chemistry, nitrogen appears to passivate the sidewalls, leading to less microloading. Moreover, the etch rate is faster with NF$_3$/Cl$_2$ chemistry, resulting in higher throughput.

CONCLUSION

A high performance PECVD DARC film has been developed and characterized. The DARC layer can improve the resist linewidth control by reducing the photo swing ratio from 15% to less than 1.5%. Resist "footing" often formed in deep UV lithography can be eliminated with an in situ deposited 100 Å oxide capping layer. Additionally, a 900 Å oxide capping layer can be used as a hard mask and to eliminate "resist footing" without affecting photolithographic performance. The DARC film can be in situ etched using oxide etch CF$_4$ based chemistry. In comparison to organic ARC, better etch profiles and hence better CD control have been achieved with DARC film. For gate silicide applications, DARC film can also be etched together with silicide using an NF$_3$ based chemistry, resulting in higher throughput.

Thus, while the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular embodiment disclosed as the best mode contemplated for carrying out this invention, but that the invention will include all embodiments and equivalents falling within the scope of the appended claims.

What is claimed is:

1. A method for etching an anti-reflective on a substrate, the method comprising the steps of:
    (a) providing a substrate supporting an anti-reflective coating comprising SiO$_x$N$_y$:H$_z$, wherein x is from 1 to 2, y is from 0 to 1, and z is from 0 to 1, a patterned mask layer disposed on said anti-reflective coating, and a patterned resist layer on the patterned mask layer, wherein the patterned mask layer is between the patterned resist layer and the anti-reflective coating;
    (b) providing an etchant gas consisting essentially of NF$_3$ and Cl$_2$;
    (c) etching said anti-reflective coating of step (a) with said etchant gas of step (b);
    (d) removing the patterned resist layer from the substrate; and
    (e) removing the patterned mask layer from the substrate.

2. The method of claim 1 wherein said anti-reflective coating is SiONH.

3. The method of claim 1 wherein said etchant gas consists essentially of from about 20% by vol. to about 40% by vol. NF$_3$ and from about 60% by vol. to about 80% by vol. Cl$_2$.

4. The method of claim 3 wherein said anti-reflective coating is SiONH.

5. The method of claim 1 wherein said mask layer comprises tetraethylorthosilicate (TEOS).

6. The method of claim 1 additionally comprising etching, prior to said etching step (c), said mask layer.

7. The method of claim 1 additionally comprising disposing, prior to said etching step (c), said substrate of step (a) in a high density plasma chamber including a coil inductor and a wafer pedestal; and performing said etching step (c) in said high density plasma chamber under the following process conditions:

| Process | Parameters |
| --- | --- |
| Temperature (° C.) of Substrate | 20 to 100° C. |
| Anti-Reflective Coating Etch Rate (Å/min) | 200 to 2000 Å/min |

8. A method for etching a silicide layer supporting an anti-reflective coating comprising the steps of:
    a) providing a substrate supporting a silicide layer having an anti-reflective coating disposed thereon;
    b) providing an etchant gas comprising NF$_3$ and Cl$_2$;
    c) etching said anti-reflective coating of step (a) with said etchant gas of step (b) to remove at least a portion of said anti-reflective coating to expose at least part of said silicide layer; and
    d) etching through the entire thickness of the silicide layer with said etchant gas of step (b).

9. The method of claim 8 wherein said anti-reflective coating is SiONH.

10. The method of claim 8 wherein said etchant gas consists of NF$_3$ and Cl$_2$.

11. The method of claim 9 wherein said etchant gas consists essentially of NF$_3$ and Cl$_2$.

12. The method of claim 8 wherein said etchant gas consists essentially of NF$_3$ and Cl$_2$.

13. The method of claim 8 wherein said gas comprises from about 10% by vol. to about 50% by vol. NF$_3$, and from about 50% by vol. to about 90% by vol. Cl$_2$.

14. The method of claim 8 wherein said silicide comprises tungsten silicide.

15. The method of claim 8 wherein said gas comprises from about 20% by vol. to about 40% by vol. NF$_3$, and from about 60% by vol. to about 80% by vol. Cl$_2$.

16. The method of claim 10 wherein said etchant gas consists of from about 20% by vol. to about 40% by vol. NF$_3$ and from about 60% by vol. to about 80% by vol. Cl$_2$.

17. The method of claim 11 wherein said etchant gas consists essentially of from about 20% by vol. to about 40% by vol. NF$_3$, and from about 60% by vol. to about 80% by vol. Cl$_2$.

18. The method of claim 12 wherein said etchant gas consists essentially of from about 20% by vol. to about 40% by vol. $NF_3$, and from about 60% by vol. to about 80% by vol. $Cl_2$.

19. The method of claim 18 wherein said anti-reflective coating is SiONH.

20. The method of claim 8 wherein said providing step (a) additionally includes providing a mask layer disposed on said anti-reflective coating.

21. The method of claim 20 wherein said mask layer comprises tetraethylorthosilicate (TEOS).

22. The method of claim 21 additionally comprising etching, prior to said etching step (c), said mask layer.

23. The method of claim 8 additionally comprising disposing, prior to said etching step (c), said substrate of step (a) in a high density plasma chamber including a coil inductor and a wafer pedestal; and performing said etching step (c) and said etching step (d) in said high density plasma chamber under the following process conditions:

| Process | Parameters |
| --- | --- |
| Temperature (° C.) of Substrate | 20 to 100° C. |
| Anti-Reflective Coating Etch Rate (Å/min) | 200 to 2000 Å/min |
| Tungsten-Silicide Etch Rate (Å/min) | 2000 to 4000 (Å/min) |

24. A method for producing a dielectric anti-reflective coating gate structure comprising the steps of:
  a) forming a patterned resist layer, a mask layer, a dielectric anti-reflective coating, and at least one conductive layer on a substrate;
  b) etching a portion of said mask layer to remove said portion of said mask layer from said dielectric anti-reflective coating to produce said substrate supporting said patterned resist layer, a residual mask layer, said dielectric anti-reflective coating, and said at least one conductive layer;
  c) etching said dielectric anti-reflective coating of step (b) with an etchant gas comprising $NF_3$ and $Cl_2$ to produce said substrate supporting said patterned resist layer, said residual mask layer, a residual dielectric anti-reflective coating, and said at least one conductive layer;
  d) etching said at least one conductive layer with said etchant gas of step (c) to produce a dielectric anti-reflective coating gate structure; and
  e) removing the patterned resist layer and the residual mask layer.

25. The method of claim 24 wherein said etchant gas consists essentially of $NF_3$ and $Cl_2$.

26. The method of claim 24 additionally comprising disposing, prior to said etching step (c), said substrate of step (a) in a high density plasma chamber including a coil inductor and a wafer pedestal; and performing said etching step (c) and said etching step (d) in said high density plasma chamber under the following process conditions:

| Process | Parameters |
| --- | --- |
| Temperature (° C.) of Substrate | 20 to 100° C. |
| Anti-Reflective Coating Etch Rate (Å/min) | 200 to 2000 Å/min |
| Conductive Layer Etch Rate (Å/min) | 2000 to 4000 (Å/min) |

27. The method of claim 25 additionally comprising disposing, prior to said etching step (c), said substrate of step (a) in a high density plasma chamber including a coil inductor and a wafer pedestal; and performing said etching step (c) and said etching step (d) in said high density plasma chamber under the following process conditions:

| Process | Parameters |
| --- | --- |
| Temperature (° C.) of Substrate | 20 to 100° C. |
| Anti-Reflective Coating Etch Rate (Å/min) | 200 to 2000 Å/min |
| Conductive Layer Etch Rate (Å/min) | 2000 to 4000 (Å/min) |

28. The method of claim 24 wherein said dielectric anti-reflective coating includes the formula $SiO_xN_yH_z$, wherein x is from 1 to 2, y is from 0 to 1, and z is from 0 to 1.

29. The method of claim 24 wherein said mask layer has a thickness less than about 900 angstroms.

30. The method of claim 24 wherein said patterned resist layer is formed using a deep UV photoresist.

31. The method of claim 24 wherein said dielectric anti-reflective coating includes the formula $SiO_xN_yH_z$, wherein x is from 1 to 2, y is from 0 to 1, and z is from 0 to 1.

32. The method of claim 24 wherein said anti-reflective coating is SiONH.

33. The method of claim 25 wherein said anti-reflective coating is SiONH.

34. The method of claim 26 wherein said anti-reflective coating is SiONH.

35. The method of claim 27 wherein said anti-reflective coating is SiONH.

36. The method of claim 24 wherein said at least one conductive layer comprises tungsten silicide.

37. The method of claim 24 wherein said etchant gas comprises from about 50% by volume to about 90% by volume chlorine and from about 10% by volume to about 50% by volume $NF_3$.

38. The method of claim 24 wherein said etchant gas comprises from about 60% by volume to about 80% by volume chlorine and from about 20% by volume to about 40% by volume $NF_3$.

39. The method of claim 24 wherein said etchant gas comprises from about 65% by volume to about 75% by volume chlorine and from about 25% by volume to about 35% by volume $NF_3$.

40. The method of claim 24 wherein said etchant gas consists essentially of from about 50% by volume to about 90% by volume chlorine and from about 10% by volume to about 50% by volume $NF_3$.

41. The method of claim 24 wherein said etchant gas consists essentially of from about 60% by volume to about 80% by volume chlorine and from about 20% by volume to about 40% by volume $NF_3$.

42. The method of claim 24 wherein said etchant gas consists essentially of from about 65% by volume to about 75% by volume chlorine and from about 25% by volume to about 35% by volume $NF_3$.

43. The method of claim 24 wherein said etchant gas consists of from about 50% by volume to about 90% by volume chlorine and from about 10% by volume to about 50% by volume $NF_3$.

44. The method of claim 24 wherein said etchant gas consists of from about 60% by volume to about 80% by volume chlorine and from about 20% by volume to about 40% by volume $NF_3$.

45. The method of claim 24 wherein said etchant gas consists of from about 65% by volume to about 75% by volume chlorine and from about 25% by volume to about 35% by volume $NF_3$.

46. The method of claim 1 wherein said etchant gas consists essentially of from about 50% by volume to about 90% by volume chlorine and from about 10% by volume to about 50% by volume $NF_3$.

47. The method of claim 1 wherein said etchant gas consists essentially of from about 60% by volume to about 80% by volume chlorine and from about 20% by volume to about 40% by volume $NF_3$.

48. The method of claim 1 wherein said etchant gas consists essentially of from about 65% by volume to about 75% by volume chlorine and from about 25% by volume to about 35% by volume $NF_3$.

49. The method of claim 1 wherein said etchant gas consists of from about 50% by volume to about 90% by volume chlorine and from about 10% by volume to about 50% by volume $NF_3$.

50. The method of claim 1 wherein said etchant gas consists of from about 60% by volume to about 80% by volume chlorine and from about 20% by volume to about 40% by volume $NF_3$.

51. The method of claim 1 wherein said etchant gas consists of from about 65% by volume to about 75% by volume chlorine and from about 25% by volume to about 35% by volume $NF_3$.

52. A method comprising:
forming a patterned resist layer, a mask layer, a dielectric anti-reflective coating, and at least one conductive layer on a substrate, wherein the mask layer is between the patterned resist layer and the dielectric anti-reflective coating;
etching a portion of said mask layer to remove said portion of said mask layer from said dielectric anti-reflective coating to produce said substrate supporting said patterned resist layer, a residual mask layer, said dielectric anti-reflective coating, and said at least one conductive layer;
etching said dielectric anti-reflective coating with an etchant gas comprising $NF_3$ and $Cl_2$ to produce said substrate supporting said patterned resist layer, said residual mask layer, a residual dielectric anti-reflective coating, and said at least one conductive layer;
etching said at least one conductive layer with said etchant gas to produce a dielectric anti-reflective coating gate structure;
removing the patterned resist layer from the substrate; and
removing the residual mask layer from the substrate.

53. The method of claim 52 wherein said etchant gas comprises from about 50% by volume to about 90% by volume chlorine and from about 10% by volume to about 50% by volume $NF_3$.

54. The method of claim 52 wherein said patterned resist layer is formed from a deep UV photoresist.

55. The method of claim 52 wherein said etchant gas comprises from about 65% by volume to about 75% by volume chlorine and from about 25% by volume to about 35% by volume $NF_3$.

56. The method of claim 52 wherein said etchant gas consists essentially of from about 50% by volume to about 90% by volume chlorine and from about 10% by volume to about 50% by volume $NF_3$.

57. The method of claim 52 wherein said etchant gas consists essentially of from about 60% by volume to about 80% by volume chlorine and from about 20% by volume to about 40% by volume $NF_3$.

58. The method of claim 52 wherein said etchant gas consists essentially of from about 65% by volume to about 75% by volume chlorine and from about 25% by volume to about 35% by volume $NF_3$.

59. The method of claim 52 wherein said etchant gas consists of from about 50% by volume to about 90% by volume chlorine and from about 10% by volume to about 50% by volume $NF_3$.

60. The method of claim 52 wherein said etchant gas consists of from about 60% by volume to about 80% by volume chlorine and from about 20% by volume to about 40% by volume $NF_3$.

61. The method of claim 52 wherein said etchant gas consists of from about 65% by volume to about 75% by volume chlorine and from about 25% by volume to about 35% by volume $NF_3$.

62. A method for etching an anti-reflective coating on a substrate, the method comprising:
providing a substrate supporting an anti-reflective coating comprising $SiO_xN_y:H_z$, wherein x is from 1 to 2, y is from 0 to 1, and z is from 0 to 1, a patterned mask layer disposed on said anti-reflective coating, and a patterned resist layer on the patterned mask layer, wherein the patterned mask layer is between the patterned resist layer and the anti-reflective coating;
providing an etchant gas comprising $NF_3$ and $Cl_2$;
etching through said anti-reflective coating with said etchant gas;
removing the patterned resist layer from the substrate; and
removing the patterned mask layer from the substrate.

63. The method of claim 62 wherein said etchant gas consists essentially of from about 50% by volume to about 90% by volume chlorine and from about 10% by volume to about 50% by volume $NF_3$.

64. The method of claim 62 wherein said etchant gas consists essentially of from about 60% by volume to about 80% by volume chlorine and from about 20% by volume to about 40% by volume $NF_3$.

65. The method of claim 62 wherein said etchant gas consists essentially of from about 65% by volume to about 75% by volume chlorine and from about 25% by volume to about 35% by volume $NF_3$.

66. The method of claim 62 wherein said etchant gas consists of from about 50% by volume to about 90% by volume chlorine and from about 10% by volume to about 50% by volume $NF_3$.

67. The method of claim 62 wherein said etchant gas consists of from about 60% by volume to about 80% by volume chlorine and from about 20% by volume to about 40% by volume $NF_3$.

68. The method of claim 62 wherein said etchant gas consists of from about 65% by volume to about 75% by volume chlorine and from about 25% by volume to about 35% by volume $NF_3$.

69. A method for etching a silicide layer supporting an anti-reflective coating, the method comprising:

providing a substrate supporting a silicide layer having an anti-reflective coating disposed thereon and comprising $SiO_xN_y:H_z$, wherein x is from 1 to 2, y is from 0 to 1, and z is from 0 to 1;

providing an etchant gas consisting essentially of $NF_3$ and $Cl_2$;

etching said anti-reflective coating with said etchant gas consisting essentially of $NF_3$ and $Cl_2$ to remove at least a portion of said anti-reflective coating to expose at least part of said silicide layer; and etching through the entire thickness of the silicide layer with said etchant gas consisting essentially of $NF_3$ and $Cl_2$.

70. The method of claim 69 wherein said etchant gas comprises from about 60% by volume to about 80% by volume chlorine and from about 20% by volume to about 40% by volume $NF_3$.

71. The method of claim 69 wherein said etchant gas consists essentially of from about 60% by volume to about 80% by volume chlorine and from about 20% by volume to about 40% by volume $NF_3$.

72. The method of claim 69 wherein said etchant gas consists of from about 60% by volume to about 80% by volume chlorine and from about 20% by volume to about 40% by volume $NF_3$.

* * * * *